(12) United States Patent
Kondo et al.

(10) Patent No.: US 9,397,568 B2
(45) Date of Patent: Jul. 19, 2016

(54) SEMICONDUCTOR INTEGRATED CIRCUIT DEVICE AND POWER SUPPLY SYSTEM

(71) Applicant: Renesas Electronics Corporation, Kawasaki-shi, Kanagawa (JP)

(72) Inventors: Daisuke Kondo, Kanagawa (JP); Koji Tateno, Kanagawa (JP); Yumi Kishita, Kanagawa (JP); Tomoaki Uno, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/418,934

(22) PCT Filed: Jan. 31, 2014

(86) PCT No.: PCT/JP2014/052286
§ 371 (c)(1),
(2) Date: Jan. 31, 2015

(87) PCT Pub. No.: WO2015/114802
PCT Pub. Date: Aug. 6, 2015

(65) Prior Publication Data
US 2015/0256072 A1    Sep. 10, 2015

(51) Int. Cl.
*H02M 3/158* (2006.01)
*H03K 17/06* (2006.01)
*H02M 1/00* (2006.01)

(52) U.S. Cl.
CPC ............ *H02M 3/158* (2013.01); *H02M 3/1588* (2013.01); *H03K 17/063* (2013.01); *H02M 2001/0032* (2013.01);

(Continued)

(58) Field of Classification Search
CPC ....... H02M 1/08; H02M 1/088; H02M 1/096; H02M 1/38; H02M 2001/0032
See application file for complete search history.

(56) References Cited

U.S. PATENT DOCUMENTS

| 3,454,850 | A | * | 7/1969 | Miller | G05D 3/1409 318/681 |
| 4,472,821 | A | * | 9/1984 | Mazin | G11C 19/184 257/366 |
| 5,459,339 | A | * | 10/1995 | Sakurai | H01L 29/7395 257/133 |

(Continued)

FOREIGN PATENT DOCUMENTS

| JP | 63-296282 A | 12/1988 |
| JP | 02-155456 A | 6/1990 |

(Continued)

*Primary Examiner* — Timothy J Dole
*Assistant Examiner* — Yusef Ahmed
(74) *Attorney, Agent, or Firm* — Shapiro, Gabor and Rosenberger, PLLC

(57) ABSTRACT

A semiconductor integrated circuit device includes a first voltage terminal, a second voltage terminal, an output terminal, a high-side MOSFET connected between the first voltage terminal and the output terminal, a low-side MOSFET connected between the output terminal and the second voltage terminal and having first and second gate electrodes, a drive circuit that complementally switches on and off the high-side MOSFET and low-side MOSFET, and a second gate electrode control circuit that generates a second gate control signal supplied to the second gate electrode of the low-side MOSFET. The second gate electrode control circuit has a voltage generating circuit that supplies a negative voltage negative in polarity relative to a voltage at the source of the low-side MOSFET, to the second gate electrode of the low-side MOSFET.

20 Claims, 39 Drawing Sheets

(52) U.S. Cl.
CPC .... *H03K 2217/0036* (2013.01); *Y02B 70/1466* (2013.01); *Y02B 70/16* (2013.01)

(56) References Cited

U.S. PATENT DOCUMENTS

| | | | | |
|---|---|---|---|---|
| 5,561,393 | A * | 10/1996 | Sakurai | H01L 29/7395 257/167 |
| 2002/0105311 | A1* | 8/2002 | Rutter | H02M 1/08 323/283 |
| 2003/0202272 | A1* | 10/2003 | Makita | G11B 5/02 360/67 |
| 2007/0195563 | A1* | 8/2007 | Shiraishi | H01L 24/49 363/25 |
| 2009/0015224 | A1* | 1/2009 | Hirao | H02M 3/158 323/282 |
| 2010/0135053 | A1* | 6/2010 | Morimoto | H02M 7/219 363/127 |
| 2010/0232131 | A1* | 9/2010 | Qian | H01L 23/49524 361/813 |
| 2012/0001342 | A1* | 1/2012 | Sato | H01L 23/4952 257/773 |
| 2012/0306464 | A1* | 12/2012 | Hirler | H01L 27/088 323/282 |
| 2013/0049137 | A1* | 2/2013 | Uno | H01L 27/088 257/401 |
| 2014/0077778 | A1* | 3/2014 | Sato | H01L 29/407 323/282 |
| 2014/0266113 | A1* | 9/2014 | Zuniga | H02M 1/088 323/282 |
| 2015/0311779 | A1* | 10/2015 | Hayashiguchi | H02M 1/32 363/56.01 |
| 2016/0065203 | A1* | 3/2016 | Zojer | H02M 1/088 327/109 |

FOREIGN PATENT DOCUMENTS

| | | |
|---|---|---|
| JP | 06-125256 A | 5/1994 |
| JP | 08-316810 A | 11/1996 |
| JP | 2011-205112 A | 10/2011 |
| WO | WO 00/25365 A2 | 5/2000 |

* cited by examiner

FIG. 16
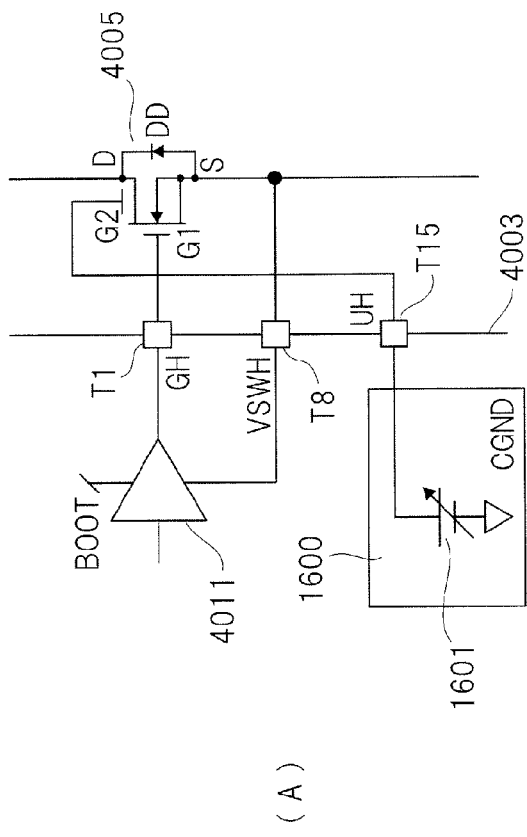
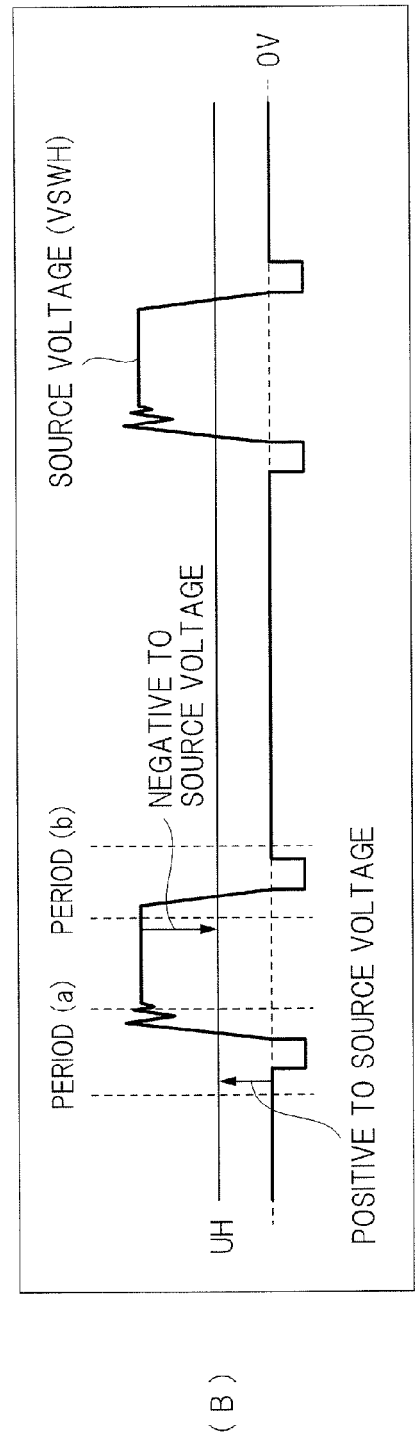
(A)
(B)

FIG. 19
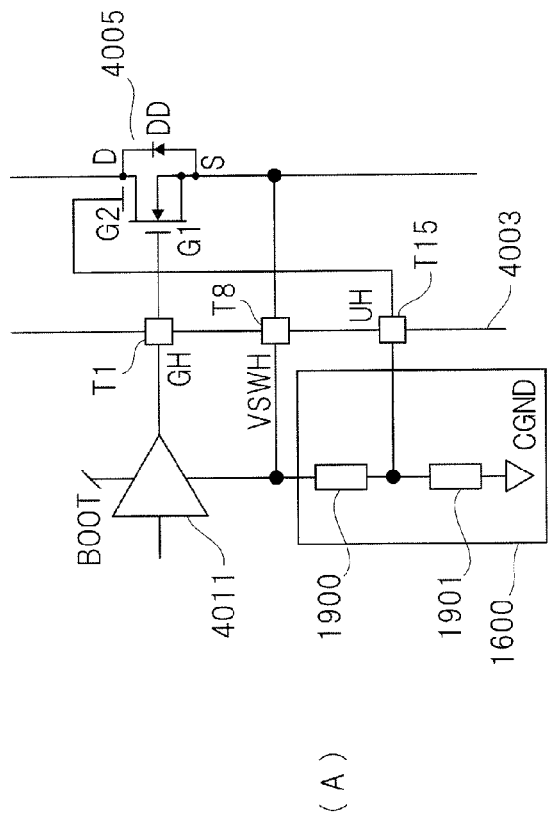
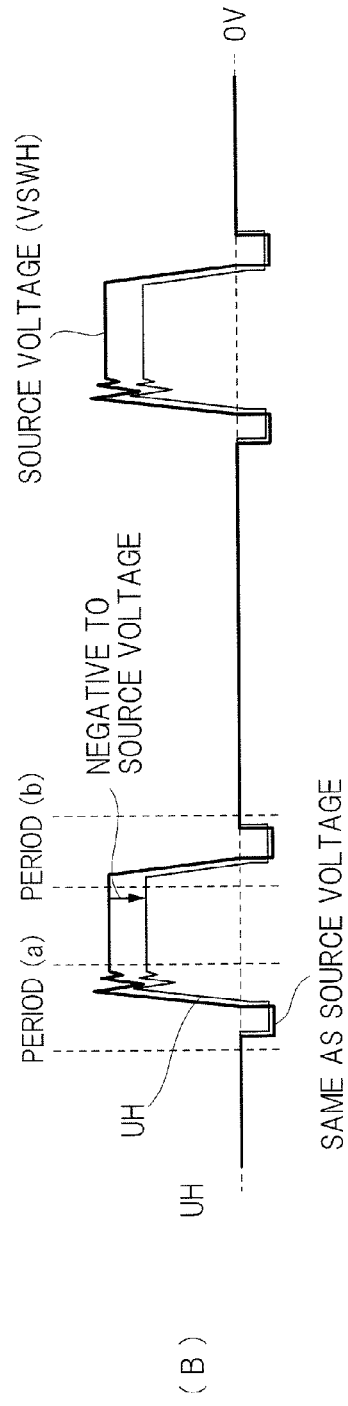

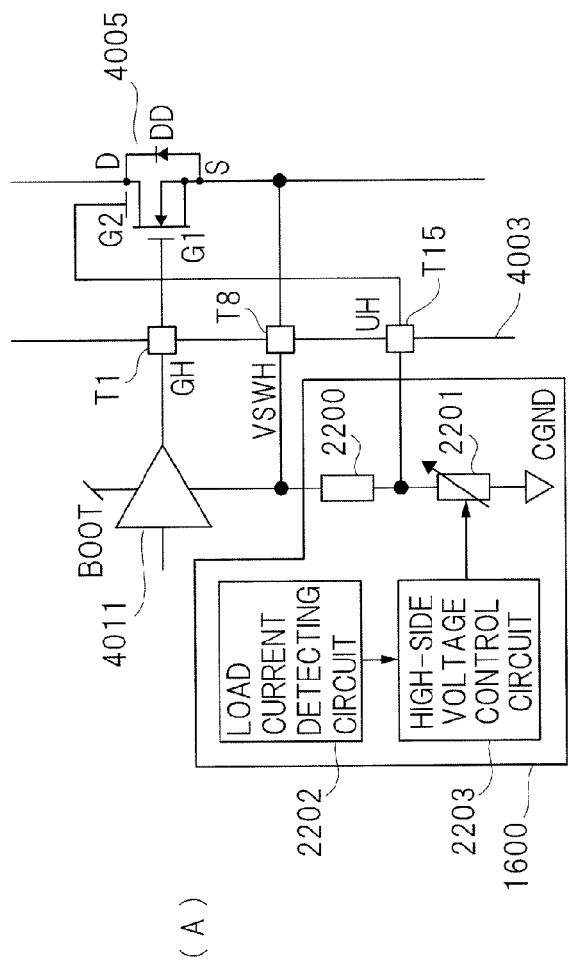
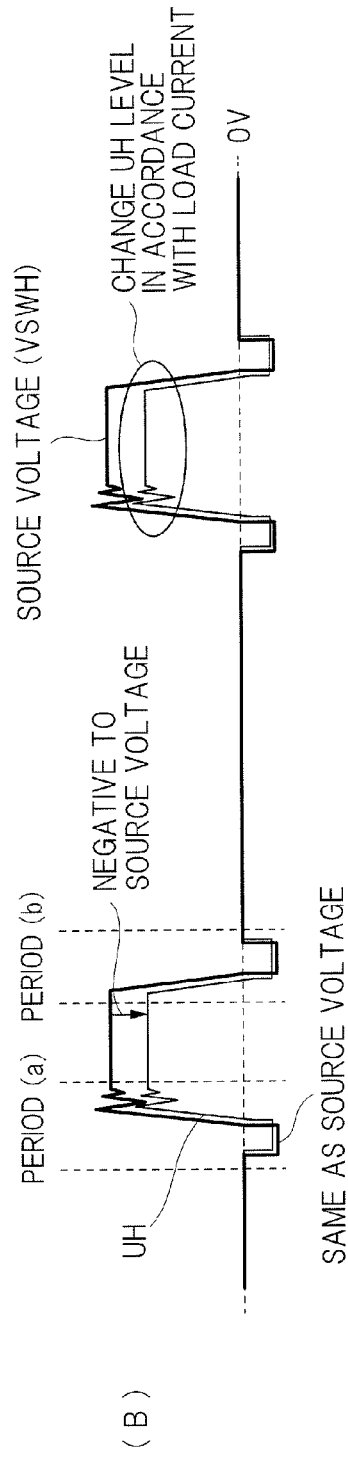
FIG. 22

FIG. 37
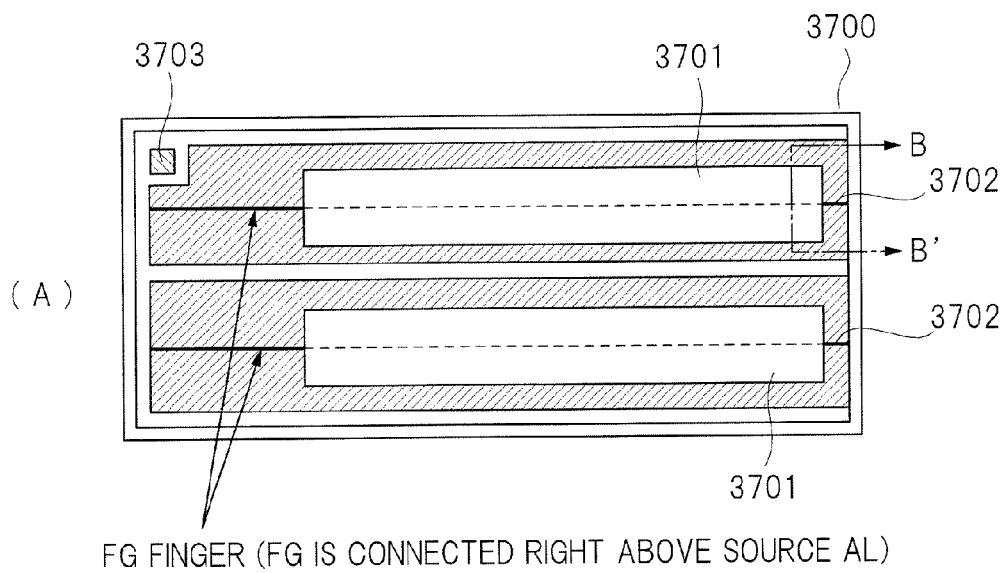
(A)
FG FINGER (FG IS CONNECTED RIGHT ABOVE SOURCE AL)
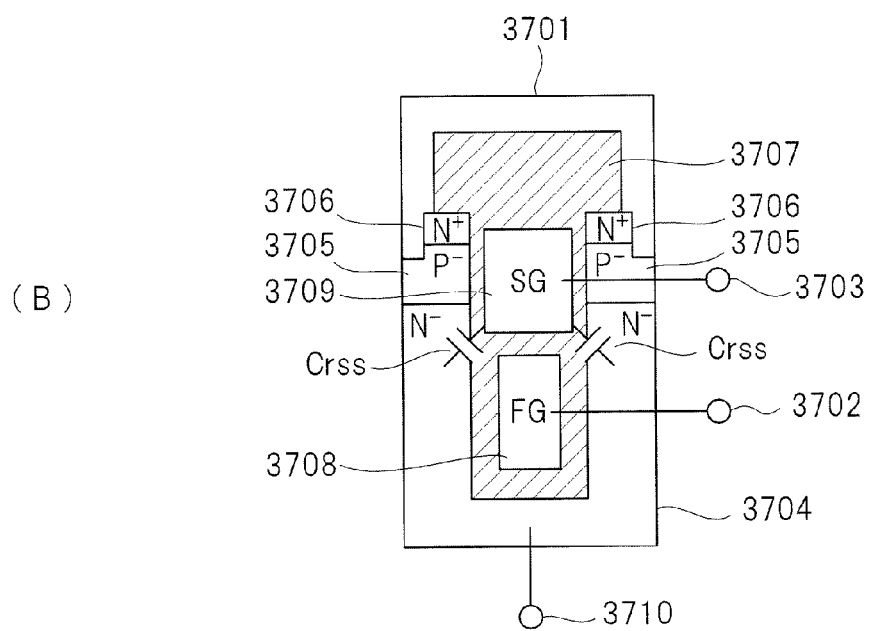
(B)

FIG. 39
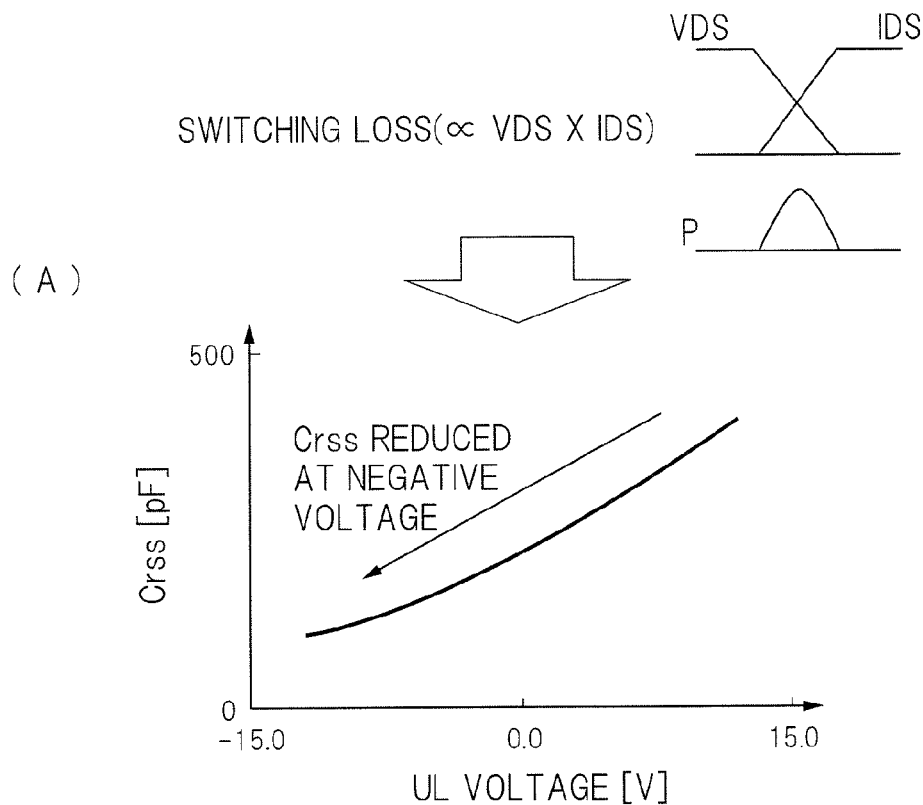
(A)
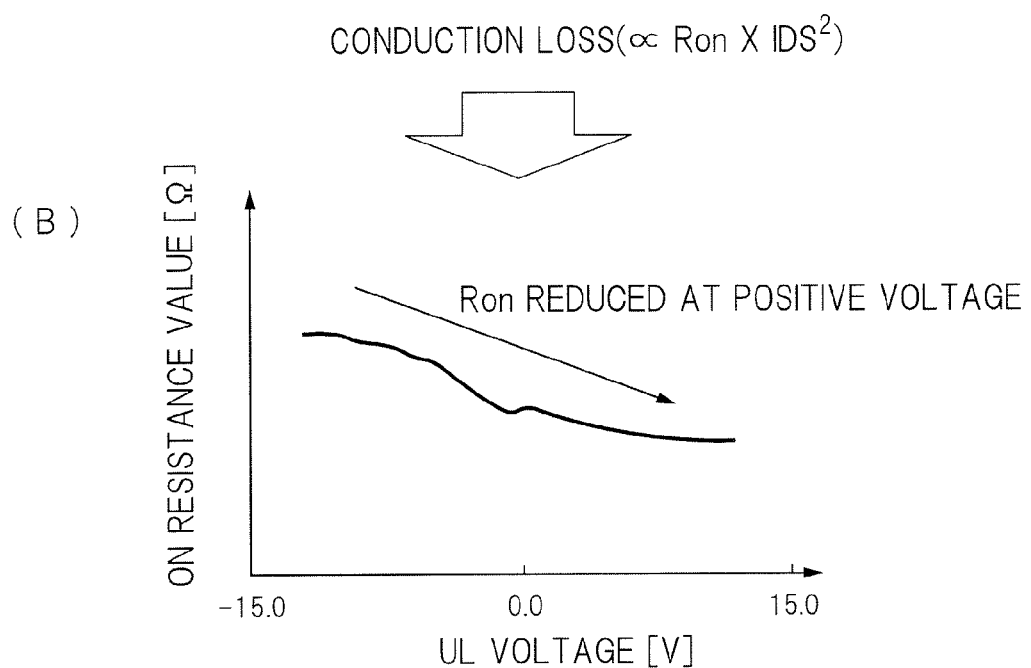
(B)

SEMICONDUCTOR INTEGRATED CIRCUIT DEVICE AND POWER SUPPLY SYSTEM

TECHNICAL FIELD

The present invention relates to a semiconductor integrated circuit device and a power supply system, and relates to, for example, a semiconductor integrated circuit device used for voltage conversion and a power supply system equipped with the semiconductor integrated circuit device.

BACKGROUND

A power supply system that coverts a DC voltage having a given voltage value into a DC voltage having a voltage value different from the given voltage value is known as so-called DC/DC converter. A DC/DC converter is used in various electronic devices, one example of which is a computer. In a computer, for example, a supply voltage supplied to a microprocessor (hereinafter "CPU") is generated by a DC/DC converter.

A power supply system like a DC/DC converter has multiple switch elements that cyclically change the direction of a current flowing from one coil to another coil. Each of the multiple switch elements is composed of a transistor, such as metal-oxide-semiconductor field effect transistor (hereinafter "MOSFET"). Various structures of the MOSFET used in the DC/DC converter have been proposed. Patent Documents 1 and 2 disclose various examples of MOSFET structures. In Patent Document 1, a MOSFET structure is shown in, for example, FIG. 1D in which a first gate electrode 10 and a second gate electrode 12 are stacked vertically. In Patent Document 2, another MOSFET structure is shown in, for example, FIG. 4K in which a gate electrode 26 (hereinafter "first gate electrode") and a gate electrode 30 (hereinafter "second gate electrode") are stacked vertically.

PRIOR ART DOCUMENTS

Patent Documents

Patent Document 1: Japanese Patent Application Laid-Open Publication No. 63-296282
Patent Document 2: International Publication No. WO00/25365

SUMMARY

As shown in Patent Documents 1 and 2, the first gate electrode and the second gate electrode are stacked vertically. This structure for example, as stated in Patent Document 1, allows reducing a capacitance between the second gate electrode and the drain region of the MOSFET while maintaining the highly integrated configuration, thereby improving the high-frequency characteristics of the MOSFET. Improving the high-frequency characteristics reduces the loss of the DC/DC converter, thus improving its efficiency. Improving the efficiency of the DC/DC converter leads to a reduction in power consumption by an electronic device using the DC/DC converter, and is therefore important matter to achieve.

Before application of the invention, the inventor studied about such a DC/DC converter using the MOSFET having the first and second gate electrodes. During the course of study, the inventor examined Patent Documents 1 and 2.

According to Patent Document 1, the first gate electrode of the MOSFET is set to a given positive voltage and an input signal is supplied to the second gate electrode of the same. According to Patent Document 2, the first gate electrode is connected to the source of the MOSFET. After a series of examinations, the inventor found that changing a voltage supplied to the first gate electrode to a positive voltage or negative voltage relative to a voltage supplied to the source of the MOSFET results in a change in the characteristics (on-resistance value, capacitance value) of the MOSFET. The present invention has been made based on this discovered knowledge.

The object of the present invention is to provide a power supply system that allows an improvement in overall efficiency and a semiconductor integrated circuit device used in the power supply system.

The above and other preferred aims and novel characteristics of the present invention will be apparent from the description of the present specification and the accompanying drawings.

This specification of the present application discloses multiple means for solving problems. A typical means for solving problems will be described from the viewpoint of a semiconductor integrated circuit device used in a power supply system and of a typical power supply system. In the following description, cases of using an n-channel type MOSFET as a MOSFET will be explained. Obviously, a p-channel type MOSFET may also be used as a MOSFET, in which case a potential relation of the voltage is modified.

<Viewpoint of Semiconductor Integrated Circuit Device>

(1) A semiconductor integrated circuit device includes a first voltage terminal, a second voltage terminal, an output terminal, a first MOSFET connected between the first voltage terminal and the output terminal, and a second MOSFET connected between the second voltage terminal and the output terminal. The first MOSFET has a first input electrode, a drain, and a source, while the second MOSFET has a first input electrode, a drain, a source, and a second input electrode disposed closer to the drain than the first input electrode.

An input signal that complementally switches on and off the first MOSFET and the second MOSFET is supplied to respective first input electrodes of the first MOSFET and second MOSFET. As a result, a current is supplied from the first voltage terminal and from the second voltage terminal alternately to the output terminal.

Meanwhile, a negative voltage negative in polarity relative to a voltage at the source of the second MOSFET is supplied to the second input electrode disposed closer to the drain than the first input electrode in the second MOSFET. This further reduces a parasitic capacitance created between the first input electrode and the drain. A reduction in the parasitic capacitance shortens an on-off shift time that the second MOSFET takes when shifting from its off-state to on-state or vice versa. The first MOSFET and second MOSFET are switched on and off complementary, and during an on-off shift time required for the MOSFETs to shift from its off-state to on-state or vice versa, a current flows through a path between the first voltage terminal and the second voltage terminal or between the first voltage terminal and the output terminal or between the second voltage terminal and the output terminal. By reducing this on-off shift time, the loss (power consumption) of the semiconductor integrated circuit device is reduced.

(2) According to one embodiment, the second input electrode and the first input electrode of the second MOSFET are formed of a second metal layer and a first metal layer embedded in a first semiconductor region and a third semiconductor region stacked together, respectively. The first semiconductor region makes up the drain of the second MOSFET, while the third semiconductor region makes up the source of the second MOSFET. Hence, the second input electrode is disposed closer to the drain of the second MOSFET than the first input electrode. Being stacked together, the electrodes are packaged into a highly integrated structure. In this case, the channel of the second MOSFET is created in a second semiconductor region interposed between the first semiconductor region and the third semiconductor region.

(3) According to one embodiment, the semiconductor integrated circuit device has a selecting circuit that selects a positive voltage or negative voltage positive or negative in polarity relative to a voltage at the source of the second MOSFET. By supplying a positive voltage positive in polarity relative to a voltage at the source to the second input electrode of the second MOSFET, the on-resistance of the second MOSFET is reduced when the MOSFET is switched on. Reducing the on-resistance of the second MOSFET enables a reduction in the loss of the second MOSFET.

Selecting the polarity of a voltage supplied to the second input electrode by the selecting circuit (with respect to a voltage at the source as a reference voltage) allows selection between loss reduction by shortening the on-off shift time and loss reduction by reducing the on-resistance.

(4) According to one embodiment, the selecting circuit selects the polarity of a voltage supplied to the second input electrode, in synchronization with switching on and off of the second MOSFET by an input signal supplied to the first input electrode of the second MOSFET. As a result, loss reduction by shortening the on-off shift time and loss reduction by reducing the on-resistance can be performed in synchronization with switching on and off of the second MOSFET.

(5) According to one embodiment, the semiconductor integrated circuit device has a detecting circuit that detects a current flowing through the output terminal to determine whether the value of the current exceeds a given current value. In response to a detection signal from the detecting circuit, the selecting circuit changes the polarity of a voltage supplied to the second input electrode. Hence, either loss reduction by shortening the on-off shift time or loss reduction by reducing the on-resistance can be selected according to the value of a load current required by a load connected to the output terminal. In other words, a voltage polarity for proper loss reduction is selected according to the size of the load current. This allows loss reduction according to the size of the load current.

The load current varies depending on the condition of the load. Through the above configuration, therefore, a proper loss reduction means (shortening the on-off shift time or reducing the on-resistance) can be selected according to the load condition.

(6) According to one embodiment, a semiconductor integrated circuit device includes a first voltage terminal, a second voltage terminal, an output terminal, a first MOSFET connected between the first voltage terminal and the output terminal, and a second MOSFET connected between the second voltage terminal and the output terminal. Each of the first MOSFET and second MOSFET has a first input electrode, a drain, a source, and a second input electrode disposed closer to the drain than the first input electrode.

The first MOSFET and the second MOSFET are complementally switched on and off by an input signal. As a result of complemental switching on and off of the MOSFETs, a current is supplied from the first voltage terminal and from the second voltage terminal alternately to the output terminal. The value of a current flowing through the output terminal changes depending on a load current required by a load connected to the output terminal.

The semiconductor integrated circuit device further includes a detecting circuit that detects the value of a current flowing through the output terminal and a control circuit that in response to a detection signal from the detecting circuit, supplies different voltages to respective second input electrodes of the first MOSFET and the second MOSFET.

As a result, according to the value of the load current, loss reduction by shortening an on-off time and loss reduction or loss increase suppression by reducing on-resistance or suppressing an on-resistance increase are carried out at the first MOSFET and the second MOSFET. This allows a reduction in the loss of the semiconductor integrated circuit device according to the load condition, thereby allowing an improvement in efficiency.

According to one embodiment, when the value of a current flowing through the output terminal exceeds a given current value, the control circuit supplies a positive voltage positive in polarity relative to a voltage at respective sources of the first MOSFET and the second MOSFET, to respective second gate electrode of the first MOSFET and the second MOSFET. When the value of the current flowing through the output terminal does not exceed the given current value, the control circuit supplies a negative voltage negative in polarity relative to a voltage at respective sources of the first MOSFET and the second MOSFET, to respective second gate electrode of the first MOSFET and the second MOSFET. Hence, loss reduction by shortening the on-off shift time and loss reduction by reducing the on-resistance are carried out according to the value of the output current (load current) flowing through the output terminal.

<Viewpoint of Typical Power System>

In multiple embodiments of the power supply system, the power supply system includes the semiconductor integrated circuit device and a coil element. One end of the coil element is connected to the output terminal of the semiconductor integrated circuit device, and a current supplied from the output terminal to the coil element changes in direction cyclically.

In each of the embodiments of the power supply system, the semiconductor integrated circuit device has any one of the means for solving the problems (1) to (6) described in <Viewpoint of Semiconductor Integrated Circuit Device>. Each of the means for solving the problems (1) to (6) allows the semiconductor integrated circuit device to reduce its loss, thus allowing the power supply system to reduce its loss, thereby improving overall efficiency.

In the power supply system equipped with the semiconductor integrated circuit device having the means for solving the problems (5) or (6), a device (e.g., CPU) supplied with power from the power supply system is regarded as a load. A current required by the load (load current) changes depending on the operation status of the device regarded as the load.

Examinations conducted by the inventor of the present application has revealed that with regard to the total loss of the semiconductor integrated circuit device, the ratio between a loss caused by the on-off shift time and a loss caused by the on-resistance in a case where the load is heavy (heavy load) and the load current is high is different from the ratio between the same in a case where the load is light (light load) and the load current is relatively low. The inventor's examination has lead to a conclusion that the ratio of the loss caused by the on-resistance becomes higher as the load current becomes higher.

According to the means for solving the problems (5) or (6), the load current is detected by the detecting circuit, and in response to a detection signal, the selecting circuit (means (5)) or the control circuit (means (6)) (the second MOSFET according to the means (5) and the first and second MOSFETs according to the means (6)) selects a voltage supplied to the second input electrode of the MOSFET. When the value of the load current exceeds the given current value, the selecting circuit or control circuit selects a positive voltage positive in polarity relative to a voltage at the source of the MOSFET, as the voltage is supplied to the second input electrode of the MOSFET. This reduces loss that arises when the load is heavy. When the load is light, in contrast, the selecting circuit or control circuit selects a negative voltage negative in polarity relative to a voltage at the source of the MOSFET, and supplies the selected voltage to the second input electrode of the MOSFET. This reduces loss that arises when the load is light.

In this manner, according to the condition of a device serving as the load, loss is reduced by a selected method effective for loss reduction (loss reduction by shortening the on-off shift time or loss reduction by reducing the on-resistance). As a result, the loss of the power supply system can be reduced according to the load condition.

It is understood from the above description that the first input electrode corresponds to, for example, the second gate electrode of Patent Document 1 and the second input electrode corresponds to the first gate electrode of the same. In the following description, loss caused during the on-off shift time is also referred to as switching loss and loss caused by the on-resistance is also referred to as conduction loss.

According to one embodiment, a power supply system that can improve overall efficiency and a semiconductor integrated circuit device used in the power supply system are provided.

BRIEF DESCRIPTIONS OF THE DRAWINGS

FIGS. 1(A) to 1(D) are circuit diagrams and voltage waveform charts showing principle circuits of a semiconductor integrated circuit device according to a first embodiment;

FIGS. 2(A) and 2(B) are block diagrams and circuit diagrams showing configurations of principle parts of a semiconductor integrated circuit device according to a second embodiment;

FIGS. 3(A) to 3(D) are waveform charts showing an operation of the semiconductor integrated circuit device according to the second embodiment;

FIGS. 4(A) to 4(D) are explanatory diagrams of an operation of the semiconductor integrated circuit device according to the second embodiment;

FIG. 5 is a block diagram showing a configuration of a principle part of a semiconductor integrated circuit device according to a third embodiment;

FIGS. 6(A) and 6(B) are waveform charts showing an operation of the semiconductor integrated circuit device according to the third embodiment;

FIG. 7 is a block diagram showing a configuration of a principle part of a semiconductor integrated circuit device according to a fourth embodiment;

FIGS. 8(A) to 8(D) are waveform charts showing an operation of the semiconductor integrated circuit device according to the fourth embodiment;

FIGS. 9(A) to 9(F) are explanatory diagrams of an operation of the semiconductor integrated circuit device according to the fourth embodiment;

FIG. 10 is a characteristic diagram showing the characteristics of the semiconductor integrated circuit device according to the fourth embodiment;

FIGS. 11(A) to 11(F) are explanatory diagrams of an operation of the semiconductor integrated circuit device according to the first embodiment;

FIGS. 12(A) to 12(F) are explanatory diagrams of an operation of the semiconductor integrated circuit device according to the first embodiment;

FIG. 13 is a characteristic diagram showing the characteristics of the semiconductor integrated circuit device according to the first embodiment;

FIGS. 14(A) to 14(F) are explanatory diagrams of an operation of the semiconductor integrated circuit device according to the second embodiment;

FIG. 15 is a characteristic diagram showing the characteristics of the semiconductor integrated circuit device according to the second embodiment;

FIGS. 16(A) and 16(B) are block diagrams and waveform charts showing configurations of principle parts of a semiconductor integrated circuit device according to a fifth embodiment;

FIGS. 17(A) to 17(E) are explanatory diagrams of an operation of the semiconductor integrated circuit device according to the fifth embodiment;

FIG. 18 is a characteristic diagram showing the characteristics of the semiconductor integrated circuit device according to the fifth embodiment;

FIGS. 19(A) and 19(B) are diagrams and waveform charts showing configurations of principle parts of a semiconductor integrated circuit device according to a sixth embodiment;

FIGS. 20(A) to 20(E) are explanatory diagrams of an operation of the semiconductor integrated circuit device according to the sixth embodiment;

FIG. 21 is a characteristic diagram showing the characteristics of the semiconductor integrated circuit device according to the sixth embodiment;

FIGS. 22(A) and 22(B) are block diagrams and waveform charts showing configurations of principle parts of a semiconductor integrated circuit device according to a seventh embodiment;

FIGS. 23(A) to 23(E) are explanatory diagrams of an operation of the semiconductor integrated circuit device according to the seventh embodiment;

Figure 33:
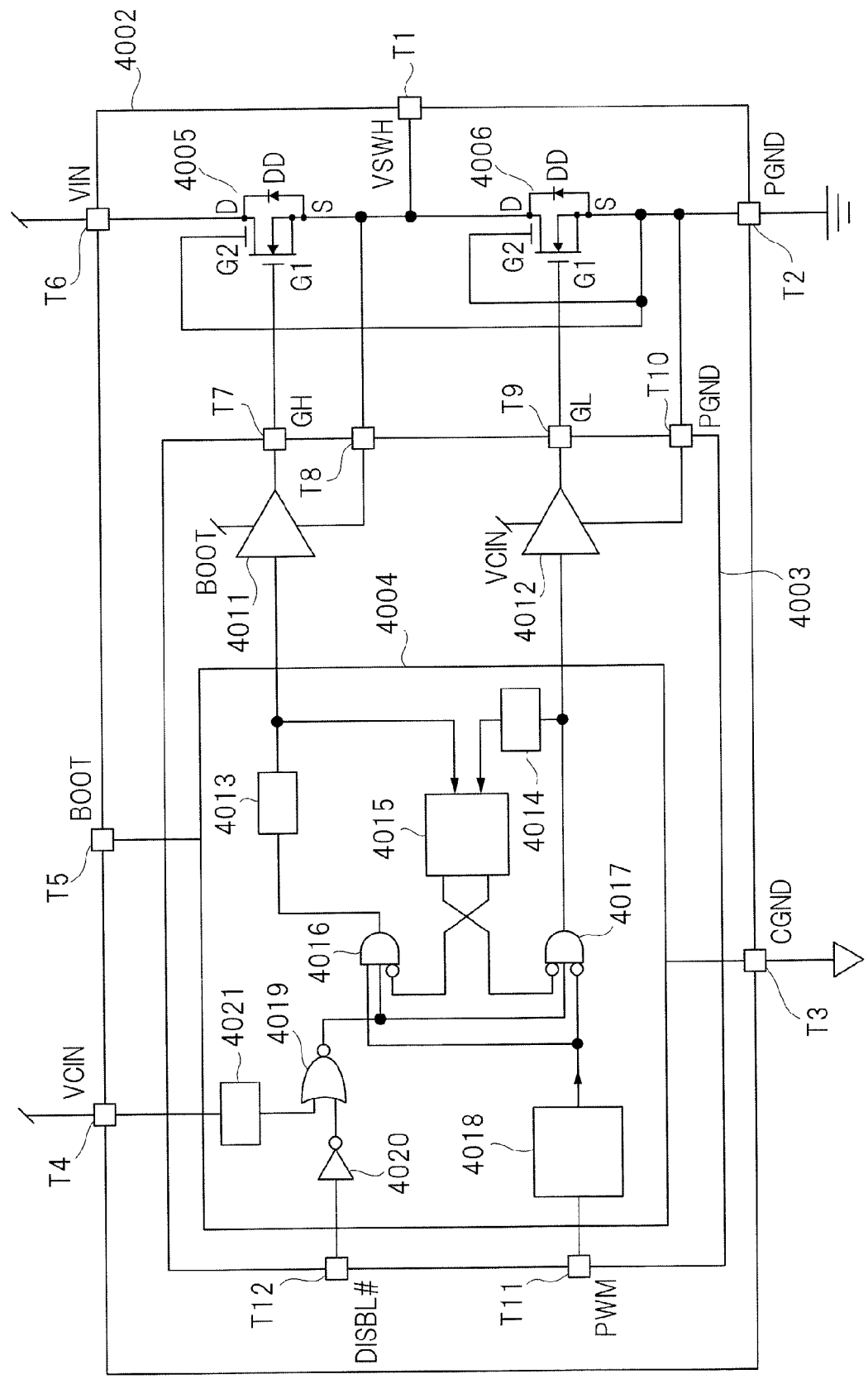
Figure 34:
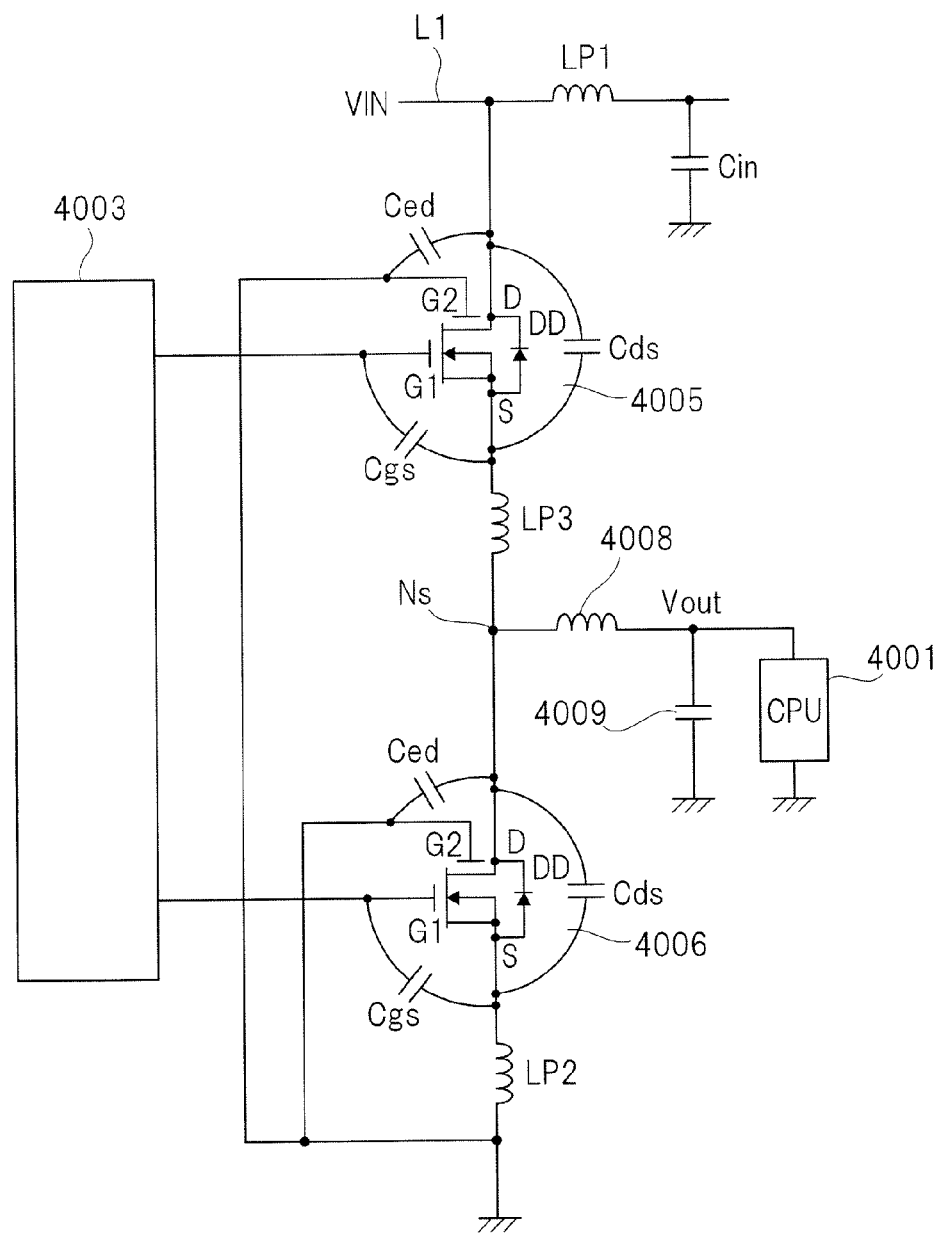
Figure 36:
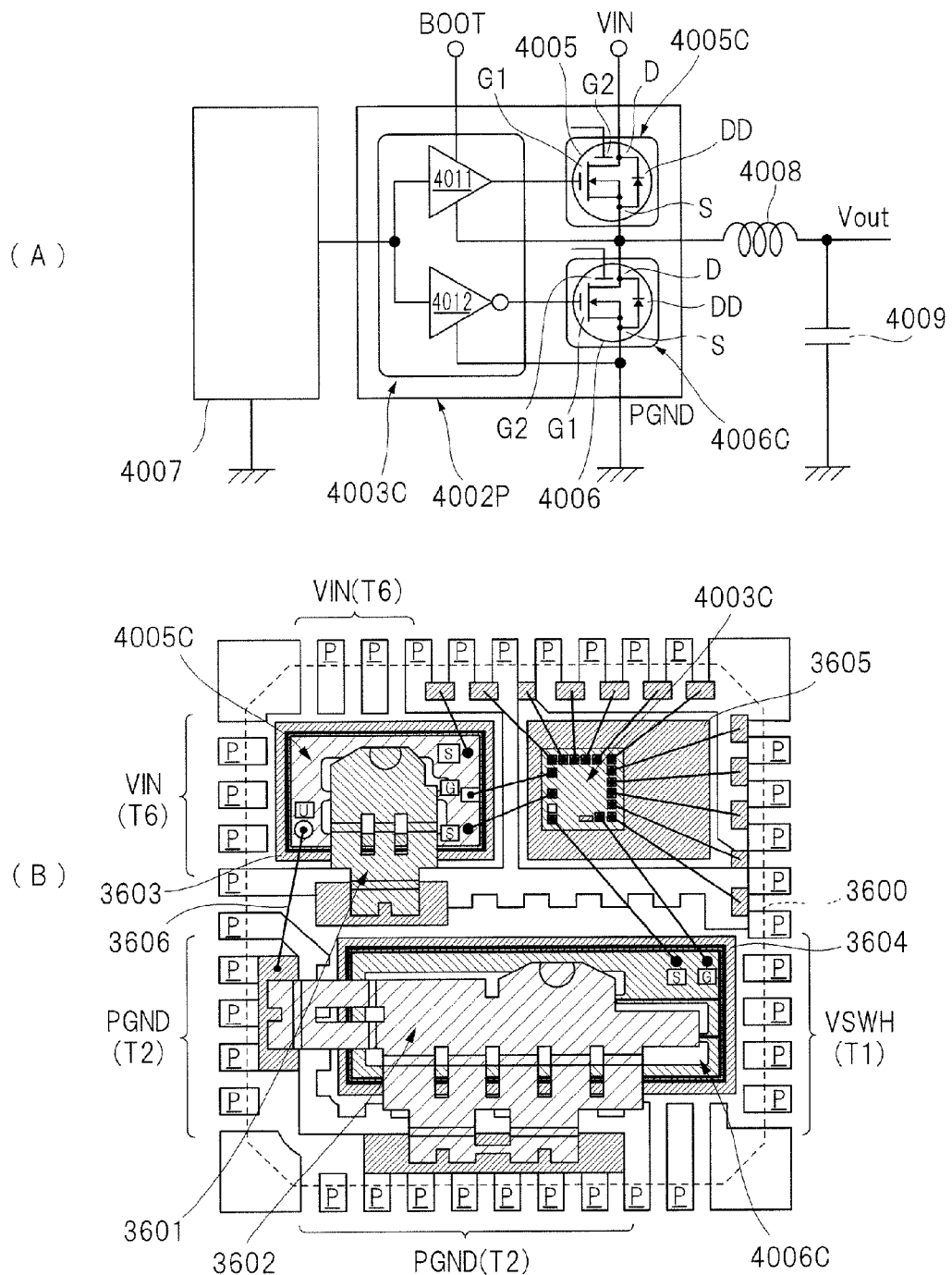
Figure 38:
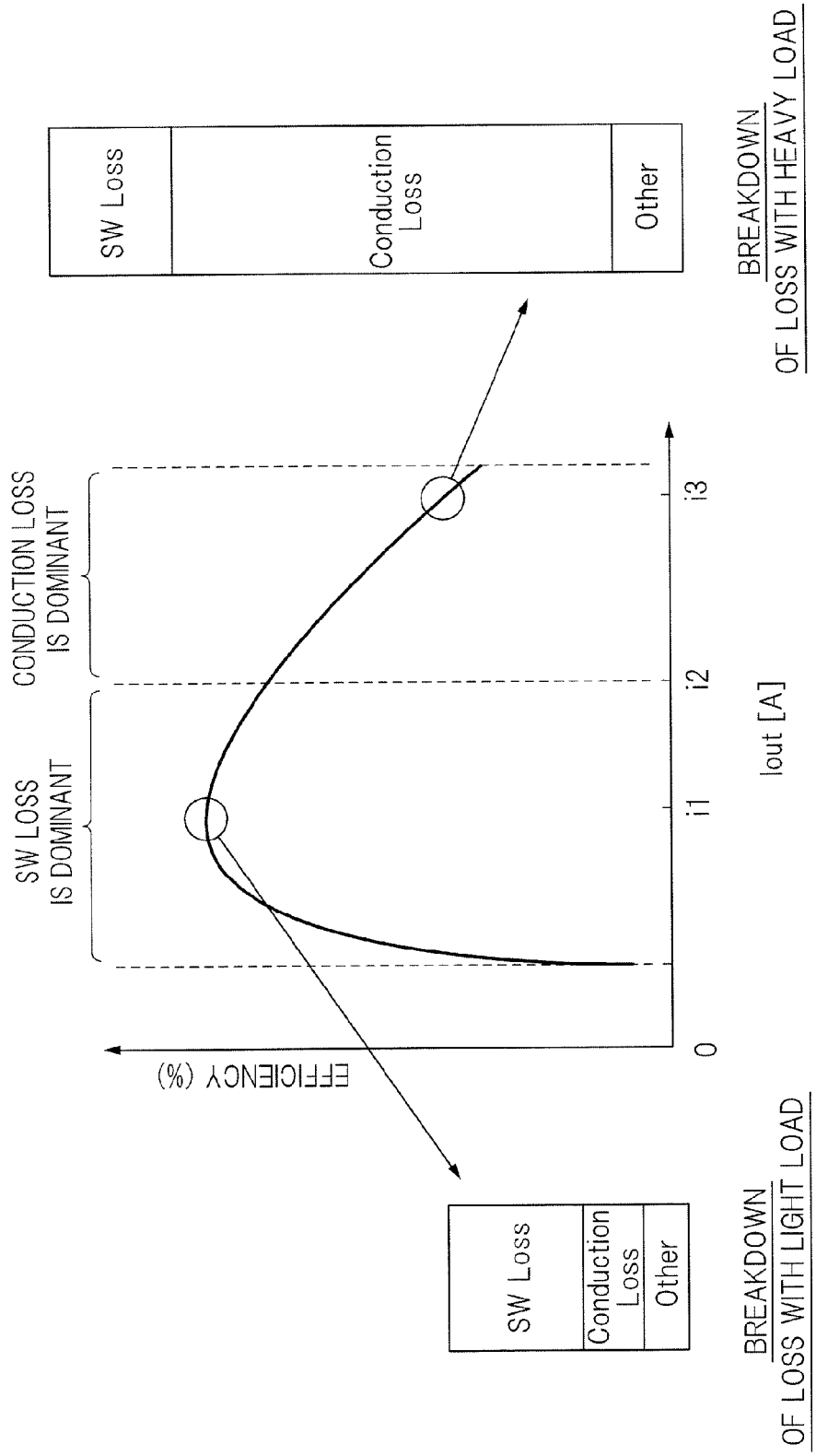
Figure 40:
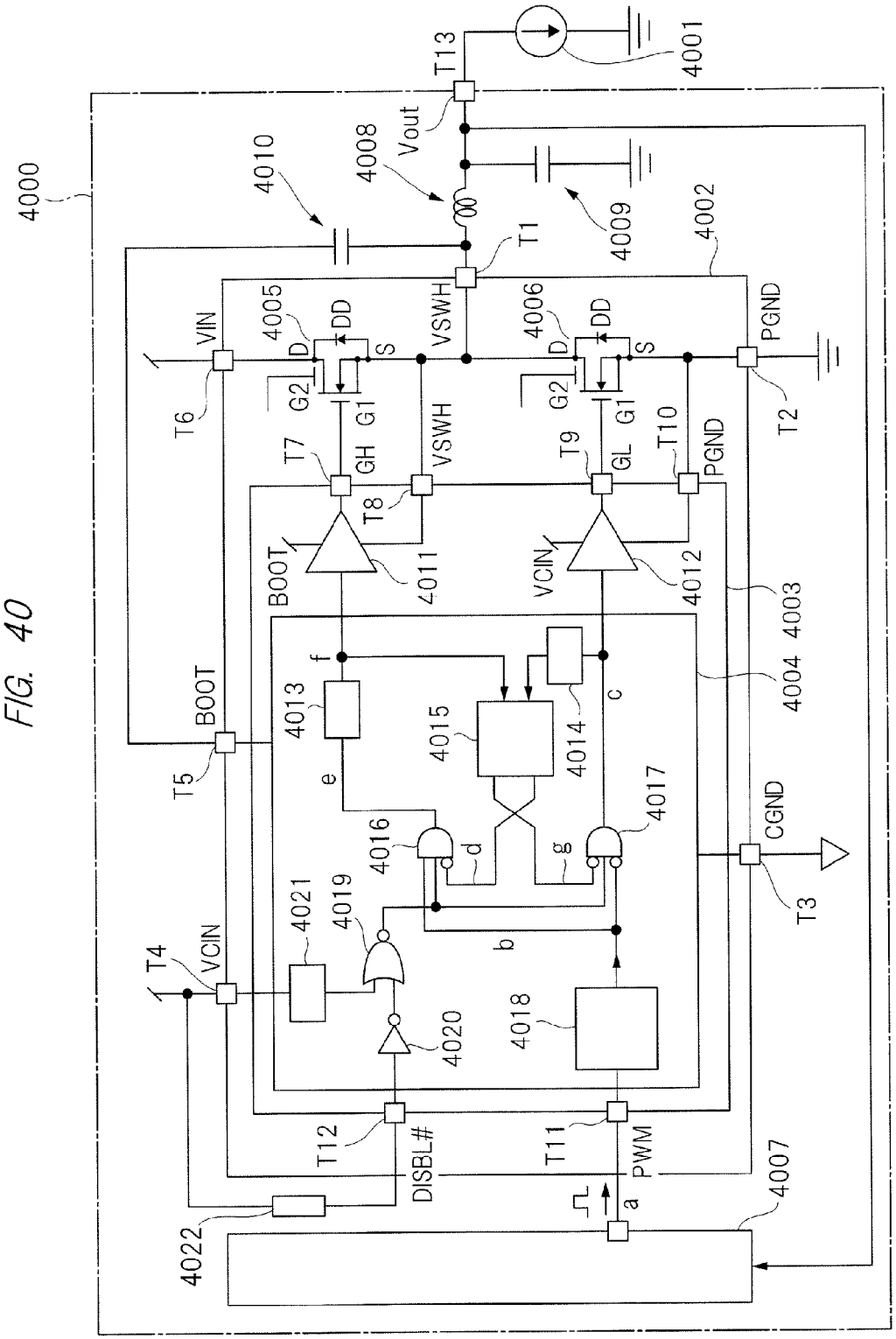
Figure 41:
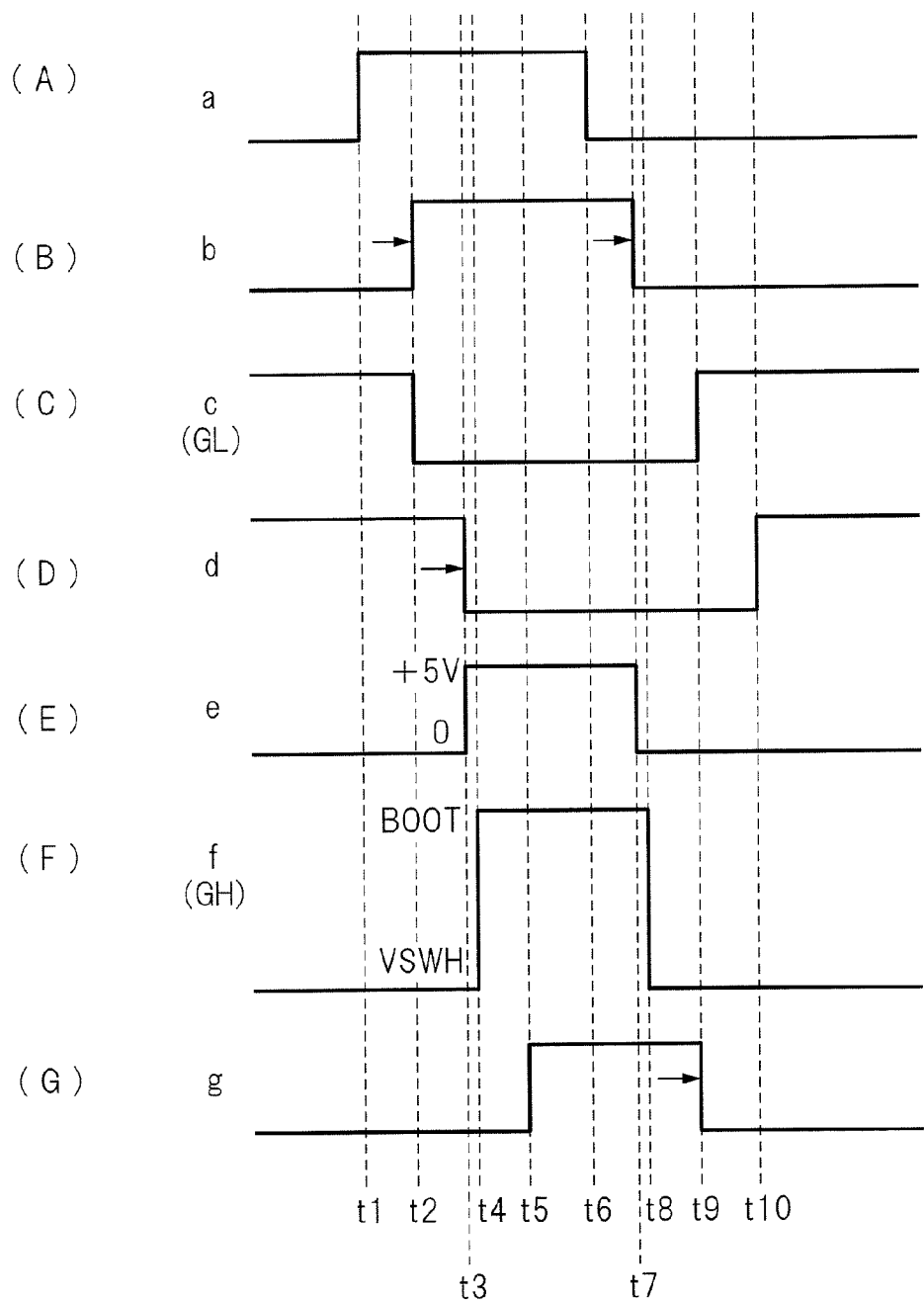

FIGS. 32(A) to 32(E) are waveform charts showing an operation of the semiconductor integrated circuit device according to the tenth embodiment;

FIG. 33 is a block diagram showing a configuration of a semiconductor integrated circuit device according to an eleventh embodiment;

FIG. 34 is a circuit diagram showing a configuration of a principle part of the semiconductor integrated circuit device according to the eleventh embodiment;

FIGS. 35(A) to 35(E) are waveform charts showing an operation of the semiconductor integrated circuit device according to the eleventh embodiment;

FIGS. 36(A) and 36(B) are diagrammatical views and plan views showing the relation between the semiconductor integrated circuit device, a package, and the power supply system;

FIGS. 37(A) and 37(B) are plan views and sectional views of a MOSFET having a first gate electrode and a second gate electrode;

FIG. 38 is an explanatory diagram of the loss of the semiconductor integrated circuit device;

FIGS. 39(A) and 39(B) are explanatory diagrams of the loss of the MOSFET;

FIG. 40 is a block diagram showing configurations of the semiconductor integrated circuit device and the power supply system according to the embodiments; and FIGS. 41(A) to 41(G) are waveform charts showing an operation of the semiconductor integrated circuit device according to the embodiments.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

<Outline of Power Supply System and Semiconductor Integrated Circuit Device Used in Power Supply System>

Multiple embodiments will hereinafter be described in order. An outline of configurations and operations of a power supply system and a semiconductor integrated circuit device used in the power supply system, the power supply system and semiconductor integrated circuit device applying in common to the embodiments, will first be described.

FIG. 40 is a block diagram showing a configuration of a power supply system. In FIG. 40, 4000 denotes the power supply system and 4001 denotes a load connected to the power supply system 4000. The load 4001 can be regarded as an equivalent to a current source and is therefore denoted by a current source symbol. As describe above, for example, a CPU is equivalent to the load. The power supply system 4000 includes a control semiconductor integrated circuit device 4007, a coil element 4008, a smoothing capacitor 4009, a boot capacitor 4010, and multiple semiconductor chips 4003 to 4006 sealed in a single package 4002. Components making up the power supply system 4000 are not limited to these components.

In this embodiment, the semiconductor chips sealed in the single package 4002 are a high-side MOSFET 4005, a low-side MOSFET 4006, and a driver 4003 that drives the high-side MOSFET 4005 and the low-side MOSFET 4006. In other words, each of the high-side MOSFET 4005, the low-side MOSFET 4006, and the driver 4003 is formed as a separate semiconductor chip. These three semiconductor chips are sealed in the single package, which will be described later referring to FIGS. 36(A) and 36(B). Since a unit of the package is mounted on, for example, a printed board, etc., the package 4002 is referred to as semiconductor integrated circuit device in this specification of the present application. In the following description, therefore, the package 4002 is explained as the semiconductor integrated circuit device. According to this embodiment, a voltage supplied to the drain of the MOSFET 4005 is higher than a voltage supplied to the source of the MOSFET 4006. For this reason, the MOSFET 4005 is referred to as high-side MOSFET while the MOSFET 4006 is referred to as low-side MOSFET.

In FIG. 40, each of T1 to T6 denotes a terminal formed on the semiconductor integrated circuit device 4002. The semiconductor integrated circuit device 4002 has multiple terminals out of which principle terminals are shown as the terminals T1 to T6 in FIG. 40. For example, a terminal that receives an input signal from the control semiconductor integrated circuit device 4007 is omitted from FIG. 40. The terminal T1 is an output terminal that outputs an output signal VSWH from the semiconductor integrated circuit device 4002, the terminal T2 is a voltage terminal that supplies a ground voltage PGND to the low-side MOSFET 4006, and the terminal T3 is a voltage terminal that supplies a ground voltage CGND to the driver. The terminal T4 is a voltage terminal that supplies a supply voltage VCIN to a control circuit 4004, the terminal T5 is a voltage terminal that supplies a supply voltage BOOT corresponding to the voltage of the output signal VSWH, to the driver, and the terminal T6 is a voltage terminal that supplies an input voltage VIN to the high-side MOSFET 4005.

As described above, each of the high-side MOSFET 4005 and low-side MOSFET 4006 is an n-channel type MOSFET, and has a first gate electrode G1 equivalent to a first input electrode, a second gate electrode G2 equivalent to a second input electrode, a source S, and a drain D, which will be described later referring to FIGS. 37(A) and 37(B). The second input electrode (second gate electrode) G2 is located closer to the drain D than the first input electrode (first gate electrode) G1, and the MOSFET is switched on and off according to a voltage supplied to the first gate electrode G1. Functioning as the n-channel type MOSFET, the MOSFET is switched on when a positive voltage positive in polarity relative to a voltage at the source S and higher than a given voltage (threshold voltage) is supplied to the first gate electrode G1, while it is switched off when a voltage equal to or lower than the threshold voltage relative to the voltage at the source S is supplied to the first gate electrode G1.

A positive voltage or negative voltage positive or negative in polarity relative to a voltage at the source S as a reference voltage is supplied to respective second input electrodes (second gate electrodes) G2 of the high-side MOSFET 4005 and low-side MOSFET 4006, which will be described later in multiple embodiments. Since the outline of the power supply system and the semiconductor integrated circuit device is described here, supply of the positive voltage or negative voltage to the second input electrodes will not be described further. At the high-side MOSFET 4005 and the low-side MOSFET 4006 depicted in FIG. 40, a parasitic diode is created between a semiconductor region in which the MOSFET is formed and a semiconductor region in which the drain is formed, and this parasitic diode is denoted as DD. The back gates of these MOSFETs are connected to the sources, respectively. Connection destinations for respective second input electrodes G2 of the high-side MOSFET 4005 and low-side MOSFET 4006 will be described later in each embodiment, and are therefore not indicated in FIG. 40.

The high-side MOSFET 4005 has a source-drain path connected in series between the voltage terminal T6 and the output terminal T1 and has the first gate electrode G1 connected to an output terminal T7 of the driver 4003. The low-side MOSFET 4006 has a source-drain path connected in series between the output terminal T1 and the voltage terminal T2 and has the first gate electrode G1 connected to an output terminal T9 of the driver 4003. According to the embodiment, the ground voltage PGND is supplied to the voltage terminal T2, and a positive voltage higher than the ground voltage PGND is supplied as the input voltage VIN, to the voltage terminal T6. In FIG. 40, therefore, the drain D of the high-side MOSFET 4005 is connected to the voltage terminal T6 and the source S of the same is connected to the output terminal T1. Likewise, the drain D of the low-side MOSFET 4006 is connected to the output terminal T1 and the source S of the same is connected to the voltage terminal T2.

An output signal (drive signal) GH output from the output terminal T7 of the driver 4003 is input to the first gate electrode G1 of the high-side MOSFET 4005 that receives the incoming signal GH as an input signal. An output signal (drive signal) GL output from the output terminal T9 of the driver 4003 is input to the first gate electrode G1 of the low-side MOSFET 4006 that receives the incoming signal GL as an input signal. The driver 4003 changes the voltages of the drive signals GH and GL so that the high-side MOSFET 4005 and the low-side MOSFET 4006 are switched on and off complementarily. As a result of complemental switching on and off of the high-side MOSFET 4005 and the low-side MOSFET 4006 caused by the drive signals GH and GL, the voltage terminal VIN or the voltage terminal PGND is connected electrically to the output terminal T1 through the source-drain path of the high-side MOSFET 4005 or the low-side MOSFET 4006.

When the high-side MOSFET 4005 is switched on, a current is supplied from the input voltage VIN node through the output terminal T1 to one end of the coil element 4008. When the low-side MOSFET 4006 is switched on, on the contrary, a current is supplied from the one end of the coil element 4008 toward the output terminal T1 and is finally supplied to the voltage terminal T2. Repeated complemental switching on and off of the high-side MOSFET 4005 and the low-side MOSFET 4006 results in supply of a cyclically alternating current to the one end of the coil element 4008, thus generating a counter electromotive force, which creates an output voltage Vout on the other end of the coil element 4008, the output voltage Vout being different in voltage value from the input voltage VIN. This output voltage Vout is smoothed out by the smoothing capacitor 4009 and is supplied to the load 4001.

Meanwhile, a voltage generated on the one end of the coil element 4008 is supplied to a boot capacitor 4010. As a result of cyclic changes of the voltage at the one end of the coil element 4008, the boot capacitor 4010 generates a voltage BOOT higher than a voltage at the output terminal T1 and supplies the voltage BOOT to the voltage terminal T5.

The driver 4003 has drive circuits 4011 and 4012 and the control circuit 4004. The drive circuit 4011 operates with a voltage from a voltage terminal T8 as a reference voltage and a voltage BOOT from the voltage terminal T5 as a supply voltage, and outputs a signal following an output signal f from the control circuit 4004, as the drive signal GH. Because the voltage terminal T8 is connected to the source S of the high-side MOSFET 4005, the drive circuit 4011 outputs the drive signal GH to which a voltage at the source S of the high-side MOSFET 4005, that is, a voltage at the output terminal T1 serves as a reference voltage. Hence, the voltage of the drive signal GH changes between, for example, the reference voltage (voltage at the voltage terminal T8) and the voltage BOOT.

The drive circuit 4012 operates with a voltage at a voltage terminal T10 as a reference voltage and the supply voltage VCIN supplied to the voltage terminal T4 as a supply voltage. Because the voltage terminal T10 is connected to the voltage terminal T2, the drive circuit 4012 operates with the ground voltage PGND and the voltage VCIN as supply voltages and outputs the drive signal GL following an output signal c from the control circuit 4004, to the first gate electrode G1 of the low-side MOSFET 4006 via the output terminal T9.

The control circuit 4004 operates with the ground voltage CGND supplied to the voltage terminal T3, the voltage VCIN supplied to the voltage terminal T4, and the voltage BOOT supplied to the voltage terminal T5 that serve as operation power supply. The control circuit 4004 has control terminals T11 and T12, and generates the output signals f and c following a pulse width control signal PWM (input signal a) supplied from the control semiconductor integrated circuit device 4007 to the control terminal T11. To the control terminal T12, a control signal DISBL# that gives an instruction on whether or not to operate the control circuit 4004 is supplied. In FIG. 40, the supply voltage VCIN is supplied to the control terminal T12 via a resistance element 4022. Because the supply voltage VCIN is a high voltage, the control signal DISBL# is a high-voltage signal, in which case the control circuit 4004 generates output signals g and c following the pulse width control signal PWM supplied to the control terminal T11. When the control signal DISBL# is shifted to a low-voltage signal, the control circuit 4004 is shifted to a non-operation state. In this manner, the power supply system 4000 can be controlled to its operation state or non-operation state through the control signal DISBL#.

The ground voltage CGND supplied to the voltage terminal T3 of the control circuit 4004 is substantially the same voltage (ground voltage GND) as the ground voltage PGND supplied to the voltage terminal T2 connected to the source S of the low-side MOSFET 4006. In this embodiment, the voltage terminal T3 that supplies the ground voltage to the control circuit 4004 is electrically isolated from the voltage terminal T2 that supplies the ground voltage to the source S of the low-side MOSFET 4006. This prevents, for example, a change in the ground voltage PGND caused by the operation of the low-side MOSFET 4006 from being transmitted to the control circuit 4004. The value of the voltage BOOT supplied to the voltage terminal T5 is determined to be higher than the value of the source voltage VCIN supplied to the voltage terminal T4. The control circuit 4004 is so configured that the high-level voltage of the output signal f from the control circuit 4004 matches the voltage BOOT. Hence, the output signal f having the voltage BOOT higher than the source voltage VCIN is input to the drive circuit 4011.

The input voltage VIN is, for example, 12 V and the source voltage VCIN for the driver 4003 is, for example, 5 V. The voltage values of the input voltage VIN and the source voltage VCIN are not limited to these values.

In this embodiment, each of the drive circuits 4011 and 4012 functions as a buffer circuit. The drive circuit 4012 thus supplies the output signal c from the control circuit 4004 to the first gate electrode G1 of the low-side MOSFET 4006. The voltage of the drive signal GL supplied to the first gate electrode G1 of the low-side MOSFET 4006 shifts between the source voltage VCIN and the ground voltage.

The drive circuit 4011 supplies the output signal f from the control circuit 4004 to the first gate electrode G1 of the high-side MOSFET 4005. The drive circuit 4011 is supplied with the voltage BOOT as a supply voltage, so that the high-level voltage of the output signal f matches the voltage BOOT. As a result, the voltage of the drive signal GH supplied to the first gate electrode G1 of the high-side MOSFET 4005 shifts between the voltage BOOT and the voltage VSWH at the voltage terminal T8 (voltage at the source of the high-side MOSFET). In this manner, by increasing the voltage of the drive signal GH supplied to the first gate electrode G1 of the high-side MOSFET 4005, the loss of the high-side MOSFET 4005 caused by the threshold voltage is reduced.

The output voltage Vout output from the output terminal T13 of the power supply system 4000 is supplied to the control semiconductor integrated circuit device 4007. The control semiconductor integrated circuit device 4007 generates the pulse width control signal PWM (input signal a) according to the value of the output voltage Vout, that is, generates the pulse width control signal PWM having a pulse width (e.g., period during which the signal's voltage level stays high) corresponding to the value of the output voltage Vout.

The control circuit 4004 in this embodiment has level shifters 4013 and 4014, an input logical circuit 4018, AND circuits 4016 and 4017, a NOR circuit 4014, an inverter circuit 4020, a low-voltage detecting circuit 4021, and an overlap preventing circuit 4015. The level shifter 4013 is supplied with the voltage BOOT so that the high-level voltage of the output signal f output from the level shifter 4013 matches the voltage BOOT. The overlap preventing circuit 4015 is provided with a voltage converting circuit that converts the high-level voltage of the output signal f to a proper voltage. Providing the voltage converting circuit, however, is not absolute necessity.

It is indicated in FIG. 40 that the AND circuit 4016 is a three-input AND circuit having one reverse input terminal and two non-reverse input terminals and that the AND circuit 4017 is a three-input AND circuit having two reverse input terminals and one non-reverse input terminal. The reverse input terminal is the terminal that reverses an incoming signal in polarity and that supplies the reversed signal to the AND circuit. The non-reverse terminal is the terminal that supplies an incoming signal left as it is to the AND circuit. In this embodiment, the inverter 4020 has a hysteresis function for preventing noise-caused malfunctioning.

The input logical circuit 4018 has multiple functions, which will not be described. The pulse width control signal PWM (input signal a) output from the control semiconductor integrated circuit device 4007 travels through the control terminal T11 to enter the input logical circuit 4018. An output signal b from the input logical circuit 4018 is supplied to one reverse-input terminal of the AND circuit 4017 and to one non-reverse input terminal of the AND circuit 4016. An output signal from the NOR circuit 4019 is supplied to the other non-reverse input terminal of the AND circuit 4016 and to the non-reverse input terminal of the AND circuit 4017. One input terminal of the NOR circuit 4019 is supplied with the control signal DISBL# transmitted thereto via the inverter 4019, while the other input terminal of the same is supplied with the source voltage VCIN transmitted thereto via the low-voltage detecting circuit 4021.

The source voltage VCIN is input to the low-voltage detecting circuit 4021. When the source voltage VCIN drops below a given voltage, the low-voltage detecting circuit 4021 generates a high-voltage level output signal and supplies it to the NOR circuit 4019. When the control signal DISBL# is shifted to a low-voltage level signal or the source voltage VCIN drops below the given voltage, therefore, the NOR circuit 4019 generates a low-voltage level output signal. When the output signal from the NOR circuit 4019 goes low in voltage level, the AND circuits 4016 and 4017 do not transmit the output signal b from the input logical circuit 4018 or/and the output signals d and g from the overlap preventing circuit 4015, to the output terminals of the AND circuits 4016 and 4017, respectively. As a result, the control circuit 4004 shifts to a non-operation state. In contrast, when the source voltage VCIN is higher than the given voltage and the high-voltage level control signal DISBL# is supplied, an output signal from the NOR circuit 4019 goes high in voltage level. As a result, the AND circuits 4016 and 4017 transmit the output signal b from the input logical circuit 4018 or/and the output signals d and g from the overlap preventing circuit 4015, to the output terminals of the AND circuits 4016 and 4017, respectively, which brings the control circuit 4004 into an operation state.

The reverse input terminal of the AND circuit 4016 is supplied with the output signal d from the overlap preventing circuit 4015, and the other reverse input terminal of the AND circuit 4017 is supplied with the output signal g from the overlap preventing circuit 4015. An output signal e from the AND circuit 4016 is transmitted through the level shifter 4013 and is input as the output signal f from the control circuit 4004, to the drive circuit 4011. This output signal f is input also to the overlap preventing circuit 4015. Meanwhile, the output signal c from the AND circuit 4017 is input as an output signal from the control circuit 4004, to the drive circuit 4012. The output signal c is shifted in voltage level by the level shifter 4014 to a signal with a desired voltage and is supplied to the overlap preventing circuit 4015.

The overlap preventing circuit 4015 is the circuit that prevents the high-side MOSFET 4005 and low-side MOSFET 4006 from switching on simultaneously. To prevent both MOSFETs from switching on simultaneously, the overlap preventing circuit 4015 receives the output signals c and f and generates the output signals d and g whose high-voltage level periods do not overlap each other. Such a circuit can be constructed by, for example, combining together multiple logical circuits and delay circuits.

The operation of the power supply system of FIG. 40 will then be described, referring to FIGS. 41(A) to 41(G), which are waveform charts of the above signals (output signals and control signals) a to g. In FIGS. 41(A) to 41(G), the horizontal axis represents time and the vertical axis represents voltage.

FIG. 41(A) is a waveform chart of the pulse width control signal PWM (denoted by 'a' in FIG. 41(A)) output from the control semiconductor integrated circuit device 4007. In FIG. 41(A), for simpler explanation, only one period during which the signal remains high in voltage level (pulse width) is shown. Such periods during which the signal remains high in voltage level (pulse width), however, arise cyclically. According to this embodiment, the control semiconductor integrated circuit device 4007 changes the pulse width (period during which the signal remains high in voltage level) of the pulse width control signal PWM according to the value of the output voltage Vout from the power supply system 4000 and regulates the value of the output voltage Vout to a given value. The control semiconductor integrated circuit device 4007 performs such control by adopting so-called PWM control method.

In FIG. 41(A), the pulse width control signal PWM(a) at its low-voltage level shifts to a high-voltage level at time t1. In response to this change of the pulse width control signal PWM, the input logical circuit 4018 causes the output signal b at its low-voltage level to shift to a high-voltage level at time t2 after an elapse of a given delay time from time t1 (FIG. 41(B)). In response to the shift of the output signal b to its high-voltage level, the output signal b being supplied to the reverse input terminal of the AND circuit 4017, the AND circuit 4017 causes the output signal c to shift to a low-voltage level at time t2 (FIG. (C)). In response to the shift of the output signal c to its low-voltage level, the drive circuit 4012 generates the low-voltage level drive signal GL and supplies it to the first gate electrode G1 of the low-side MOSFET 4006. Because the drive circuit 4012 functions as the buffer, the drive signal GL and the output signal c synchronize with each other. Therefore, the waveform depicted in FIG. 41(C) can be regarded as the waveform of the drive signal GL. Hence reference numeral GL representing the drive signal GL is indicated as "(GL)" in FIG. 41(C).

The overlap preventing circuit 4015 receives the output signal c having changed in voltage level (from high-voltage level to low-voltage level) via the level shifter 4014. Upon receiving this output signal c having changed in voltage level, the overlap preventing circuit 4015 causes the output signal d at its high-voltage level to shift to a low-voltage level at time t3 after an elapse of a given delay time from time t2 (FIG. 41(D)). Because the output signal d is supplied to the reverse input terminal of the AND circuit 4016, the AND circuit 4016 causes the output signal e at its low-voltage level to shift to a high-voltage level at time t3, in response to the shift of the output signal d to its low-voltage level (FIG. 41(E)).

When the output signal e from the AND circuit 4016 changes in voltage level from the low-voltage level to high-voltage level, the level shifter 4013 generates the high-voltage level output signal f in response to the change in the voltage level of the output signal e. Because the level shifter 4013 is supplied with the voltage BOOT as an operating voltage, the high-voltage level of the output signal f matches the voltage BOOT. This output signal f is transmitted through the drive circuit 4011 functioning as the buffer to the first gate electrode G1 of the high-side MOSFET 4005. The drive circuit 4011 operates with the voltage BOOT and the voltage VSWH at the voltage terminal T8. Because of this, the high-voltage level of the drive signal GH supplied from the drive circuit 4011 to the first gate electrode G1 of the high-side MOSFET 4005 matches the voltage BOOT, while the low-voltage level of the drive signal GH matches the voltage VSWH. Because the output signal f and the drive signal GH synchronize with each other, FIG. 41(F) depicts the output signal f and drive signal GH that go high in voltage level (voltage BOOT) at time t4.

When the output signal f shifts to a high-voltage level signal, the overlap preventing circuit 4015 causes the output signal g at its low-voltage level to shift to a high-voltage level at time t5 after an elapse of a given time from time t4 (FIG. 41(G)).

As described above, in response to the shift of the pulse width control signal PWM (denoted by a in FIG. 41) from its low-voltage level to high-voltage level, the drive signal GL from the drive circuit 4012 shifts from its high-voltage level to low-voltage level at time t2. At time t4 later than time t2, the drive signal GH from the drive circuit 4011 shifts from its low-voltage level (VSWH) to high-voltage level (BOOT). Hence, the low-side MOSFET 4006 starts shifting to its off-state at time t2, and the high-side MOSFET 4005 starts shifting to its on-state at time t4. As a result, the input voltage VIN is supplied to the output terminal T1 via the high-side MOSFET 4005 and is therefore supplied to the one end of the coil element 4008 and to one end of the boot capacitor 4010. In other words, a current is supplied from the voltage terminal T6 to the one end of the coil element 4008 via the output terminal T1.

Subsequently, at time t6, the pulse width control signal PWM (denoted by 'a' in FIG. 41(A)) at its high-voltage level shifts to a low-voltage level (FIG. 41(A)). In response to this voltage level change, the input logical circuit 4018 causes the output signal b at its high-voltage level to shift to a low-voltage level at time t7 (FIG. 41(B)). As a result of the shift of the output signal b to the low-voltage level, the output signal e from the AND circuit 4016 shifts to a low-voltage level at time t7 (FIG. 41(E)).

When the output signal e shifts to the low-voltage level, the level shifter 4013 causes the output signal f at its high-voltage level (voltage BOOT) to shift to a low-voltage level. In response to the voltage shift of the output signal f from the level shifter 4013, the drive circuit 4011 causes the drive signal GH at its high-voltage level (BOOT) to shift to a low-voltage level (VSWH) (at time t8 in FIG. 41(F)).

When the output signal f shifts from the high-voltage level to the low-voltage level, the overlap preventing circuit 4015 causes the output signal g at its high-voltage level to shift to a low-voltage level at time t9 after an elapse of a given time from time t8, in response to the shift of the output signal f to the low-voltage level (FIG. 41(G)). As a result, low-voltage level signals are supplied to the two reverse input terminals of the AND circuit 4017, respectively, which causes the output signal c from the AND circuit 4017 to shifts from its low-voltage level to high-voltage level (time t9 in FIG. 41(C)). This output signal c is held temporarily by the drive circuit 4012 as a buffering action and is supplied to the first gate electrode G1 of the low-side MOSFET 4006 as the drain signal GL.

When the output signal c shifts from the low-voltage level to the high-voltage level at time t9, the overlap preventing circuit 4015 causes the output signal d at its low-voltage level to shift to a high-voltage level after an elapse of a given time from the time of shift of the output signal c to the high-voltage level (time t10 in FIG. 41(D)).

From time t10 onward, a waveform condition before time t1 results, and after the pulse width control signal PWM goes high again in voltage level, the above operations are repeated.

As described above, the drive signal GH supplied to the first gate electrode G1 of the high-side MOSFET 4005 shifts to the low-voltage level (VSWH) at time t8 and the drive signal GL supplied to the first gate electrode G1 of the low-side MOSFET 4006 shifts to the low-voltage level at time t9 later than time t8. This means that the generation of a period during which the high-side MOSFET 4005 and low-side MOSFET 4006 are switched on simultaneously can be prevented.

At time t9, the shift of the drive signal GL to the high-voltage level (VCIN) causes the low-side MOSFET 4006 to switch to its on-state. As a result, the output terminal T1 is connected to the voltage terminal T2 via the low-side MOSFET 4006. In other words, a current flows from the one end of the coil element 4008 toward the voltage terminal T2 via the output terminal T1.

Being supplied with an alternating current, the coil element 4008 generates a counter electromotive force and also generates the output voltage Vout different in voltage value from the input voltage VIN at the other end of the coil element 4008.

To regulate the value of the generated output voltage Vout to a given value, the control semiconductor integrated circuit device 4007 controls the pulse width of the pulse width control signal PWM according to the value of the generated output voltage Vout.

<Structure of High-Side MOSFET and Low-Side MOSFET>

The structure of the high-side MOSFET 4005 and low-side MOSFET 4006 will then be described. The high-side MOSFET 4005 and the low-side MOSFET 4006 are different in size from each other but are identical in structure with each other. The structure of the low-side MOSFET 4006 will be described as an example.

FIG. 37(A) is a diagrammatical plan view showing a layout of the low-side MOSFET 4006 in a semiconductor chip. FIG. 37(B) is a diagrammatical sectional view showing a section of the low-side MOSFET 4006 taken along a B-B' line of FIG. 37(A). In FIG. 37(A), 3700 denotes a semiconductor chip. In this embodiment, two MOSFETs are formed in the semiconductor chip 3700, and respective sources S, drains D, first gate electrodes G1, and second gate electrodes G2 of the two MOSFETs are connected to each other to make up a single low-side MOSFET 4006. The structure of the low-side MOSFET 4006, however, is not limited to this structure.

In FIG. 37(A), 3701 denotes respective source electrodes of the two MOSFETs, 3702 denotes respective second gate electrodes G2 of the two MOSFETs, and 3703 denotes a connection pad of the first gate electrode G1 of the low-side MOSFET 4006. The drain electrode of the low-side MOSFET 4006 is the back face of the semiconductor chip 3700. Each source electrode 3701 is so formed as to cover a partial area of each second gate electrode 3702. Using the area of second gate electrode 3702 that is not covered with the source electrode 3701, the drive signal GL is supplied to the second gate electrode 3702.

In FIG. 37(B), 3704 denotes an n-type (first conductive) semiconductor region that functions as the drain D of the low-side MOSFET 4006, 3705 denotes a p-type (second conductive) semiconductor region in which the channel of the MOSFET is formed, and 3706 denotes an n$^+$-type (first conductive) semiconductor region that functions as the source S of the MOSFET. The main surface of the semiconductor region 3704 is covered with the semiconductor region 3705 overlaid thereon, and the main surface of the semiconductor region 3705 is covered with the semiconductor region 3706 overlaid thereon. As shown in FIG. 37(B), slots are formed in the semiconductor regions 3704, 3705, and 3706. In a slot formed in the semiconductor region 3704, a metal layer 3708 is formed to be adjacent to the semiconductor region 3704 across an insulating layer 3707. In a slot formed in the semiconductor regions 3704 and 3705, a metal layer 3709 is so formed as to overlap the metal layer 3708 and be adjacent to the semiconductor regions 3704 and 3705 across the insulating layer 3707. The metal layer 3709 makes up the first gate electrode G1, while the metal layer 3708 makes up the second gate electrode G2.

It is understood that the part of insulating layer 3707 that is sandwiched between the metal layer 3709 functioning as the first gate electrode G1 and the semiconductor region 3705 serves as a gate insulating film for the low-side MOSFET 4006. According to this embodiment, in the vertical direction of the slots, the metal layer 3709 making up the first gate electrode G1 partially overlaps the semiconductor region 3706 functioning as the source S and the semiconductor region 3704 functioning as the drain D. In the vertical direction of the slots, the metal layer 3708 functioning as the second gate electrode G2 is embedded in the semiconductor region 3704 functioning as the drain D. In other words, in the vertical direction of the slots, the second gate electrode G2 is located closer to the drain D than the first gate electrode G1.

In FIG. 37(B), 3701 denotes a source electrode connected electrically to the semiconductor regions 3706 functioning as the source S. The source electrode 3701 is connected electrically also to the semiconductor regions 3705 in which the channel is formed. Hence, the source S and the back gate of the low-side MOSFET 4006 are connected electrically to the source electrode 3701. The metal layer 3709 functioning as the first gate electrode G1 is connected to the connection pad 3703 shown in FIG. 37(A). 3710 denotes a drain electrode formed on the back face of the semiconductor chip 3700.

In FIG. 37(B), Crss denotes a first gate-drain capacitance formed between the first gate electrode G1 and the drain D. By determining a voltage supplied to the second gate electrode G2 to be a negative voltage negative in polarity relative to the source S, a depletion layer is expanded significantly by the second gate electrode, which enables a reduction in the first gate-drain capacitance Crss. By determining a voltage supplied to the second gate electrode G2 to be a positive voltage positive in polarity relative to the source S, resistance in the drain region corresponding to the second gate electrode G2 is reduced, which enables a reduction in the on-resistance of the low-side MOSFET 4006 when it is switched on.

Similarly, in the case of the high-side MOSFET 4005, by changing the polarity of a voltage supplied to the second gate electrode G2 (relative to a voltage at the source as reference voltage), the first gate-drain capacitance Crss can be reduced and the on-resistance can also be reduced. The low-side MOSFET 4006 (FIG. 40) is constructed to be larger than the high-side MOSFET 4005 because of a particular function of the low-side MOSFET 4006 that it causes a current from the coil element 4008 to flow to the ground voltage PGND node, thereby dropping a voltage at the output terminal T1, which function will be described later referring to FIG. 36(B). Reducing the first gate-drain capacitance Crss and on-resistance of the low-side MOSFET 4006, therefore, is particularly effective for better efficiency.

(First Embodiment)

FIG. 1(A) is a circuit diagram showing a configuration of a principle part of the semiconductor integrated circuit device 4002 according to a first embodiment. FIG. 1(B) is a waveform chart showing the waveform of a voltage in the semiconductor integrated circuit device 4002 of FIG. 1(A).

FIG. 1(A) depicts the low-side MOSFET 4006 and the drive circuit 4012 in the semiconductor integrated circuit device 4002 of FIG. 40. Components not depicted in FIG. 1(A) are the same as the components of the semiconductor integrated circuit device 4002 of FIG. 40 and are therefore omitted in further description.

As described referring FIG. 40, the first gate electrode G1 of the low-side MOSFET 4006 is connected to the output terminal T9 of the driver 4003, the source and back gate of the same are connected to the voltage terminal T2, and the drain of the same is connected to the output terminal T1 of the semiconductor integrated circuit device 4002. The driver 4003 has the drive circuit 4012 that drives the low-side MOSFET 4006, and the drive signal GL from the drive circuit is supplied to the first gate electrode G1 of the low-side MOSFET 4006 via the output terminal T9.

According to the first embodiment, the driver 4003 has a control terminal T14 and a second gate electrode control circuit 1000 connected to the control terminal T14. The control terminal T14 is connected to the second gate electrode G2 of the low-side MOSFET 4006, so that a second gate control signal UL generated by the second gate electrode control circuit 1000 is supplied to the second gate electrode G2 of the low-side MOSFET 4006 via the control terminal T14. The second gate electrode control circuit 1000, for example, has a variable voltage source 1001, as shown in FIG. 1(A). The variable voltage source 1001 generates a positive voltage positive in polarity relative to the ground voltage CGND, which positive voltage is variable in voltage value. The ground voltage CGND is the ground voltage GND substantially the same as the ground voltage PGND. Hence, the second gate electrode control circuit 1000 generates the second gate control signal UL positive in polarity relative to the source of the low-side MOSFET 4006 and having a variable voltage value.

Because a positive voltage positive in polarity relative to a voltage at the source (ground voltage PGND) as a reference voltage is supplied as the second gate control signal UL, to the second gate electrode G2 of the low-side MOSFET 4006, the on-resistance of the low-side MOSFET 4006 when it is switched on can be reduced. Reducing the on-resistance allows a reduction in the loss (power consumption) of the low-side MOSFET 4006 when it is switched on, thus achieving a reduction in the loss of the semiconductor integrated circuit device 4002. In the first embodiment, because a voltage supplied to the second gate electrode G2 is variable in voltage value, the on-resistance value can be adjusted.

Examples of the second gate electrode control circuit 1000 are shown in FIGS. 1(C) and 1(D). FIG. 1(C) is a circuit diagram showing an example of the second gate electrode control circuit 1000 that generates the second gate control signal UL having a positive voltage. FIG. 1(D) is a circuit diagram showing an example of the second gate electrode control circuit 1000 that generates the second gate control signal UL having a negative voltage. FIG. 1(B) is a waveform chart showing the voltage waveform of the second gate control signal UL generated by the second gate electrode control circuit 1000 of FIG. 1(D). In this embodiment, voltage polarity means polarity relative to the polarity of a voltage at the source S of the low-side MOSFET 4006, i.e., the ground voltage GND. Therefore, a voltage with positive polarity means a positive voltage and a voltage with negative polarity means a negative voltage.

The second gate electrode control circuit 1000 that generates the second gate control signal UL having a positive voltage will first be described. In FIG. 1(C), 1002 denotes an n-channel type MOSFET, 1003 and 1004 denote resistance elements, 1005 denotes a differential amplifier circuit, and 1006 denotes a variable voltage source.

The resistance elements 1003 and 1004 are connected between the connection terminal T14 and the ground voltage CGND node, and a divided voltage is extracted from a connection node between the resistance element 1003 and the resistance element 1004. The extracted divided voltage is supplied to the reverse input terminal (−) of the differential amplifier circuit 1005, while a variable voltage from the variable voltage source 1006 is supplied to the non-reverse input terminal (+) of the differential amplifier circuit 1005. An output signal from the differential amplifier circuit 1005 is supplied to the gate of the MOSFET 1002 whose drain is supplied with the source voltage VCIN and whose back gate and drain are connected to the control terminal T14. The differential amplifier circuit 1005 controls the MOSFET 1002 so that a voltage difference between the divided voltage determined by a resistance ratio between the resistance element 1003 and the resistance element 1004 and the variable voltage from the variable voltage source 1006 is reduced. As a result, a voltage corresponding to the variable voltage from the variable voltage source 1006 is generated as the second gate control signal UL and is supplied to the second gate electrode G2 of the low-side MOSFET 4006. In this example, the on-resistance value of the low-side MOSFET 4006 can be adjusted by changing the variable voltage value of the variable voltage source 1006.

The second gate electrode control circuit 1000 that generates the second gate control signal UL having a negative voltage will then be described, referring to FIGS. 1(D) and 1(B). In FIG. 1(D), the second gate electrode control circuit 1000 has a p-channel type MOSFET 1007, an n-channel type MOSFET 1008, an oscillation circuit 1013, capacitor elements 1009 and 1012, and diode elements 1010 and 1011.

The p-channel type MOSFET 1007 and the n-channel type MOSFET 1008 have their respective source-drain paths connected in series between the source voltage VCIN node and the ground voltage CGND node. An oscillation output signal from the oscillation circuit 1013 is supplied to respective gate electrodes of the p-channel type MOSFET 1007 and the n-channel type MOSFET 1008. In other words, the p-channel type MOSFET 1007 and the n-channel type MOSFET 1008 make up a CMOS-type inverter, to which the oscillation output signal from the oscillation circuit 1013 is input. The output end of the inverter (connection node between the MOSFET 1007 and the MOSFET 1008) is connected to the cathode of the diode element 1010 and the anode of the diode element 1011 via the capacitor element 1009, and the anode of the diode element 1010 is connected to one end of the capacitor element 1012 and to the control terminal T14. The cathode of the diode element 1011 and the other end of the capacitor element 1012 are connected to the ground voltage CGND node.

According to the oscillation output signal from the oscillation circuit 1013, the inverter (MOSFETs 1007 and 1008) causes the capacitor element 1009 to discharge and be charged cyclically. When the MOSFET 1007 is switched on, the MOSFET 1007, the capacitor element 1009, and the diode element 1011 jointly form a charge path through which the capacitor element 1009 is charged. When the MOSFET 1008 is switched on, on the other hand, the MOSFET 1008, the capacitor element 1009, the diode element 1010, and the capacitor element 1012 jointly form a discharge path. When the discharge path is formed, electric charges are distributed between the capacitor element 1009 and the capacitor element 1012, as a result of which a voltage at the control terminal T14 becomes a negative voltage (voltage with negative polarity) negative in polarity relative to the ground voltage CGN. This negative voltage is supplied as the second gate control signal UL, to the second gate electrode G2 of the low-side MOSFET 4006.

FIG. 1(B) depicts a voltage at the source of the low-side MOSFET 4006 (source voltage (GND) in FIG. 1(B)) and the voltage waveform of the second gate control signal UL. In FIG. 1(B), the horizontal axis represents time and the vertical axis represents voltage. The source S and back gate of the low-side MOSFET 4006 are connected to the voltage terminal T2 supplied with the ground voltage PGND. A voltage at the source of the low-side MOSFET 4006, therefore, matches the ground voltage PGND (which is depicted as source voltage (GND) in FIG. 1(B)). The second gate electrode control circuit 1000 of FIG. 1(D) generates a negative voltage negative in polarity relative to the ground voltage CGND. Since both ground voltage PGND and ground voltage CGND are the ground voltage (GND), the second gate control signal UL generated by the second gate electrode control circuit 1000 of FIG. 1(D) has a voltage lower than the voltage at the source of the low-side MOSFET 4006. In other words, the voltage of the second gate control signal UL is a negative voltage with respect to the voltage at the source S defined as a reference voltage.

By supplying a negative voltage negative in polarity relative to a voltage at the source S of the low-side MOSFET 4006, to the second gate G2 of the low-side MOSFET 4006, the first gate-drain capacitance Crss can be reduced. As a result, an on-off shift time (which will hereinafter be also referred to as "on-off transition time") which the low-side MOSFET 4006 takes to shift from its on-state to off-state or vice versa can be shortened. Shortening the on-off transition time during which power is consumed leads to a reduction in power consumption (loss) by the low-side MOSFET 4006, thus achieving a reduction in the loss of the semiconductor integrated circuit device 4002.

(Second Embodiment)

According to the first embodiment, the second gate electrode control circuit 1000 generates the second gate control signal UL having a positive voltage or negative voltage positive or negative in polarity relative to a voltage at the source S. In the first embodiment, the second gate control signal UL having a positive or negative voltage is supplied constantly to the second gate electrode G2 in a case where the low-side MOSFET 4006 is in a state of on-off transition caused by the drive signal GL supplied to its first gate electrode G1 and also in a case where the low-side MOSFET 4006 is in an on-state or off-state.

However, examinations by the inventor of the present invention has revealed that when the second gate control signal UL having a negative voltage is supplied to the second gate electrode G2, the first gate-drain capacitance Crss reduces but the on-resistance of the MOSFET increases. Likewise, when the second gate control signal UL having a positive voltage is supplied to the second gate electrode G2, the on-resistance of the MOSFET reduces but the first gate-drain capacitance Crss increases. This means that constantly supplying the second gate control signal UL having a positive or negative voltage to the second gate electrode G2 of the MOSFET results in a loss increase in some cases.

To solve this problem, the inventor of the present invention has studied about loss caused by the on-resistance of the MOSFET, i.e., conduction loss and loss caused when the MOSFET in its on-state is switched off or the MOSFET in its off-state is switched on, i.e., switching loss. The semiconductor integrated circuit device 4002 used in the power supply system 4000 has been studied to examine the types and ratios of losses the semiconductor integrated circuit device 4002 suffers.

Losses the semiconductor integrated circuit device 4002 suffers have been classified. FIG. 38 is a characteristics diagram showing the loss of the semiconductor integrated circuit device 4002. Three measurement results are shown in FIG. 38, at the center of which a characteristics graph is indicated, which represents the relation between an output current (load current) Iout (A) flowing through the output terminal T1 (FIG. 40) and the efficiency (%) of the semiconductor integrated circuit device 4002. In this characteristics graph, the horizontal axis represents output current and the vertical axis represents a ratio between the input power and output power (output power/input power ratio) of the semiconductor integrated circuit device 4002. As the load 4001 of the power supply system 4000 increases in size and grows heavier, the load current (output current) Iout grows larger. This is because that the heavier load requires a higher current.

It is understood from the characteristics diagram of FIG. 38 that the efficiency is high when the load current Iout is relatively low and that the efficiency gets lower as the load current Iout gets higher. A case where the value of the load current (output current) Iout is equal to or smaller than a given current value i2 is considered to be a light load case, and a case where the value of the load current (output current) Iout is larger than the given current value i2 is considered to be a heavy load case. Based on this assumption, the types and ratios of losses are determined for the light load case and heavy load case. On the left side in FIG. 38, the types and ratios of losses in the light load case where the load current (output current) Iout takes a current value i1 equal to or smaller than the given current value i2 are indicated as "loss breakdown in the light load case". In the same manner, on the right side in FIG. 38, the types and ratios of losses in the heavy load case where the load current (output current) Iout takes a current value i3 larger than the given current value i2 are indicated as "loss breakdown in the heavy load case".

Each of "loss breakdown in the light load case" and "loss breakdown in the heavy load case" expresses loss items in the form of stacked bars. Stacked bars of items represent the types of losses, i.e., switching loss (hereinafter, also referred to as "SW loss"), conduction loss, and other loss. The types of losses will then be described.

Other loss represents a loss caused by a logical circuit in the semiconductor integrated circuit device 4002, e.g., a loss caused by the driver 4003. SW loss and conduction loss represents losses caused by the high-side MOSFET 4005 and low-side MOSFET 4006, which will be described referring to FIGS. 39(A) and 39(B) that are explanatory diagrams of a switching loss and a conduction loss.

A figure on the upper side in FIG. 39(A) is a diagrammatical view of a change in a source-drain voltage VDS, a change in a drain current IDS, and a loss P that arises when the low-side MOSFET 4006 (high-side MOSFET 4005) shifts from its off-state to on-state. A figure on the lower side in FIG. 39(A) is a characteristics graph showing the relation between the voltage of the second gate control signal UL supplied to the second gate electrode G2 and the first gate-drain capacitance Crss. In this characteristics graph, the horizontal axis represents the voltage of the second gate control signal UL (UL voltage in FIG. 39(A)) and the vertical axis represents the value of the first gate-drain capacitance Crss.

The SW loss, i.e., switching loss P is the loss that arises when the low-side MOSFET (high-side MOSFET) shifts from its off-state to on-state (or from on-state to off-state). During on-off shift, as indicated by the figure on the upper side in FIG. 39(A), the source-drain voltage VDS takes a definite value in a certain period and the drain current IDS takes a definite value in a certain period and both periods overlap in a certain timespan. Power is consumed during this timespan, which is regarded as the switching loss P. The switching loss P is, therefore, proportional to the product of the voltage (VDS) and the current (IDS). A time required for on-off shift, on the other hand, depends on a capacitance accompanying the first gate electrode of the MOSFET. The first gate-drain capacitance Crss is such a capacitance accompanying the first gate electrode of the MOSFET. As indicated by the characteristics graph on the lower side in FIG. 39(A), the first gate-drain capacitance Crss can be reduced by lowering the voltage of the second gate control signal UL supplied to the second gate electrode G2 to give the voltage negative polarity.

Reducing the first gate-drain capacitance Crss hastens the change in the source-drain voltage VDS and drain current IDS, thereby shortens the time required for on-off shift. As a result, the switching loss P is reduced.

As indicated by a formula on the upper side in FIG. 39(B), the conduction loss is the loss proportional to the product of the on-resistance (Ron) of the low-side MOSFET (high-side MOSFET) and the square of the drain current IDS ($IDS^2$). On the lower side in FIG. 39(B), a characteristics graph is indicated as a graph representing the relation between the voltage of the second gate control signal UL (UL voltage) and the on-resistance. In this characteristics graph, the horizontal axis represents the voltage of the second gate control signal UL and the vertical axis represents the on-resistance value of the low-side MOSFET (high-side MOSFET). It is understood from the characteristics graph on the lower side in FIG. 39(B) that the on-resistance Ron of the low-side MOSFET (high-side MOSFET) is reduced by causing the voltage of the second gate control signal UL (UL voltage) supplied to the second gate electrode G2 to shift from a negative voltage to a positive voltage.

The loss breakdown in the light load case and the loss breakdown in the heavy load case shown in FIG. 38 will then be described. It is understood from the "breakdown of loss with light load" on the left side in FIG. 38 that in the light load case, the ratio of the "SW loss" is higher than the ratio of the "conduction loss" and "other loss". In contrast, it is understood from the "breakdown of loss with heavy load" on the right side in FIG. 38 that in the heavy load case, the ratio of the "conduction loss" is higher than the ratio of the "SW loss" and "other", which indicates that as the load becomes heavier, the ratio of the "conduction loss" to the total loss of the semiconductor integrated circuit device becomes higher. In other words, the ratio of the conduction loss and the ratio of the switching loss to the total loss of the semiconductor integrated circuit device vary depending on the load. When the load is heavy, the ratio of the conduction loss is high. When the load is light, the ratio of the switching loss is high.

In a semiconductor integrated circuit device according to a second embodiment to be described next, both switching loss and conduction loss are reduced.

FIG. 2(A) is a block diagram showing a configuration of a principle part of the driver 4003 in the semiconductor integrated circuit device 4002 according to a second embodiment. The second gate electrode control circuit 1000 is depicted as the principle part. In the second embodiment, the configuration of the second gate electrode control circuit 1000 shown in FIG. 1(A) is modified to the configuration shown in FIG. 2(A). FIG. 2(A) depicts the control terminal T14 of the driver 4003 and the second gate electrode control circuit 1000 but does not depict the low-side MOSFET 4006 and the drive circuit 4012 that are shown in FIG. 1(A). The second gate electrode control circuit 1000 of FIG. 2(A) is disposed in the driver 4003 of FIG. 40.

In FIG. 2(A), the second gate electrode control circuit 1000 has a positive voltage regulator 2000, a negative voltage regulator 2001, a level shifter 2003, a selecting circuit 2002, and a second gate electrode drive control circuit 2004. The positive voltage regulator 2000 generates a positive voltage Vpos positive in polarity relative to the ground voltage PGND, and the negative voltage regulator 2001 generates a negative voltage Vneg negative in polarity relative to the ground voltage PGND. The generated positive voltage Vpos and negative voltage Vneg are supplied to the level shifter 2003 and to the selecting circuit 2002.

The second gate electrode drive control circuit 2004 receives the drive signal GL output from the drive circuit 4012 (FIG. 40), generates a control signal synchronizing with the drive signal GL, and supplies the generated control signal to the level shifter 2003. Receiving the generated control signal from the second gate electrode drive control circuit 2004, the level shifter 2003 shifts the high-voltage level and the low-voltage level of the control signal to a voltage level matching the positive voltage Vpos and a voltage level matching the negative voltage Vneg, respectively, and supplies the control signal with shifted voltage levels to the selecting circuit 2002.

According to the voltage of the supplied control signal (high-voltage level/low-voltage level), the selecting circuit 2002 selects either the positive voltage Vpos or negative voltage Vneg, and outputs a selected voltage (positive voltage Vpos or negative voltage Vneg) as the second gate control signal UL, to the terminal T14. As shown in FIG. 1(A), the terminal T14 is connected to the second gate electrode G2 of the low-side MOSFET 4006. The control signal supplied from the level shifter 2003 to the selecting circuit 2002 synchronizes with the drive signal GL output from the drive circuit 4012. Hence, the voltage of the second gate control signal UL supplied to the second gate electrode G2 of the low-side MOSFET 4006 synchronizes with the voltage of the drive signal GL that switches on and off the low-side MOSFET 4006, thus matching the negative voltage Vneg or positive voltage Vpos.

FIG. 2(B) depicts a circuit configuration example of the selecting circuit 2002, the level shifter 2003, and the second gate electrode drive control circuit 2004. The second gate electrode drive control circuit 2004 has three inverters connected in parallel between the supply voltage VCIN node and the ground voltage CGND node, which inverters are CMOS type inverters composed of p-channel type MOSFETs 2009, 2008, and 2007 and n-channel type MOSFETs 2015, 2014, and 2013, respectively. The inverters are cascaded such that the input end of each of the second and third inverters is connected to the output end of each of the first and second inverters. The first inverter (composed of the p-channel type MOSFET 2009 and the n-channel type MOSFET 2015) is supplied with the drive signal GL from the drive circuit 4012 (FIG. 40), and an output signal from the third inverter is supplied to the level shifter 2003. Hence, the second gate electrode drive control circuit 2004 of FIG. 2(B) supplies a signal created by reversing the phase of the drive signal GL as a control signal, to the level shifter 2003.

The level shifter 2003 has an n-channel type MOSFET 2012 that receives the control signal from the second gate electrode drive control circuit 2004, and a load element 2016. The drain of the n-channel type MOSFET 2012 is connected to the positive voltage Vpos node via the load element 2016. In the example of FIG. 2(B), the source of the n-channel type MOSFET 2012 is connected to the ground voltage CGND node. As a result, a control signal that shifts in voltage between the positive voltage Vpos and the ground voltage CGND is output from a connection node between the load element 2016 and the n-channel type MOSFET 2012, which means that the control signal shifting in voltage is output from the level shifter 2003. In FIG. 2(B), the source of the n-channel type MOSFET 2012 is connected to the ground voltage CGND node. The source, however, may be connected to the negative voltage Vneg node.

The selecting circuit 2002 has two inverters connected in parallel between the positive voltage Vpos node and the negative voltage Vneg node, which inverters are CMOS type inverters composed of n-channel type MOSFETs 2011 and 2010 and p-channel type MOSFETs 2006 and 2005, respectively. The inverters are cascaded such that the input end of the second inverter is connected to the output end of the first inverter. The input end of the first inverter (composed of the n-channel type MOSFET 2011 and the p-channel type MOSFET 2006) is supplied with the control signal from the level shifter 2003, and the output end of the second inverter (composed of the n-channel type MOSFET 2010 and the p-channel type MOSFET 2005) is connected to the control terminal T14. Each inverter in the selecting circuit 2002 operates with the positive voltage Vpos and negative voltage Vneg serving as supply voltages. Hence, the second inverter selects either the positive voltage Vpos or negative voltage Vneg according to the control signal from the level shifter 2003 and outputs the selected voltage to the control terminal T14.

Various configurations of the positive voltage regulator 2000 and the negative voltage regulator 2001 are possible. For example, the circuits shown in FIGS. 1(C) and 1(D) may be adopted as configurations of the positive voltage regulator 2000 and the negative voltage regulator 2001.

FIGS. 3(A) to 3(D) are operation waveform charts of the semiconductor integrated circuit device 4002 having the second gate electrode control circuit 1000 of FIGS. 2(A) and 2(B). The operation of the semiconductor integrated circuit device 4002 according to the second embodiment will then be described, referring to FIGS. 1(A), 2(A), FIGS. 3(A) to 3(D), and FIG. 40.

In FIGS. 3(A) to 3(D), the horizontal axis and the vertical axis represent time and voltage, respectively, and a period (a) represents a period during which the high-side MOSFET 4005 is on and the low-side MOSFET 4006 is off while a period (b) represents a period during which the high-side MOSFET 4005 is off and the low-side MOSFET 4006 is on. As described above referring to FIGS. 40 and 41, the high-side MOSFET 4005 and the low-side MOSFET 4006 are switched on and off complementally by the drive signals GH and GL.

Figure 2:
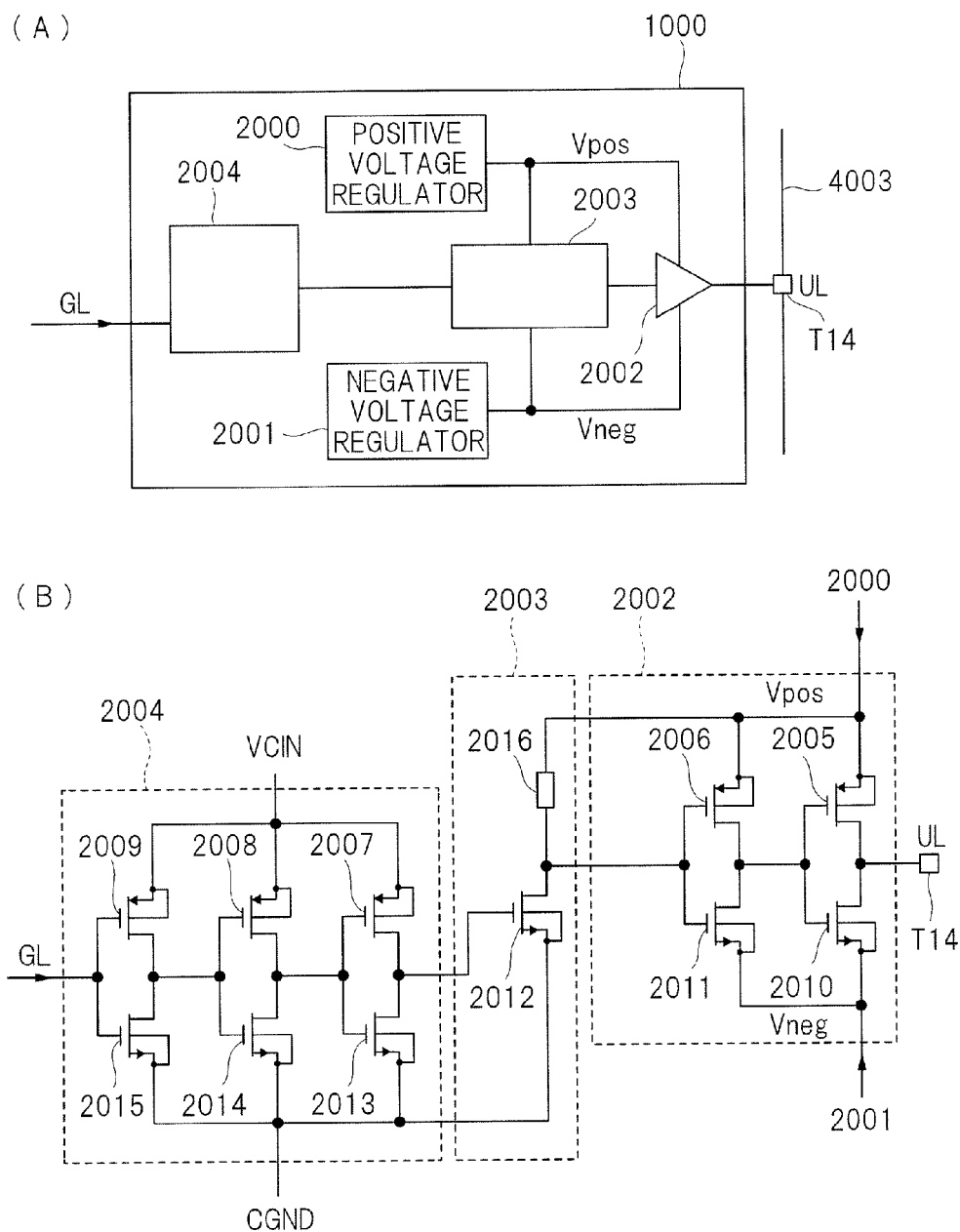
Figure 3:
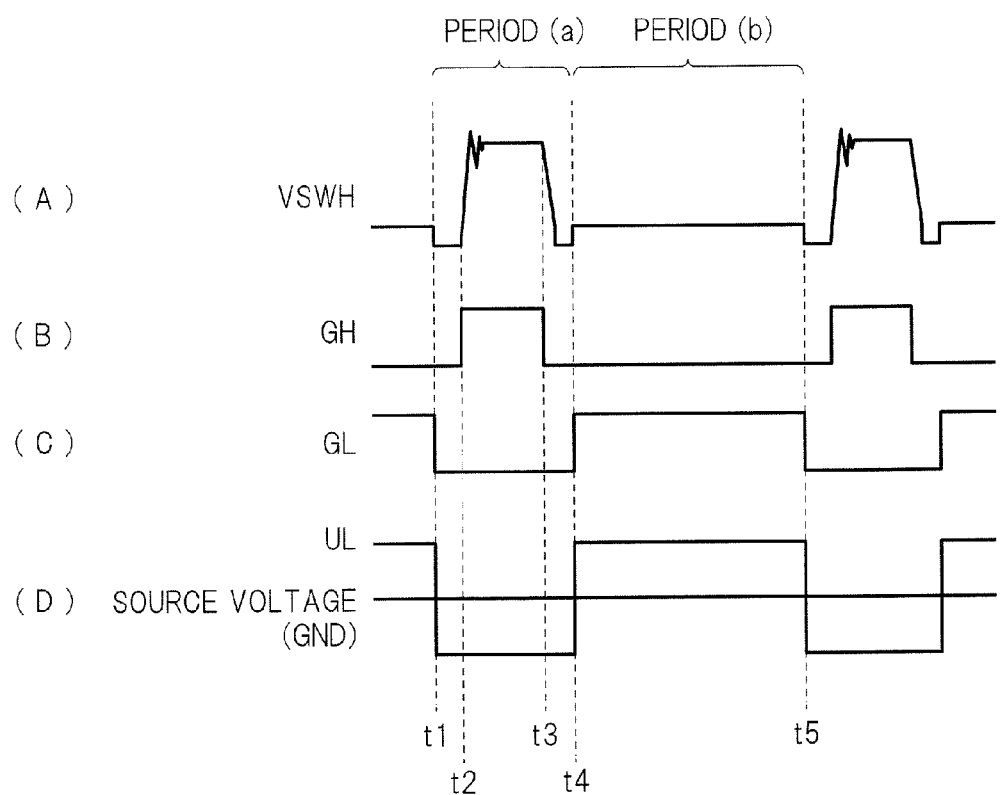

FIG. 3(A) depicts the waveform of the output voltage VSWH at the output terminal T1 of the semiconductor integrated circuit device 4002, FIG. 3(B) depicts the waveform of the drive signal GH from the drive circuit 4011 (FIG. 40), and FIG. 3(C) depicts the waveform of the drive signal GL from the drive circuit 4012 (FIG. 40). FIG. 3(D) depicts the waveform of the second gate control signal UL output from the second gate electrode control circuit 1000 of FIG. 2(A).

It is understood from the description of FIGS. 2(A) and 2(B) that the voltage of the second gate control signal UL synchronizes with the voltage of the drive signal GL, thus shifting between the positive voltage Vpos and the negative voltage Vneg. The source S of the low-side MOSFET 4006 is connected to the voltage terminal T2 whose potential is the ground voltage (FIG. 1(A) and FIG. 40). The voltage of the second gate control signal UL, therefore, matches the positive voltage (positive voltage Vpos) or negative voltage (negative voltage Vneg) positive or negative in polarity relative to a voltage at the source S (source voltage (GND)) of the low-side MOSFET 4006 serving as a reference voltage. According to the second embodiment, as indicated in FIG. 2(B), when the drive signal GL supplied to the first gate electrode G1 of the low-side MOSFET 4006 shifts to a high-voltage level signal, the second gate electrode control circuit 1000 outputs the positive voltage Vpos as the second gate control signal UL, in synchronization with the voltage level shift of the drive signal GL. When the drive signal GL shifts to a low-voltage level signal, the second gate electrode control circuit 1000 outputs the negative voltage Vneg as the second gate control signal UL, in synchronization with the voltage level shift of the drive signal GL.

At time t1, the drive signal GL output from the drive circuit 4012 changes in voltage level from a high-voltage level to a low-voltage level. Because this drive signal GL is supplied to the first gate electrode G1 of the low-side MOSFET 4006, the low-side MOSFET 4006 shifts from its on-state to off-state. In response to the shift of the drive signal GL to its low-voltage level, the voltage of the second gate control signal UL output from the second gate electrode control circuit 1000 shifts to the negative voltage Vneg at time t1. Because the second gate control signal UL is supplied to the second gate electrode G2 of the low-side MOSFET 4006, the shift of the second gate control signal UL to the negative voltage Vneg results in a reduction in the first gate-drain capacitance Crss at the low-side MOSFET 4006. As a result, the low-side MOSFET 4006 shifts from its on-state to off-state more quickly, thus shortening its on-off shift time.

To prevent the high-side MOSFET 4005 and low-side MOSFET 4006 from switching on simultaneously, the drive signal GH output from the drive circuit 4011 changes in voltage level from a high-voltage level to a low-voltage level at time t2 after an elapse of a given time (dead time period) from time t1. Because the drive signal GH is supplied to the first gate electrode G1 of the high-side MOSFET 4005, the high-side MOSFET 4005 shifts from its off-state to on-state. This raises the output voltage VSWH at the output terminal T1.

Although both high-side MOSFET 4005 and low-side MOSFET 4006 are off during the dead time period (between time t1 and time t2), the voltage VSWH at the output terminal T14 drops. This is partly caused by switching loss that arises in a period during which the low-side MOSFET 4006 shifts from its on-state to off-state. According to the second embodiment, the on-off shift period can be shortened, so that the switching loss can be reduced.

Subsequently, at time t3, the drive signal GH at its high-voltage level shifts to a low-voltage level. As a result, the high-side MOSFET 4005 shifts from its on-state to off-state. At time t4 after an elapse of the time equivalent to the dead time period from time t3, the drive signal GL at its low-voltage level shifts to a high-voltage level. This voltage level shift of the drive signal GL causes the low-side MOSFET 4006 to shift from its off-state to on-state and also causes the second gate electrode control circuit 1000 to shift the voltage of the second gate electrode control signal UL output from the second gate electrode control circuit 1000 to the positive voltage Vpos.

At this point, because the high-side MOSFET 4005 is off while the low-side MOSFET 4006 is on, the output voltage VSWH at the output terminal T14 drops. When the high-voltage level drive signal GL keeps the low-side MOSFET 4006 on, the second gate control signal UL having the positive voltage Vpos is supplied to the second gate electrode G2 of the low-side MOSFET 4006. This reduces the on-resistance of the low-side MOSFET 4006, thereby reduces the conduction loss of the low-side MOSFET 4006.

At time t5, the drive signal GL at its high-voltage level shifts to a low-voltage level again. Afterward, the above operations at time t1 to t4 are repeated.

In the second embodiment, when the low-side MOSFET 4006 is switched on by the drive signal GL supplied to the first gate electrode G1, the positive voltage Vpos is supplied from the second gate electrode control circuit 1000 that operates according to the drive signal GL, to the second gate electrode G2. When the low-side MOSFET 4006 is switched off by the drive signal GL supplied to the first gate electrode G1, the negative voltage Vneg is supplied from the second gate electrode control circuit 1000 that operates according to the drive signal GL, to the second gate electrode G2. Hence, when the low-side MOSFET 4006 is switched on, the conduction loss caused by the on-resistance of the MOSFET is reduced. When the low-side MOSFET 4006 is switched between its on-state and off-state (on-state and off-state), the switching loss is reduced.

Figure 4:
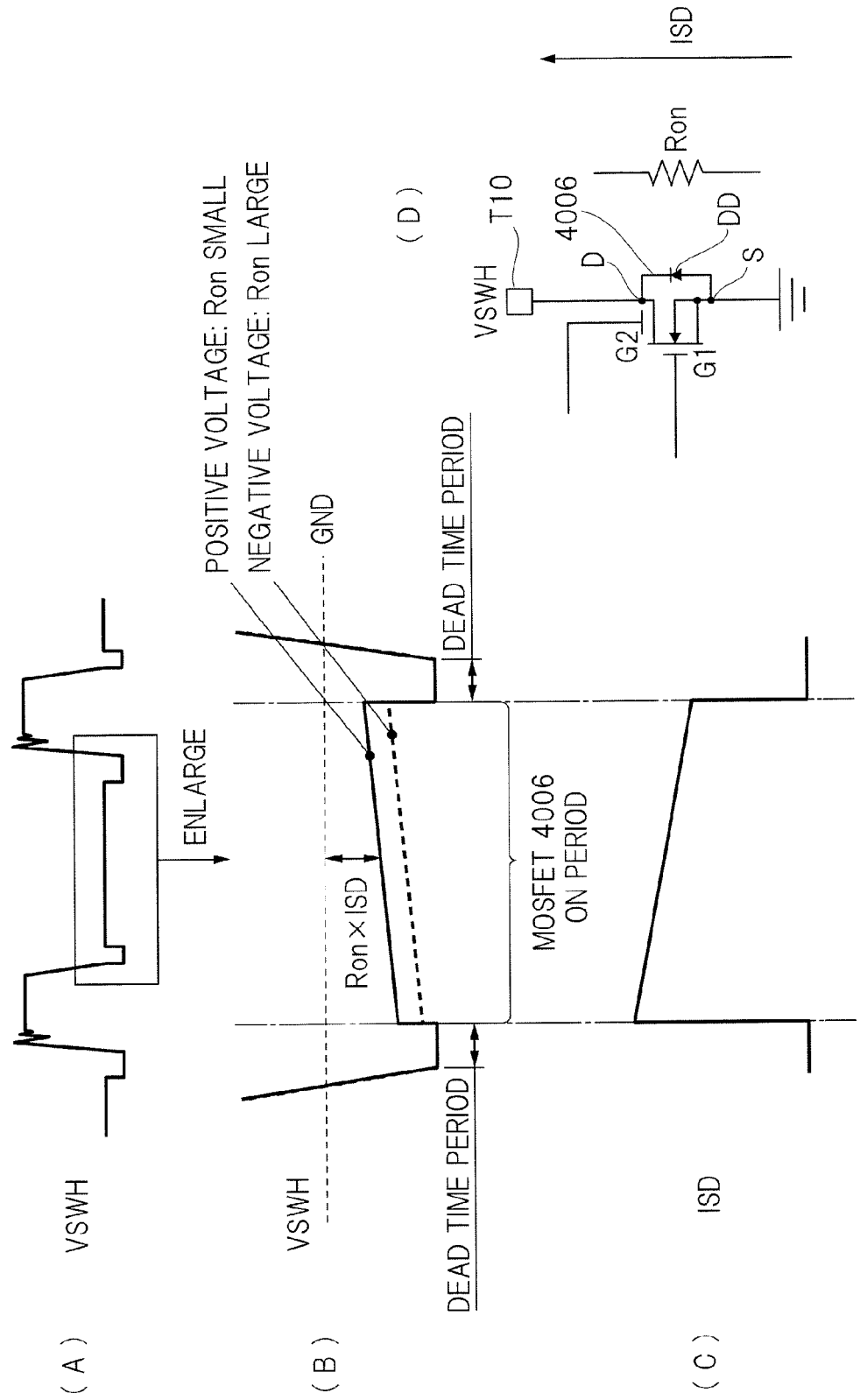

FIGS. 4(A) and 4(D) are explanatory diagrams of a reduction in the conduction loss. FIG. 4(D) depicts the circuit of the low-side MOSFET 4006. The low-side MOSFET 4006 has its source S connected to the ground voltage PGND (GND) node and its drain D connected to the control terminal T14. In FIG. 4(D), Ron denotes the on-resistance of the MOSFET 4006 that results when it is on, and ISD denotes a source-drain current flowing through the MOSFET 4006 in its on-state. It is assumed that when the low-side MOSFET 4006 is switched on, a current is supplied from the ground voltage node to the one end of the coil element 4008 (FIG. 40) via the low-side MOSFET 4006. In FIG. 4(D), therefore, the supplied current is not indicated as the drain current IDS but as the source-drain current ISD.

FIG. 4(A), similar to FIG. 3(A), depicts the waveform of the output voltage VSWH at the output terminal T1. FIG. 4(B) is an enlarged view of FIG. 4(A), showing an enlarged view of the waveform of the output voltage VSWH in a period during which the low-side MOSFET 4006 remains on. FIG. 4(C) depicts the waveform of the source-drain current ISD in the period during which the low-side MOSFET 4006 remains on.

In FIG. 4(B), a broken line indicates the waveform of the output voltage VSWH that results when a negative voltage is applied to the second gate electrode G2 of the low-side MOSFET 4006, and a continuous line indicates the waveform of the output voltage VSWH that results when a positive voltage is applied to the second gate electrode G2 of the low-side MOSFET 4006. Applying a negative voltage to the second gate electrode G2 increases the on-resistance. In contrast, according to the second embodiment, applying a positive voltage to the second gate electrode G2 reduces the on-resistance. It is known that an on-resistance voltage is given as the product of a resistance (Ron) and a current (source-drain current ISD). By reducing the on-resistance, therefore, the conduction loss is reduced. Reducing the on-resistance also prevents a case where the output voltage VSWH drops excessively when the low-side MOSFET is switched on.

(Third Embodiment)

Figure 5:
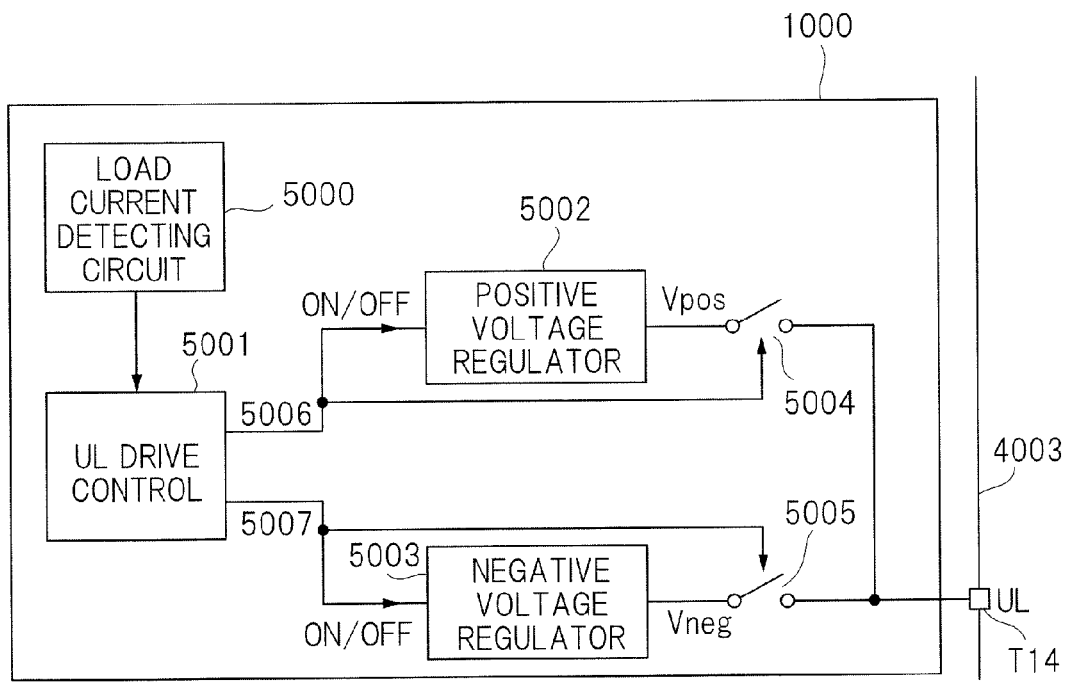

FIG. 5 is a block diagram showing a configuration of the second gate electrode control circuit 1000 in the semiconductor integrated circuit device 4002 according to a third embodiment. To the third embodiment, knowledge based on the study by the inventor described in the second embodiment is applied. The ratios of the "conduction loss" and "switching loss" of the semiconductor integrated circuit device vary depending on a load such that the ratio of the "conduction loss" becomes higher as the load becomes heavier. Based on this knowledge, a loss with a high ratio is reduced so that the total loss of the semiconductor integrated circuit device is reduced efficiently.

Figure 1:
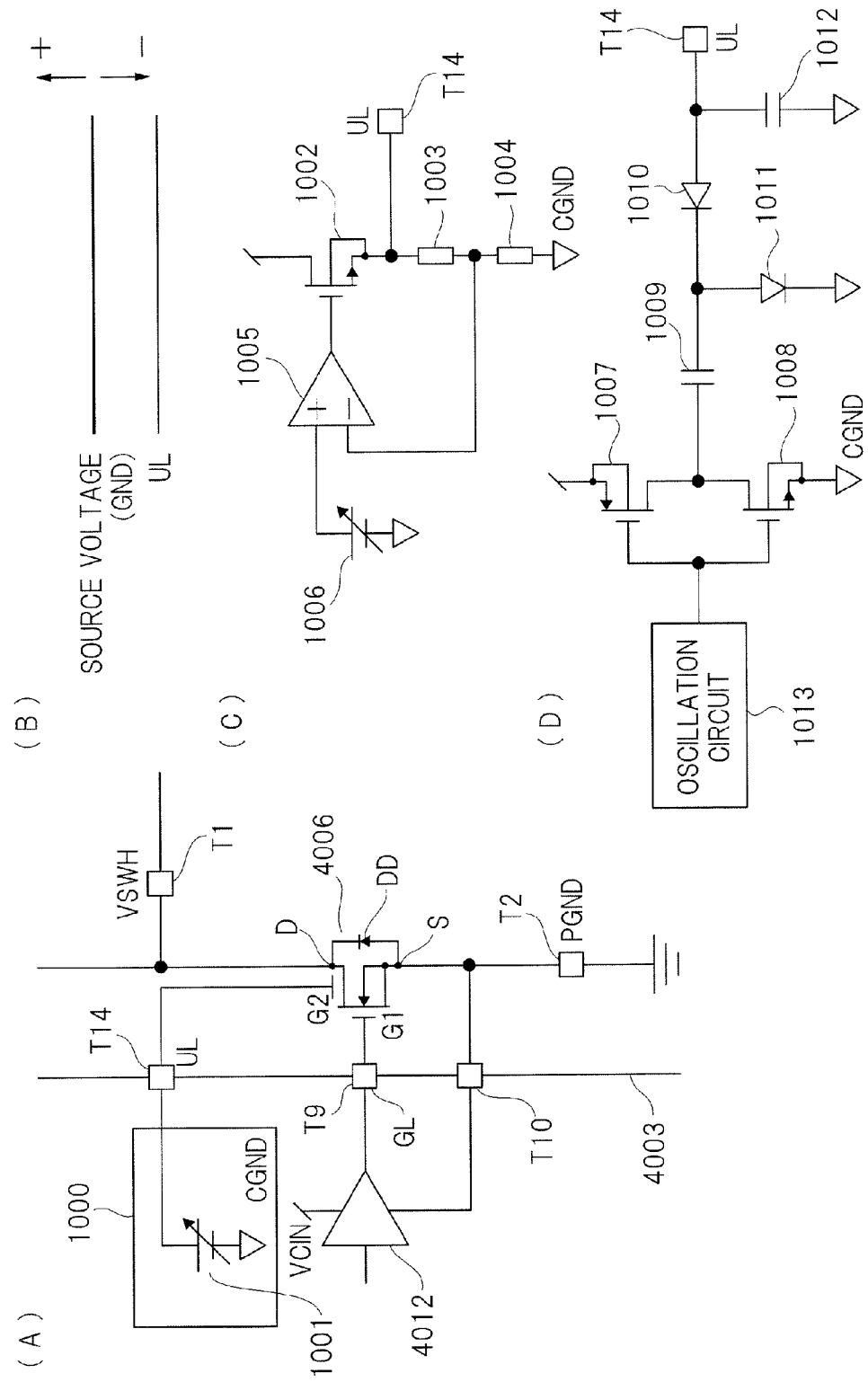

In the third embodiment, in the same manner as in the first and second embodiments, the driver 4003 (FIG. 40) has the second gate electrode control circuit 1000 and the control terminal T14. In the same manner as in the second embodiment, the control terminal T14 is connected to the second gate electrode G2 of the low-side MOSFET 4006 (FIGS. 1 and 40). Other components and operations of the driver 4003 are the same as those described in FIG. 40 and are therefore omitted in further description.

In FIG. 5, the second gate electrode control circuit 1000 has a load current detecting circuit 5000, a second gate electrode drive control circuit 5001, a positive voltage regulator 5002, a negative voltage regulator 5003, and switches 5004 and 5005. In the same manner as in the second embodiment, the second gate electrode control circuit 1000 generates the second gate electrode control signal UL having a positive voltage or negative voltage positive or negative in polarity relative to the ground voltage GND as a reference voltage, and supplies the second gate electrode control signal UL to the second gate electrode G2 of the low-side MOSFET 4006 via the control terminal T14.

The positive voltage regulator 5002 receives a control signal 5006 output from the second gate electrode drive control circuit 5001, as an on/off signal that turns on and off the positive voltage regulator 5002. When the control signal 5006 instructs to turn on the positive voltage regulator 5002, the positive voltage regulator 5002 generates the positive voltage Vpos positive in polarity relative to the ground voltage. When the control signal 5006 instructs to turn off the positive voltage regulator 5002, the negative voltage regulator 5002 is turned off.

Similar to the positive voltage regulator 5002, the negative voltage regulator 5003 receives a control signal 5007 output from the second gate electrode drive control circuit 5001, as an on/off signal that turns on and off the negative voltage regulator 5003. When the control signal 5007 instructs to turn on the negative voltage regulator 5003, the negative voltage regulator 5003 generates the negative voltage Vneg negative in polarity relative to the ground voltage. When the control signal 5007 instructs to turn off the negative voltage regulator 5003, the negative voltage regulator 5003 is turned off.

The switch 5004 is switched on and off according to the control signal 5006. When the switch 5004 is switched on, the positive voltage Vpos generated by the positive voltage regulator 5002 is supplied to the control terminal T14. The switching on/off of the switch 5004 synchronizes with turning on/off of the positive voltage regulator 5002. This means that when the positive voltage regulator 5002 is turned on to operate by the control signal 5006, the switch 5004 is in its on-state and that when the positive voltage regulator 5002 is turned off to stop operating by the control signal 5006, the switch 5004 is in its off-state.

Similar to the switch 5004, the switch 5005 is switched on and off according to the control signal 5007. When the switch 5005 is switched on, the negative voltage Vneg generated by the negative voltage regulator 5003 is supplied to the control terminal T14. The switching on/off of the switch 5005 synchronizes with turning on/off of the negative voltage regulator 5003. This means that when the negative voltage regulator 5003 is turned on to operate by the control signal 5007, the switch 5005 is in its on-state and that when the negative voltage regulator 5003 is turned off to stop operating by the control signal 5007, the switch 5005 is in its off-state.

The second gate electrode drive control circuit 5001 receives a detection signal from the load current detecting circuit 5000, and generates the control signal 5006 and the control signal 5007 according to, for example, the voltage of the detection signal, thereby turns on or off the positive voltage regulator 5002 or negative voltage operator 5003. The second gate electrode drive control circuit 5001 also switches on the switch (switch 5004 or switch 5005) corresponding to the regulator turned on (positive regulator 5002 or negative regulator 5003). Through this process, according to the detection signal from the load current detecting circuit 5000, the second gate electrode control circuit 1000 outputs the second gate electrode control signal UL having the positive voltage Vpos or negative voltage Vneg, to the terminal T14.

Figure 6:
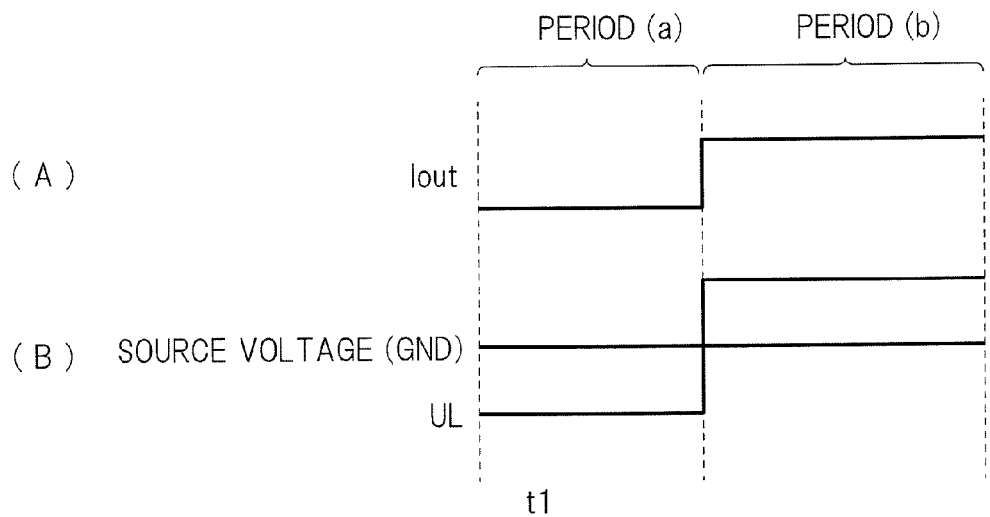

FIGS. 6(A) and 6(B) are waveform charts showing the operation of the second gate electrode control circuit 1000 of FIG. 5. In FIGS. 6(A) and 6(B), the horizontal axis represents time. FIG. 6(A) depicts the waveform of the load current Iout flowing through the output terminal T1 of the semiconductor integrated circuit device 4002, and the vertical axis of FIG. 6(A) represents current value. FIG. 6(B) depicts the waveform of the second gate electrode control signal UL output from the second gate electrode control circuit 1000 of FIG. 5, and the vertical axis of FIG. 6(B) represents voltage values.

As described referring to FIG. 38, the value of the load current Iout changes depending on whether the load 4001 connected to the output terminal T13 of the power supply system 4000 (FIG. 40) is heavy or light. To put it another way, the value of the load current Iout grows larger as the load becomes heavier.

Receiving the load current Iout flowing through the output terminal T1, the load current detecting circuit 5000 of FIG. 5 generates a detection signal indicating whether the value of the load current Iout exceeds a given current value (current i2 in FIG. 38) and supplies the generated detection signal to the second gate electrode drive control circuit 5001 (the operation of the load current detecting circuit 5000 is not limited to this particular action). When the detection signal indicates that the value of the load current Iout exceeds the given current value, the second gate electrode drive control circuit 5001 turns the positive regulator 5002 on and switches the switch 5004 on, while turns the negative regulator 5003 off and the switches the switch 5005 off. Hence, when the load current Iout exceeds the given current value, the second gate control signal UL having the positive voltage Vpos is supplied to the second gate electrode G2 of the low-side MOSFET 4005.

When the value of the load current Iout is equal to or smaller than the given current value, the second gate electrode drive control circuit 5001 turns the positive regulator 5002 off and switches the switch 5004 off, while turns the negative regulator 5003 on and the switches the switch 5005 on. Hence, when the load current Iout is equal to or smaller than the given current value, the second gate control signal UL having the negative voltage Vneg is supplied to the second gate electrode G2 of the low-side MOSFET 4005.

The switches 5004 and 5005, therefore, can be regarded as selecting circuits that output the positive voltage Vpos and the negative voltage Vneg as the second gate control signals UL, respectively, according to the detection signal from the load current detecting circuit 5000.

The third embodiment will be described referring to FIGS. 6(A) and 6(B). In a period (a), the value of the load current Iout remains equal to or smaller than the given current value (e.g., current i2 in FIG. 38). For this reason, the second gate control signal UL output from the second gate electrode control circuit 1000 has the negative voltage Vneg. In a period (b), in contrast, the value of the load current Iout remains larger than the given current value. For this reason, the second gate control signal UL output from the second gate electrode control circuit 1000 has the positive voltage Vpos.

The load current Iout is low when the load is light, and is high when the load is heavy. According the third embodiment, when the load is light (period (a)), the negative voltage Vneg is supplied to the second gate electrode G2 of the low-side MOSFET, which reduces the switching loss. When the load is heavy (period (b)), the positive voltage Vpos is supplied to the second gate electrode G2 of the low-side MOSFET, in which case, therefore, the conduction loss of the low-side MOSFET is reduced. As described referring to FIG. 38, the ratio of the conduction loss is high when the load is heavy while the ratio of the switching loss is high when the load is light. According to the third embodiment, when the load is heavy, the conduction loss at its high ratio in the heavy load case is reduced, and when the load is light, the switching loss at its high ratio in the light load case is reduced. In this manner, proper loss reduction can be performed according to the condition of the load.

Various configurations of the load current detecting circuit 5000 are possible.

(Fourth Embodiment)

Figure 7:
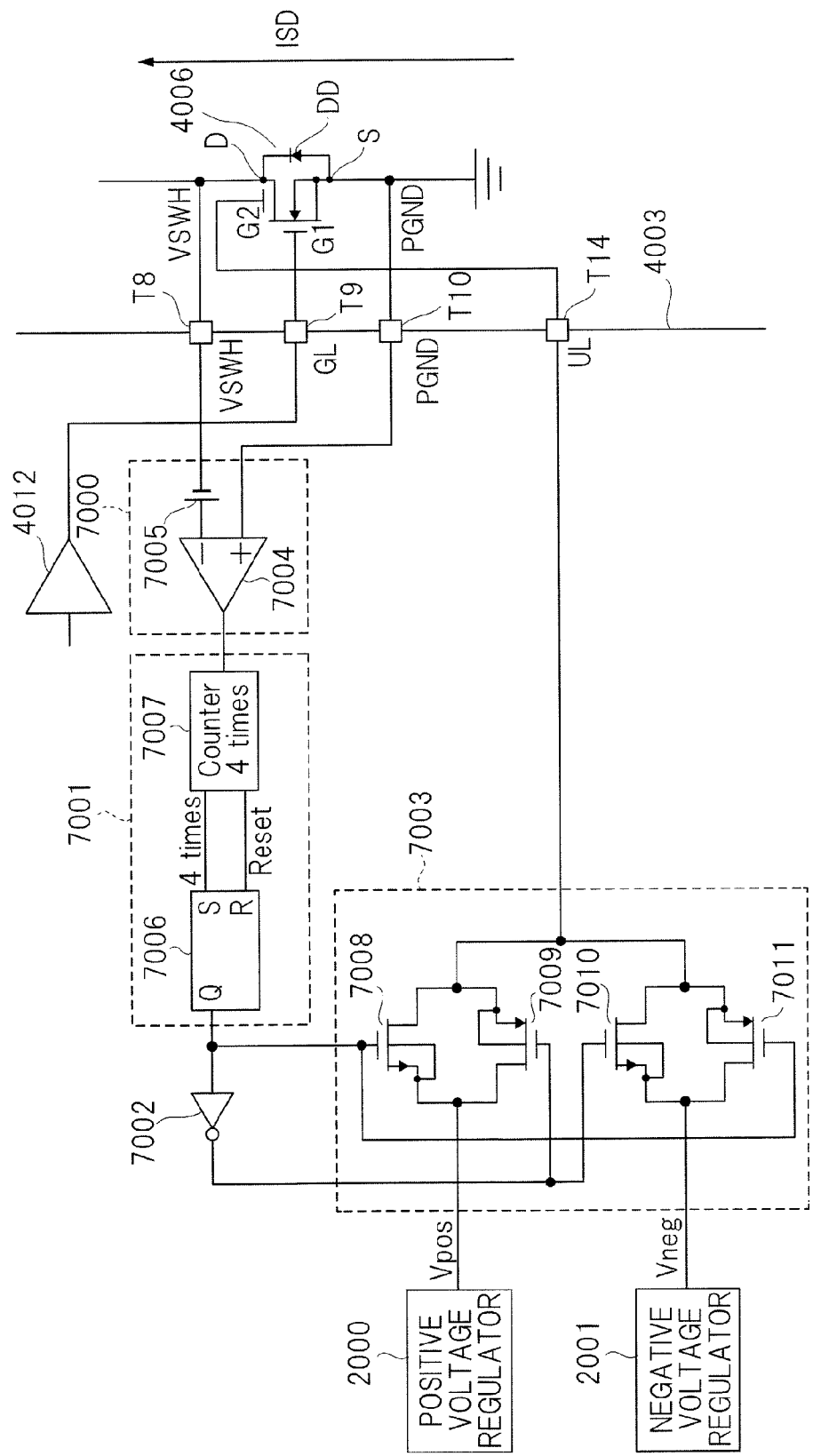

FIG. 7 is a block diagram showing a configuration of the semiconductor integrated circuit device 4002 according to a fourth embodiment. To the fourth embodiment, knowledge based on the study by the inventor described in the second embodiment is applied.

According to the fourth embodiment, the driver 4003 described referring to FIG. 40 further includes the control terminal T14, a load current detecting comparator 7000, a four-cycle detecting circuit 7001, an analog switch 7003, an inverter 7002, the positive regulator 2000, and the negative regulator 2001. The positive regulator 2000 and the negative regulator 2001 have been described in FIG. 2(A) and are therefore omitted in further description.

As shown in FIG. 40, the driver 4003 has multiple terminals. FIG. 7 depicts the terminals described in FIG. 40 (voltage terminals T8 and T10 and output terminal T9) out of the multiple terminals. As described in the above multiple embodiments, the driver 4003 has the control terminal T14. The first gate electrode G1 of the low-side MOSFET 4006 is connected to the output terminal T9, through which the drive signal GL from the drive circuit 4012 is supplied to the first gate electrode G1. The voltage terminal T10 is connected to the source S of the low-side MOSFET 4006 and to the ground voltage PGND node. The voltage terminal T8 is connected to the drain D of the low-side MOSFET 4006.

In the fourth embodiment, the voltage terminals T8 and T10 are connected to the load current detecting comparator 7000. As shown in FIG. 40, the voltage terminal T8 is connected also to the output terminal T1 of the semiconductor integrated circuit device 4002. The voltage VSWH at the voltage terminal T8, therefore, changes depending on an output signal from the semiconductor integrated circuit device 4002.

The load current detecting comparator 7000 includes a comparator 7004 having a reverse input terminal (−) and a non-reverse input terminal (+), and an offset circuit 7005. The non-reverse input terminal (+) of the comparator 7004 is connected to the voltage terminal T10 and the reverse input terminal (−) of the same is connected to the voltage terminal T8 via the off-set circuit 7005. Because various configurations of the offset circuit 7005 are possible, the offset circuit 7005 is indicated by a battery symbol in FIG. 7. When the low-side MOSFET 4006 is off, the load current detecting comparator 7000 compares the voltage PGND at the voltage terminal T10 with the voltage VSWH at the voltage terminal T8.

When the low-side MOSFET 4006 is switched on by the drive signal GL supplied from the drive circuit 4012 to the first gate electrode G1 via the output terminal T9, the current ISD is supplied from the ground voltage PGND node to the one end of the coil element 4018 (FIG. 40). This flow of the current ISD causes a voltage drop, thus causing the voltage VSWH at the voltage terminal T8 to drop. As a result, a voltage given by adding an offset voltage created by the off-set circuit 7005 to the dropped voltage (VSWH) at the voltage terminal T8 (hereinafter "voltage VSWH+offset) is supplied to the reverse input terminal (−) of the comparator 7004. Meanwhile, the ground voltage PGND (GND) is supplied to the non-reverse input terminal (+) of the comparator 7004. The comparator 7004 thus determines whether the voltage VSWH+offset is high or low relative to the ground voltage PGND, generates an output signal having a high-level voltage or low-level voltage as the result of the determination, and sends out the generated output signal as the output signal from the load current detecting comparator 7000.

The output signal from the load current detecting comparator 7000 is supplied to the four-cycle detecting circuit 7001. The four-cycle detecting circuit 7001 has a counter 7007 and an RS-type flip-flop 7006. The counter 7007 counts output signals from the load current detecting comparator 7000 at a given cycle. The load current detecting comparator 7000 generates a high-voltage level output signal when the voltage VSWH+offset is higher than the ground voltage PGND, and generates a low-voltage level output signal when the voltage VSWH+offset is lower than the ground voltage PGND. When output signals from the load current detecting comparator 7000 are high-voltage level signals in consecutive four or more cycles, the counter 7007 outputs a 4 times signal (which is denoted as 4 times in FIG. 7). When supplied with high-voltage level signals from the load current detecting comparator 7000 consecutively in less than four cycles, the counter 7007 outputs a Reset signal (which is denoted as Reset in FIG. 7).

The RS-type flip-flop 7006 of the four-cycle detecting circuit 7001 has a set terminal that receives the 4 times signal, and a reset terminal that receives the Reset signal. When supplied with the 4 times signal, therefore, the RS-type flip-flop 7006 outputs an output signal in its set state (e.g., high-voltage level state) from the output terminal Q of the flip-flop 7006. When supplied with the Reset signal, on the other hand, the RS-type flip-flop 7006 outputs an output signal in its reset state (e.g., low-voltage level state) from the output terminal Q of the flip-flop 7006. These output signals from the RS-type flip-flop 7006 are output signals from the four-cycle detecting circuit 7001.

The output signal from the four-cycle detecting circuit 7001 is used as a selection signal to the analog switch 7003. The analog switch 7003 has an n-channel type MOSFET 7008 and a p-channel type MOSFET 7009 having their respective source-drain paths connected in parallel with each other, and an n-channel type MOSFET 7010 and a p-channel type MOSFET 7011 having their respective source-drain paths connected in parallel with each other. The source-drain paths of the n-channel type MOSFET 7008 and p-channel type MOSFET 7009 are connected between the positive voltage regulator 2000 and the control terminal T14. The source-drain paths of the n-channel type MOSFET 7010 and p-channel type MOSFET 7011 are connected between the negative voltage regulator 2001 and the control terminal T14.

The output signal from the four-cycle detecting circuit 7001 is supplied to the gate electrode of the p-channel type MOSFET 7011 and to the gate electrode of the n-channel type MOSFET 7008. The output signal from the four-cycle detecting circuit 7001 is reversed in phase by the inverter 7002 and this phase-reversed output signal is supplied to the gate electrode of the p-channel type MOSFET 7009 and to the gate electrode of the n-channel type MOSFET 7010. Hence according to the output signal from the four-cycle detecting circuit 7001, a first analog switch composed of the n-channel type MOSFET 7008 and p-channel type MOSFET 7009 and a second analog switch composed of the n-channel type MOSFET 7010 and p-channel type MOSFET 7011 are switched on and off complementally. When the first analog switch is switched on, the positive voltage Vpos is supplied through the first analog switch to the control terminal T14. When the second analog switch is switched on, the negative voltage Vneg is supplied through the second analog switch to the control terminal T14.

Figure 8:
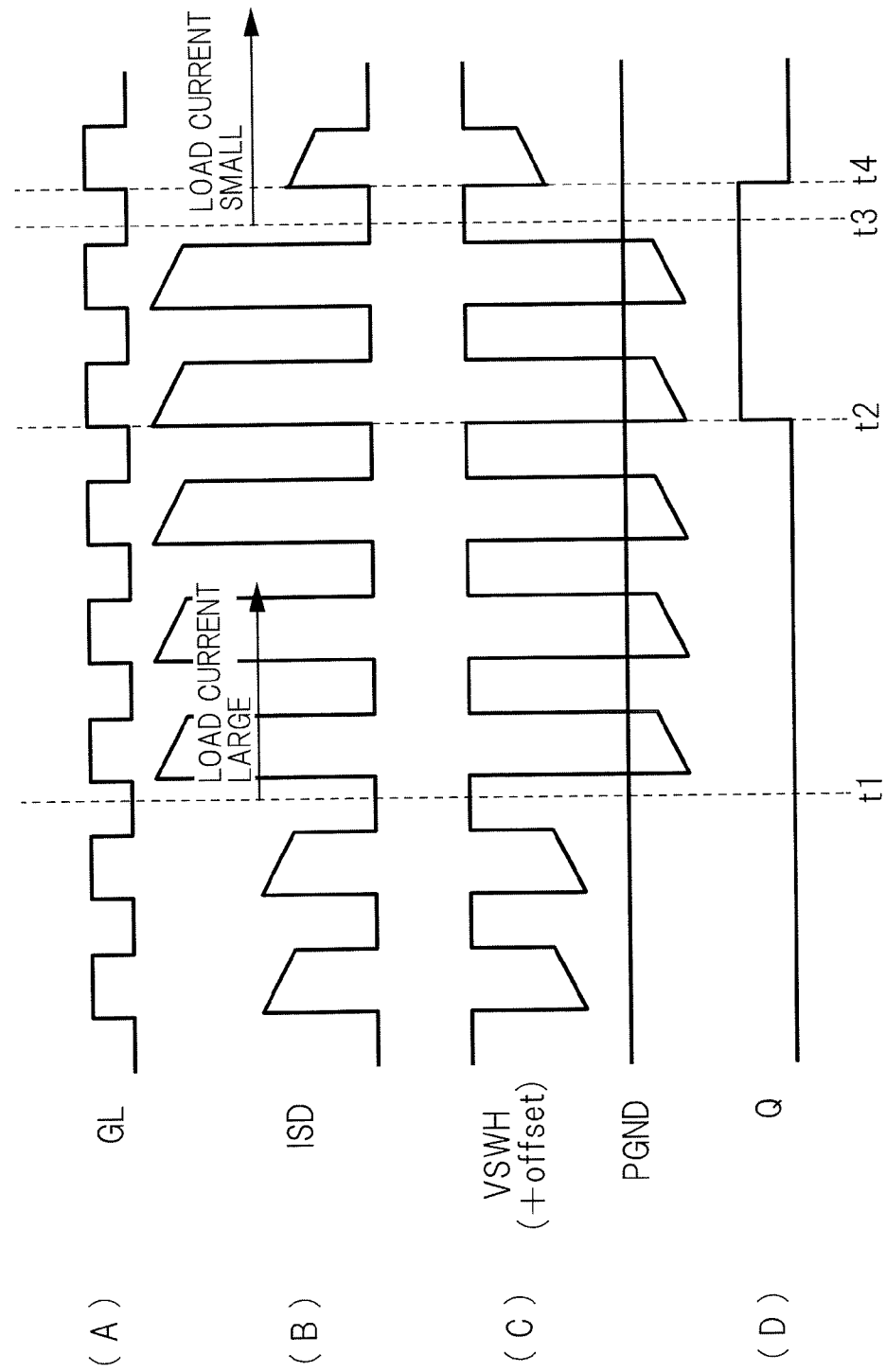

The operation of the semiconductor integrated circuit device 4002 according to the fourth embodiment will then be described, referring to operating waveforms shown in FIG. 8. The operation of the semiconductor integrated circuit device 4002 is summarized as follows. The load current detecting comparator 7000 detects the load current ISD to determine whether its value exceeds a given value. Based on a detection signal from the load current detecting comparator 7000, the four-cycle detecting circuit 7001 determines whether the value of the load current ISD exceeds the given value in consecutive four or more cycles. According to the result of this determination, the positive voltage Vpos or negative voltage Vneg is supplied to the second gate electrode G2 of the low-side MOSET 4006. As a result, the conduction loss is reduced when the load is heavy while the switching loss is reduced when the load is light.

FIGS. 8(A) to 8(D) are waveform charts showing the operation of the semiconductor integrated circuit device 4002 of FIG. 7. In FIGS. 8(A) to 8(D), the horizontal axis represents time. The vertical axes in FIGS. 8(A), 8(C), and 8(D) each represent voltage value, and the vertical axis in FIG. 8(B) represents current value.

FIG. 8(A) depicts the waveform of the drive signal GL supplied to the first gate electrode G1 of the low-side MOSFET 4006, and FIG. 8(B) depicts the waveform of the source-drain current ISD (load current) flowing through the low-side MOSFET 4006. As describe above, the value of the source-drain current ISD glows larger as the load becomes heavier.

FIG. 8(C) depicts waveforms supplied to the reverse input terminal (−) and non-reverse input terminal (+) of the comparator 7004, respectively, and FIG. 8(D) depicts an output signal from the four-cycle detecting circuit 7001 (output signal Q from the RS-type flip-flop 7006).

The drive signal GL output from the drive circuit 4012 goes high in voltage level cyclically, thus switching on the low-side MOSFET 4006 cyclically. When the low-side MOSFET 4006 is switched on, the source-drain current ISD is supplied as the load current, through the low-side MOSFET to the coil element 4008. The flow of the source-drain current ISD leads to a drop in the voltage VSWH at the voltage terminal T8 connected to the output terminal T1 (FIG. 40), and leads also to a drop in the voltage VSWH+offset given by adding the offset voltage offset to the voltage VSWH (VSWH (+offset) in FIG. 8).

In a time zone before time t1, the load is light and the value of the load current (source-drain current ISD) is therefore small. As a result, the voltage VSWH becomes higher than the ground voltage PGND, in which case the comparator 7004 supplies a low-voltage level detection signal to the four-cycle detecting circuit 7001. Because the output signal from the comparator 7004 is low in voltage level and therefore fails to be high in voltage level in consecutive four or more cycles, the counter 7007 does not generate the 4 time signal. As a result, the output signal Q from the RS-type flip-flop 7006 turns out to be a low-voltage level signal. This low-voltage level output signal Q switches the second analog switch (MOSFETS 7010 and 7011) on and switches the first analog switch (MOSFETS 7008 and 7009) off.

Hence, the second gate electrode control signal UL having the negative voltage Vneg is supplied to the second gate electrode G2 of the low-side MOSFET 4006. This means that when the load is light, the second gate electrode control signal UL having the negative voltage Vneg is supplied to the second gate electrode G2 of the low-side MOSFET 4006 to reduce the switching loss of the low-side MOSFET 4006.

At time t1, when the load increases in size, the value of the source-drain current ISD flowing through the low-side MOSFET 4006 increases. This causes the voltage VSWH at the voltage terminal T8 when the low-side MOSFET 4006 is on to drop below the voltage VSWH in the time zone before time t1. As a result, the voltage VSWH+offset at the reverse input terminal (−) of the comparator 7004 drops below the ground voltage PGND, in which case the comparator 7004 outputs a high-voltage level detection signal. As indicated by FIGS. 8(B) and 8(C), when the source-drain current ISD remains high in consecutive four cycles, the voltage VSWH+offset remains lower than the ground voltage PGND in consecutive four cycles. At the fourth cycle of these consecutive cycles, the comparator 7004 generates the 4 times signal. In response to this 4 times signal, the flip-flop 7006 is switched to its set state, in which case the output signal Q from the flip-flop 7006 goes high in voltage level (time t2).

The output signal Q at its high-voltage level switches on the first analog switch (MOSFETs 7008 and 7009). As a result, the positive voltage Vpos is supplied to the control terminal T14. In other words, the second gate electrode control signal UL having the positive voltage Vpos is supplied from the terminal T14 to the second gate electrode G2 of the low-side MOSFET 4006.

In this manner, when the load increases in size to raise the load current value, that is, the load glows heavier, the positive voltage Vpos is supplied to the second gate electrode G2 of the low-side MOSFET 4006, which reduces the conduction loss of the low-side MOSFET 4006.

At time t3, when the load reduces in size to become lighter, the load current value decreases, which leads to a drop in the voltage VSWH at the voltage terminal T8 when the low-side MOSFET 4006 is on. As a result, an output signal from the comparator 7004 goes low in voltage level, in which case the RS-type flip-flop 7006 is reset, thus producing the output signal Q that goes low in voltage level at time t4. Hence the second gate electrode control signal UL having the negative voltage Vneg is supplied to the second gate electrode G2 again, which reduces the switching loss of the low-side MOSFET 4006.

As described above, according to the fourth embodiment, a heavy load and a light load are detected. In the case of the heavy load, the second gate electrode control signal UL having the positive voltage Vpos is supplied to the second gate electrode G2 of the low-side MOSFET 4006 to reduce the conduction loss. In the case of the light load, the second gate electrode control signal UL having the negative voltage Vneg is supplied to the second gate electrode G2 of the low-side MOSFET 4006 to reduce the switching loss.

According to the fourth embodiment, when the load current is high in consecutive four or more cycles, the load is determined to be heavy. This method avoids a case where the load is determined to be heavy when the load current fluctuates sharply due to noises, etc. Consecutive four cycles are an example of the number of cycles for load current evaluation and the number of cycles is not limited to four. Obviously, the load current detecting comparator 7000, the four-cycle detecting circuit 7001, and the analog switch 7003 may be modified to have various configurations.

According to the above second embodiment, the voltage of the second gate electrode control signal UL supplied to the second gate electrode G2 of the low-side MOSFET 4006 is switched between the positive voltage Vpos and the negative voltage Vneg in synchronization with the drive signal GL supplied to the first gate electrode G1 of the low-side MOSFET 4006. In other words, the polarity of the voltage supplied to the second gate electrode G2 is switched in synchronization with switching on/off of the low-side MOSFET 4006. According to the third and fourth embodiments, the polarity of the voltage of the second gate electrode control signal UL supplied to the second gate electrode G2 of the low-side MOSFET 4006 is switched according to the load current.

FIGS. 9(A) to 9(F) are explanatory diagrams of the relation between a change in the second gate electrode control signal UL and the heavy load and light load cases in the third and fourth embodiments.

In FIGS. 9(A) to 9(E), the horizontal axes represent time. FIG. 9(A) depicts the waveform of the output current Iout at the output terminal T1 of the semiconductor integrated circuit device 4002. The output current Iout includes a current from the high-side MOSFET 4005 and a current (source-drain current ISD) from the low-side MOSFET. FIG. 9(B) depicts the waveform of the drive signal GH output from the drive circuit 4013 to the first gate electrode G1 of the high-side MOSFET 4005, and FIG. 9(C) depicts the waveform of the drive signal GL output from the drive circuit 4012 to the first gate electrode G1 of the low-side MOSFET 4006. FIG. 9(D) depicts the waveform of the output voltage (voltage) VSWH at the output terminal T1 (T8). FIG. 9(E) depicts a voltage at the source S of the low-side MOSFET 4006 and the waveform of the second gate electrode control signal UL supplied to the second gate electrode G2 of the low-side MOSFET 4006. Because the source S of the low-side MOSFET 4006 is connected to the ground voltage PGND node, the voltage at the source S matches the ground voltage (GND).

FIG. 9(F) is stacked bar graphs showing losses in the light load case and losses in the heavy load case.

Figure 9:
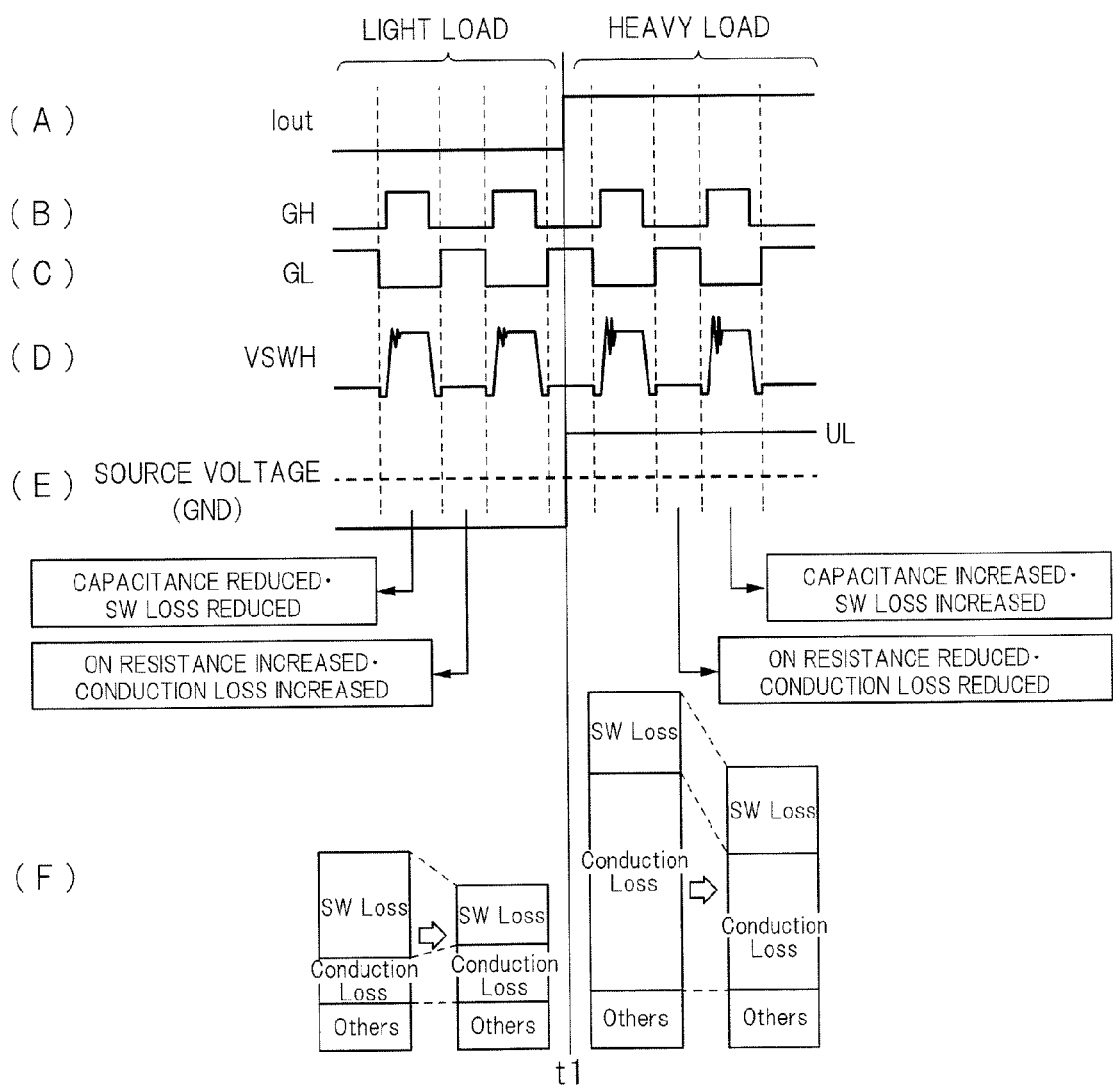

In FIG. 9, in a time zone before time t1 (left side in FIG. 9), the load is light and the value of the output current Iout is therefore small. This time zone is thus indicated as "light load" in FIG. 9. In contrast, in a time zone after time t1 (right side in FIG. 9), the load is heavy and the value of the output current Iout is therefore large. This time zone is thus indicated as "heavy load" in FIG. 9. As described above referring to FIG. 40, etc., the high-side MOSFET 4005 and low-side MOSFET are switched on and off alternately by the drive signals GH and GL, in response to which the value of the output voltage (voltage) VSWH at the output terminal T1 (terminal T8) changes.

According to the third and fourth embodiments, the polarity of the voltage of the second gate electrode control signal UL does not change in synchronization with switching on/off of the low-side MOSFET 4006 but changes according to the value of the load current (source-drain current ISD). The polarity of the voltage of the second gate electrode control signal UL (with respect to a voltage at the source S of the low-side MOSFET 4006 as a reference voltage) is determined to be negative in the light load case and to be positive in the heavy load case. As a result, according to the third and fourth embodiments, in a period during which the load is light and the low-side MOSFET 4006 is switched on and off several times, a negative voltage is supplied constantly to the second gate electrode G2, as indicated in FIG. 9(E). Likewise, in a period during which the load is heavy and the low-side MOSFET 4006 is switched on and off several times, a positive voltage is supplied constantly to the second gate electrode G2.

In the light load case, a negative voltage is supplied constantly to the second gate electrode G2 of the low-side MOSFET 4006, which reduces the first gate-drain capacitance Crss, thereby reduces the switching loss (which is noted as "capacitance reduction/SW loss reduction" in FIG. 9). However, supplying a negative voltage to the second gate electrode G2 may increase the on-resistance of the low-side MOSFET 4006 and therefore may increase the conduction loss (which is noted as "on-resistance increase/conduction loss increase" in FIG. 9).

However, as describe above referring to FIG. 38, the ratio of the switching loss is higher than the ratio of the conduction loss in the light load case. Based on this fact, as indicated in the time zone on the left to time t1 in FIG. 9(F), in the light load case, a negative voltage is supplied to the second gate electrode G2 to reduce the switching loss so that the overall loss in the light load case can be reduced. In FIG. 9(F), in the time zone in which the load is light (before time t1), a bar graph on the left side to an arrow represents the breakdown of losses that result when the second gate electrode G2 is connected to the source S of the low-side MOSFET 4006, while a bar graph on the right side to the arrow represents the breakdown of losses that result when, as described in the third and fourth embodiments, a negative voltage is supplied to the second gate electrode G2.

In the heavy load case, a positive voltage is supplied constantly to the second gate electrode G2 of the low-side MOSFET 4006, which reduces the on-resistance of the low-side MOSFET 4006, thereby reduces the conduction loss (which is noted as "on-resistance reduction/conduction loss reduction" in FIG. 9). However, supplying a positive voltage to the second gate electrode G2 may increase the first gate-drain capacitance Crss and therefore may increase the switching loss (which is noted as "capacitance increase/SW loss increase" in FIG. 9).

However, as describe above referring to FIG. 38, the ratio of the conduction loss is higher than the ratio of the switching loss in the heavy load case. Based on this fact, as indicated in the time zone on the right to time t1 in FIG. 9(F), in the heavy load case, a positive voltage is supplied to the second gate electrode G2 to reduce the conduction loss so that the overall loss in the heavy load case can be reduced. In FIG. 9(F), in the time zone in which the load is heavy (after time t1), a bar graph on the left side to an arrow represents the breakdown of losses that result when the second gate electrode G2 is connected to the source S of the low-side MOSFET 4006, while a bar graph on the right side to the arrow represents the breakdown of losses that result when, as described in the third and fourth embodiments, a positive voltage is supplied to the second gate electrode G2.

Figure 10:
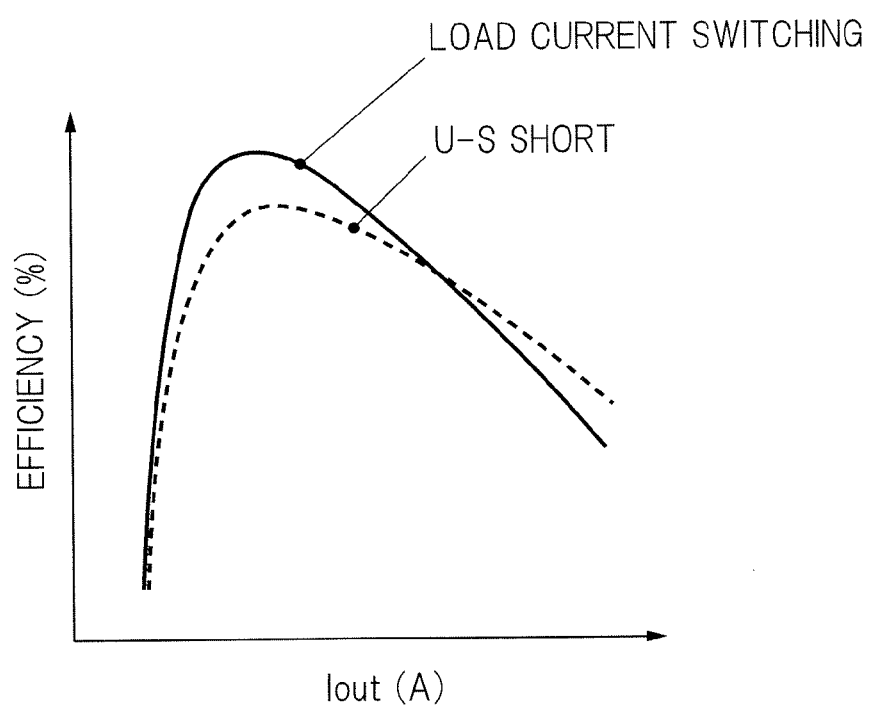
Figure 11:
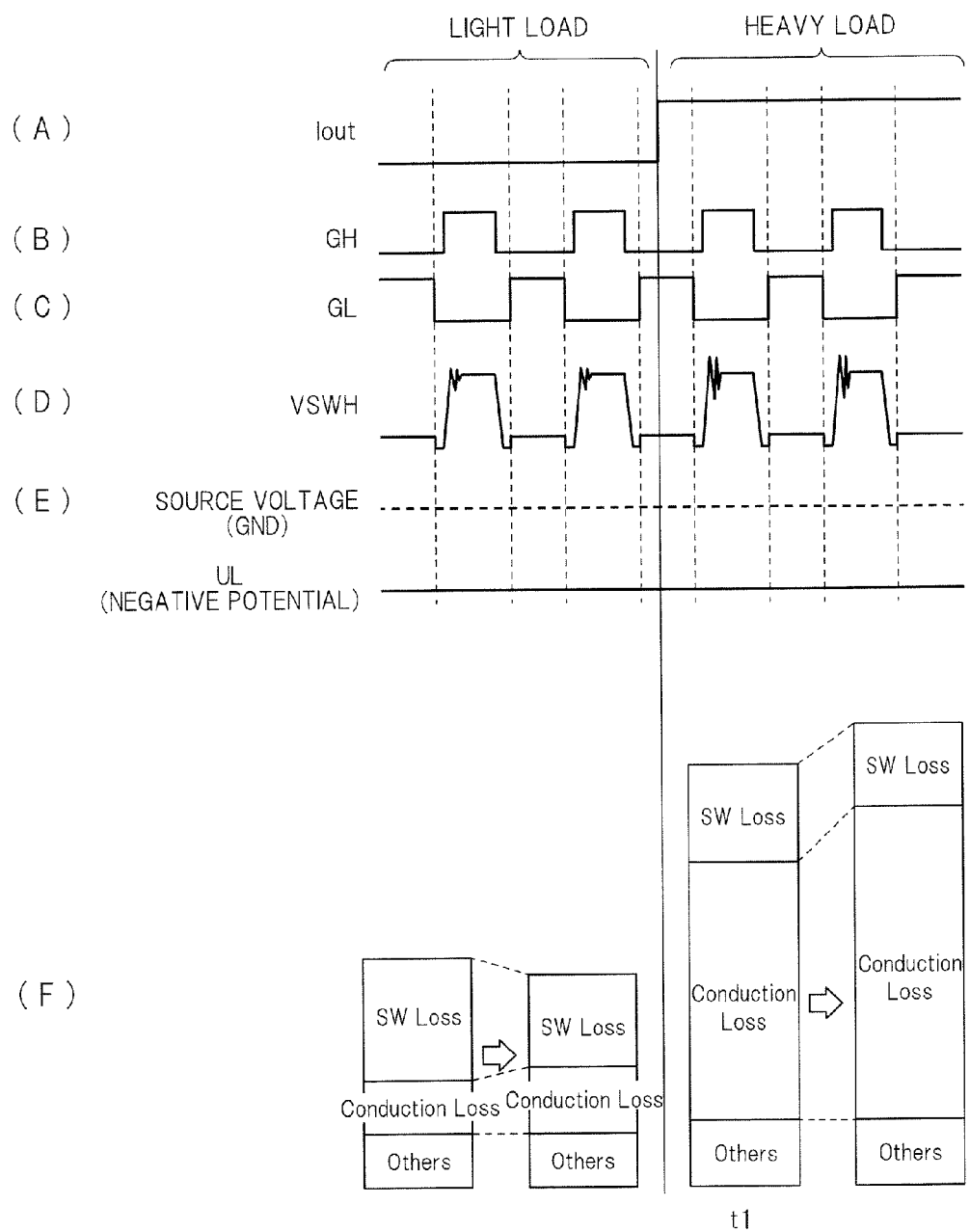

FIG. 10 is a characteristics diagram showing the relation between the output current Iout and the efficiency of the semiconductor integrated circuit device 4002. In FIG. 10, the horizontal axis represents the value of the output current Iout and the vertical axis represents the efficiency. In FIG. 10, a broken line represents a characteristics curve that results when the second gate electrode G2 is connected to the source S of the low-side MOSFET 4006 ("U-S short"), and a continuous line represents a characteristics curve that results when, as described in the third and fourth embodiments, a voltage supplied to the second gate electrode G2 is switched between a positive voltage and a negative voltage based on the load current. By switching the voltage supplied to the second gate electrode G2, based on the load current, as described in the third and fourth embodiments, the efficiency is improved in part of the time zone where the load is light as well as part of the time zone where the load is heavy. Hence, the overall loss is reduced.

In FIGS. 8 and 9, to make the drawings more understandable, the pulse width (high-voltage level period) of the drive signal GL (GH) is depicted as the same width in both light load case and heavy load case. As a matter of fact, however, the pulse width of the drive signal GL (GH) changes in correspondence to an increase and decrease in the load. Compared to the light load case, a ringing phenomenon of the output voltage VSWH becomes more intensive in the heavy load case, as indicated in FIG. 9.

Losses in the light load case and heavy load case in the first and second embodiments will be described.

FIGS. 11(A) to 11(F) are explanatory diagrams of losses in the light load case and heavy load case that result when a negative voltage is supplied to the second gate electrode G2 of the low-side MOSFET 4006 in the first embodiment. FIGS. 12(A) to 12(F) are explanatory diagrams of losses in the light load case and heavy load case that result when a positive voltage is supplied to the second gate electrode G2 of the low-side MOSFET 4006 in the first embodiment.

FIGS. 11(A) to 11(F) correspond to FIGS. 9(A) to 9(F), respectively, and FIGS. 12(A) to 12(F) also correspond to FIGS. 9(A) to 9(F), respectively. Differences between these figures will mainly be described.

Figure 12:
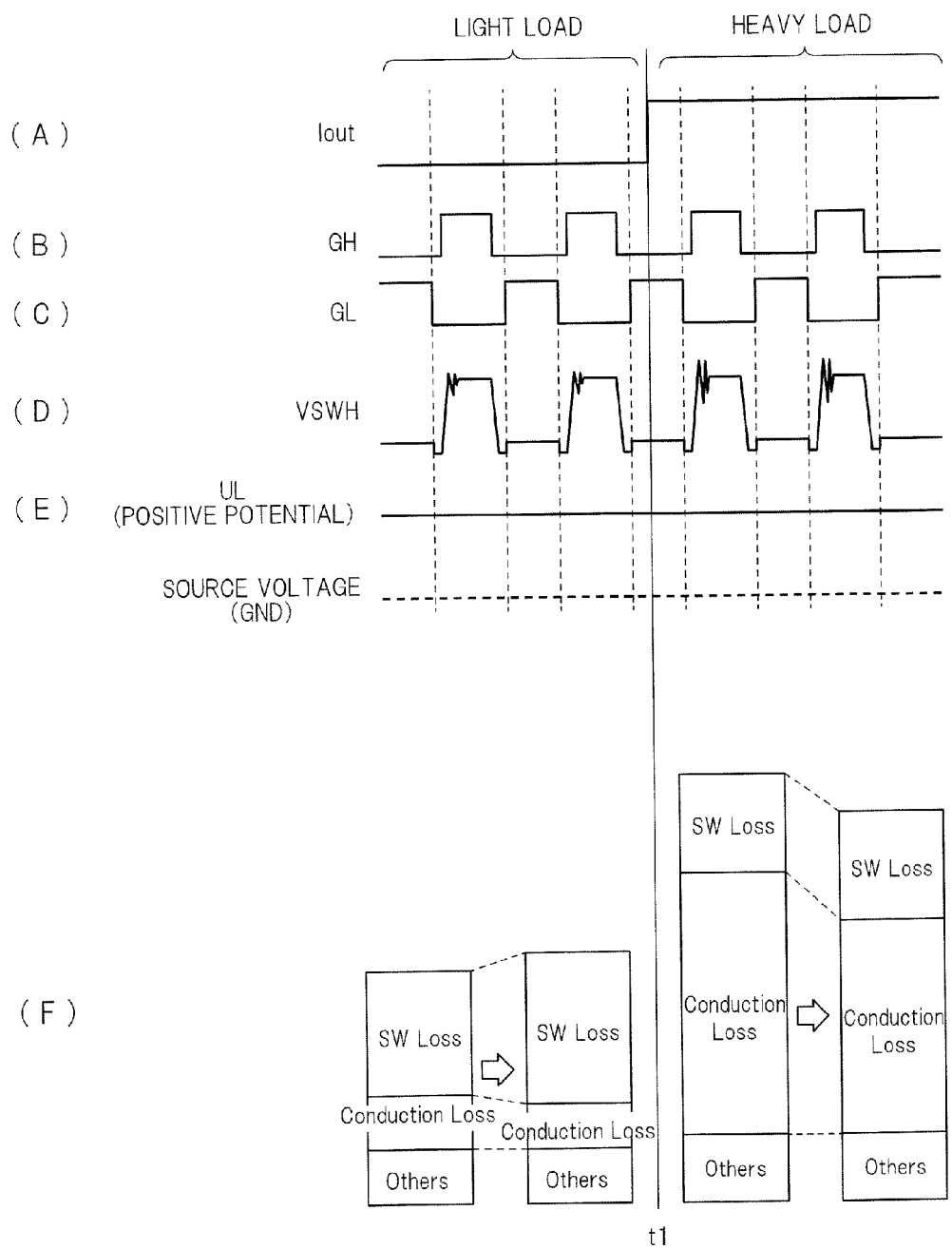

As described above, according to the first embodiment, a negative voltage or positive voltage is supplied constantly to the second gate electrode G2 of the low-side MOSFET 4006. As shown in FIGS. 11(E) and 12(E), therefore, the second gate electrode control signal UL remains a negative voltage signal or positive voltage signal in both light load case and heavy load case.

It is understood from FIG. 11(F) that by supplying a negative voltage to the second gate electrode G2, the switching loss is reduced in the light load case, which reduces the overall loss in the light load case. It is understood from FIG. 12(F) that by supplying a positive voltage to the second gate electrode G2, the conduction loss is reduced, which reduces the overall loss in the heavy load case.

Figure 13:
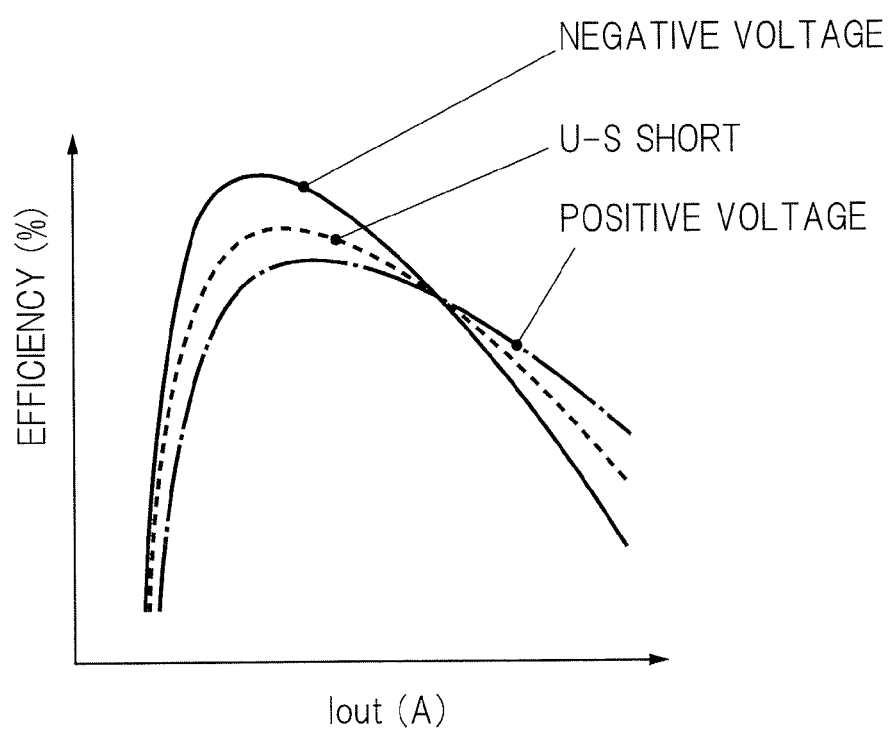

FIG. 13 is a characteristics diagram showing the output current Iout from the semiconductor integrated circuit device 4002 and the efficiency of the semiconductor integrated circuit device 4002. Since FIG. 13 is similar to FIG. 10, differences between FIG. 13 and FIG. 10 will mainly be described. In FIG. 13, a broken line represents a characteristics curve that results when the second gate electrode G2 of the low-side MOSFET 4006 is connected to the source S of the MOSFET 4006. A continuous line represents a characteristics curve that results when a negative voltage is supplied to the second gate electrode G2, while a single-dot broken line represents a characteristics curve that results when a positive voltage is supplied to the second gate electrode G2. In this manner, by supplying a negative voltage to the second gate electrode G2, the efficiency in the light load case is improved. By supplying a positive voltage to the second gate electrode G2, on the other hand, the efficiency in the heavy load case is improved.

Connecting the second gate electrode G2 to the source S of the MOSFET is based on instructions set forth in Patent Document 2.

Losses in the light load case and losses in the heavy load case in the second embodiment will then be described. FIGS. 14(A) to 14(F) are explanatory diagrams of losses in the light load case and heavy load case that result when a positive or negative voltage is supplied to the second gate electrode G2 of the low-side MOSFET 4006 in the second embodiment. Since FIGS. 14(A) to 14(F) correspond to FIGS. 9(A) to 9(F), respectively, differences between FIGS. 14(A) to 14(F) and FIGS. 9(A) to 9(F) will mainly be described.

As described in the second embodiment, the second gate electrode control signal UL changes in synchronization with the drive signal GL supplied to the first gate electrode G1 of the MOSFET. As shown in FIG. 14(E), the second gate electrode control signal UL becomes a positive voltage signal when the low-side MOSFET 4006 is switched on by the drive signal GL, and becomes a negative voltage signal when the low-side MOSFET 4006 is switched off. When the low-side MOSFET 4006 is switched on, therefore, the on-resistance of the low-side MOSFET is reduced. When the low-side MOSFET 4006 is switched off, the first gate-drain capacitance Crss is reduced.

Figure 14:
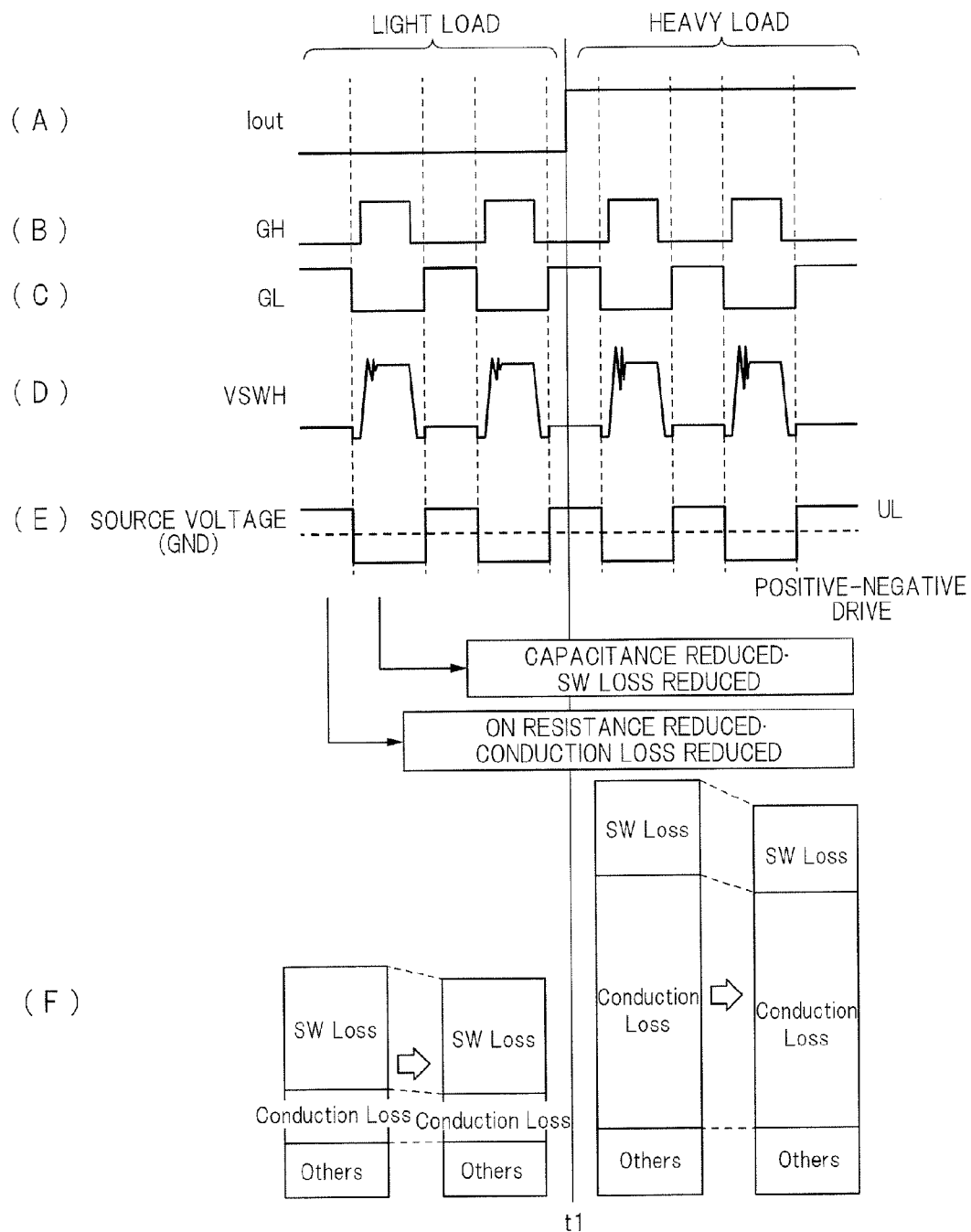

Because the on-resistance can be reduced, the conduction loss that results when the low-side MOSFET 4006 is on (which is noted as "on-resistance reduction/conduction loss reduction" in FIG. 14) can be reduced in both light load case and heavy load case. Because the first gate-drain capacitance Crss can be reduced, the switching loss of the low-side MOSFET 4006 (which is noted as "capacitance reduction/SW loss reduction" in FIG. 14) can be reduced in both light load case and heavy load case. As a result, as shown in FIG. 14(F), both conduction loss and switching loss can be reduced in both light load case and heavy load case, and therefore the overall loss can be reduced.

Figure 15:
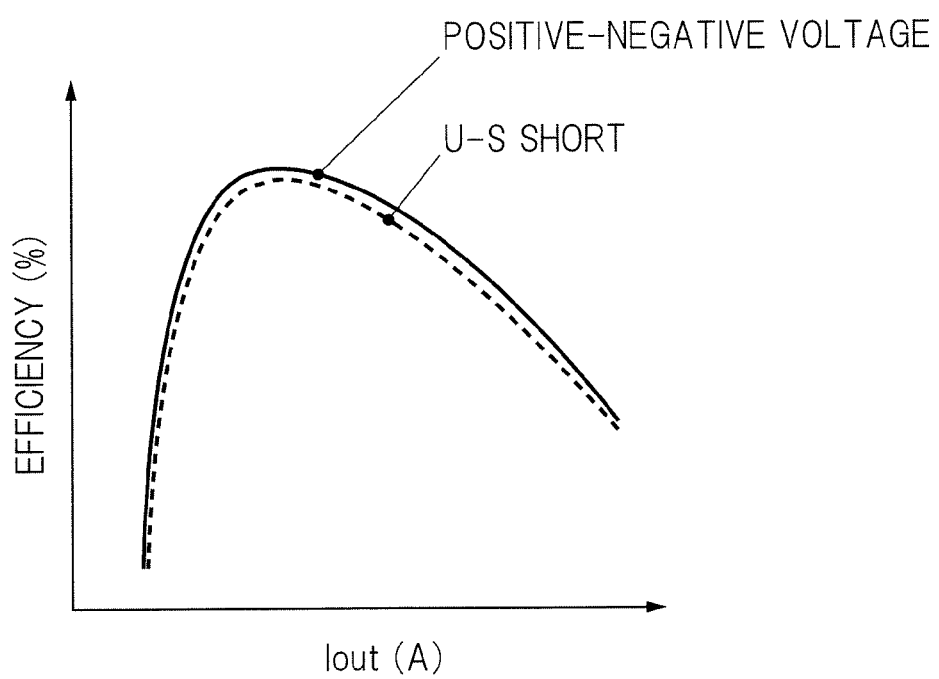

FIG. 15 is a characteristic diagram showing the relation between efficiency of the semiconductor integrated circuit device and the output current Iout from the semiconductor integrated circuit device. FIG. 15 is similar to FIG. 10 and is different from FIG. 10 in that a continuous line represents a characteristics curve ("positive/negative drive" in FIG. 15) that results when the second gate electrode G2 is driven according to the second embodiment. It is understood from FIG. 10 that according to the second embodiment, the efficiency is improved and therefore the overall loss is reduced in both light load case and heavy load case, compared to a case where the second gate electrode G2 is connected to the source S (characteristics curve represented by a broken line).

According to the second embodiment described referring to FIG. 2, the selecting circuit 2002 selects the positive voltage Vpos or negative voltage Vneg. By improving the withstand voltages of the MOSFETs making up the selecting circuit 2002, the positive voltage Vpos and negative voltage Vneg each having a larger absolute value can be supplied to the second gate electrode. Using the positive voltage Vpos and negative voltage Vneg each having a larger absolute value improves the efficiency indicated in FIG. 15.

(Fifth Embodiment)

In the first to fourth embodiments relating to the low-side MOSFET 4006, the second gate electrode control signal UL supplied to the second gate electrode G2 of the low-side MOSFET 4006 has been described. Fifth to eighth embodiments to be described below relate to the high-side MOSFET 4005, and a second gate electrode control signal UH supplied to the second gate electrode G2 of the high-side MOSFET 4005 will be described in the fifth to eighth embodiments.

FIG. 16(A) is a circuit diagram showing a configuration of the semiconductor integrated circuit device 4002 according to the fifth embodiment, and FIG. 16(B) is a waveform chart showing the waveforms of signals from the semiconductor integrated circuit device 4002 according to the fifth embodiment. FIG. 16(A) depicts the high-side MOSFET 4005 and the drive circuit 4011 that outputs the drive signal GH supplied to the first gate electrode G1 of the high-side MOSFET 4005, out of components depicted in FIG. 40. Other components in this embodiment are the same as those of FIG. 40 and are therefore omitted in further description. According to the fifth embodiment, the driver 4003 is provided with a control terminal T15. The driver 4003 includes a second gate electrode control circuit 1600 that supplies the second gate electrode control signal UH to the second gate electrode G2 of the high-side MOSFET 4005 via the control terminal T15.

The second gate electrode control circuit 1600 has a variable voltage source 1601, and generates the second gate electrode control signal UH having a given voltage and supplies the second gate electrode control signal UH to the second gate electrode G2 of the high-side MOSFET 4005 via the control terminal T15. The given voltage is determined to be, for example, 2 V, so that the second gate signal UH of 2 V in voltage is supplied from the second gate electrode control circuit 1600 to the second gate electrode G2 of the high-side MOSFET 4005 via the control terminal T15. Needless to say, the first gate electrode G1 of the high-side MOSFET 4005 is supplied with the drive signal GH from the drive circuit 4011. The high-side MOSFET 4005 thus is switched on and off according to the drive signal GH.

The output terminal T1 of the semiconductor integrated circuit device 4002, the voltage terminal T8 of the driver 4003, and the source S of the high-side MOSFET 4005 are connected to each other. As described referring to FIG. 40, the high-side MOSFET 4005 and low-side MOSFET 4006 are switched on and off alternately. As a result, each voltage at the output terminal T1, the voltage terminal T8, and the source S of the high-side MOSFET 4005 changes time-dependently. In other words, switching on/off of the high-side MOSFET 4005 and low-side MOSFET 4006 causes the voltage at the source S of the high-side MOSFET 4005 to change.

Complemental switching on/off of the high-side MOSFET 4005 and low-side MOSFET 4006 causes the voltage VSWH at the voltage terminal T8 to change roughly between the ground voltage (GND=0 V) and the voltage VIN. The voltage amplitude representing this voltage change is determined to be, for example, 12 V and the voltage of the second control signal UH is determined to be 2 V, as described above. In this case, at a point of time right before switching on of the high-side MOSFET 4005, the voltage at the voltage terminal T8 is almost equal to the ground voltage because the low-side MOSFET 4006 is on, so that a positive voltage of 2 V positive in polarity relative to the voltage at the source S (voltage terminal T8) is supplied to the second gate electrode G2 of the high-side MOSFET 4005. At a point of time right before switching off of the high-side MOSFET 4005, the voltage at the source S (voltage terminal T8) of the MOSFET 4005 is 12 V because it is on, so that a negative voltage of –10 V negative in polarity relative to the voltage at the source S of the MOSFET 4005 is supplied to the second gate electrode G2 of the high-side MOSFET 4005.

FIG. 16(B) depicts the waveform of the voltage VSWH (source voltage (VSWH)) at the source S (voltage terminal T8) of the high-side MOSFET 4005 and the waveform of the second control signal UH. In FIG. 16(B), the horizontal axis represents time and the vertical axis represents voltage value. In FIG. 16(B), a period in which the high-side MOSFET 4005 is switched on is indicated as a period (a), while a period in which the high-side MOSFET 4005 is switched off is indicated as a period (b). FIG. 16(B) also depicts a period in which the voltage VSWH at the source S (source voltage) drops below the ground voltage (0 V). This period indicates a voltage change caused by a counter electromotive force generated by the coil element 4008 (FIG. 40).

According to the fifth embodiment, in the period in which the high-side MOSFET 4005 is switched off (period (b)), a negative voltage negative in polarity relative to the source voltage (VSWH) at the source S of the MOSFET 4005 is supplied to the second gate electrode G2 of the high-side MOSFET 4005, in which case the first gate-drain capacitance Crss of the high-side MOSFET 4005 is reduced. As a result, the switching loss is reduced.

Figure 17:
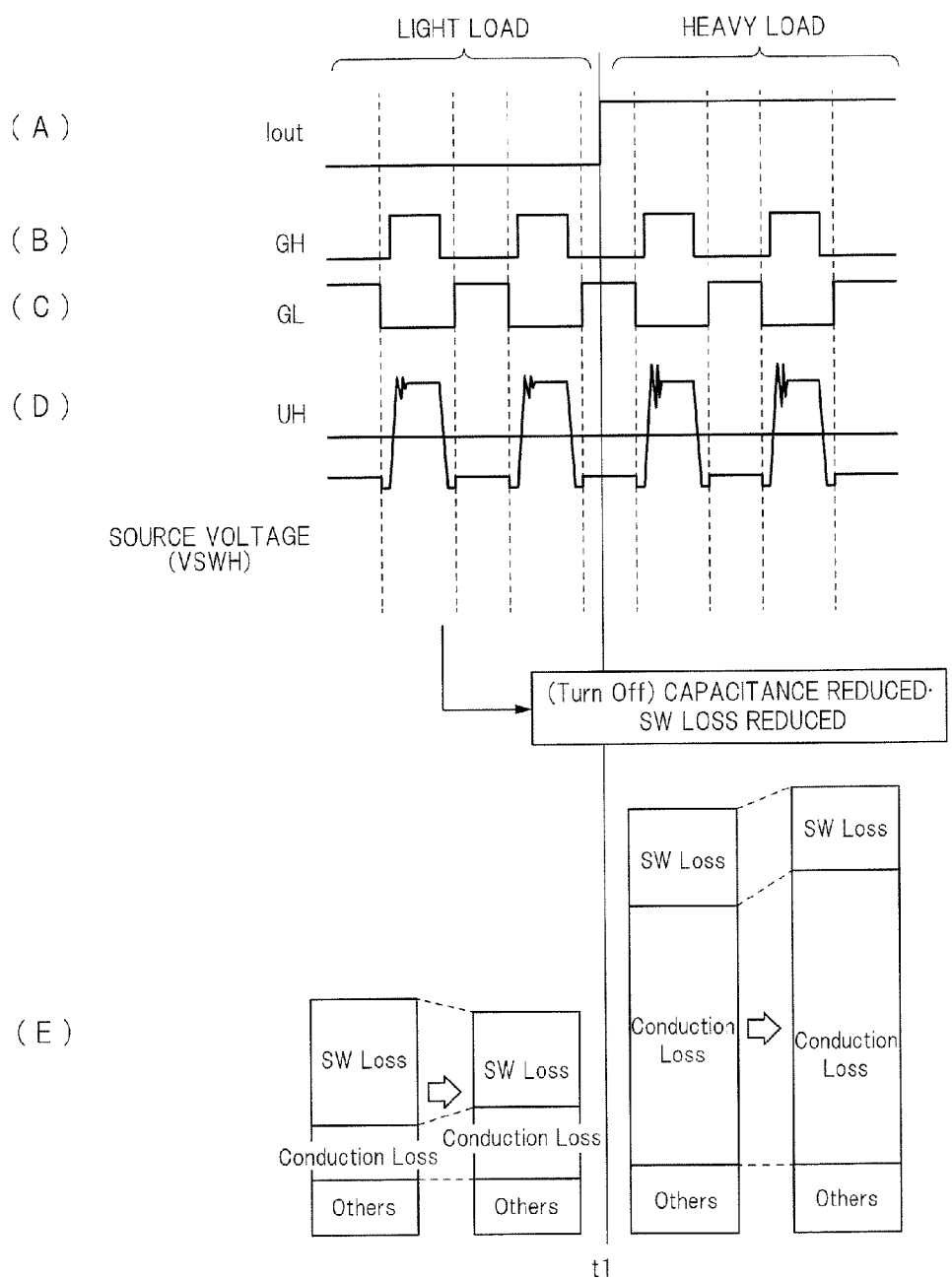

FIGS. 17(A) to 17(E) are explanatory diagrams of losses in the light load case and heavy load case that result when the second gate control signal UH having the given voltage is supplied from the second gate electrode control circuit 1600 to the second gate electrode G2 of the high-side MOSFET 4005 in the fifth embodiment. FIGS. 17(A) to 17(C) and FIG. 17(E) correspond to FIGS. 9(A) to 9(C) and FIG. 9(F), respectively. FIG. 17(D) is similar to FIG. 9(D) and to FIG. 9(E), and depicts the waveform of the voltage (source voltage) VSWH at the source S (voltage terminal T8) of the high-side MOSFET 4005 and the waveform of the second gate control signal UH. Differences between FIG. 17 and FIG. 9 will mainly be described.

As described referring to FIGS. 16(A) and 16(B), according to the fifth embodiment, the positive given voltage is generated by the second gate electrode control circuit 1600 and is supplied constantly to the second gate electrode G2 of the high-side MOSFET 4005. As a result, when the high-side MOSFET 4005 is switched off, a negative voltage negative in polarity relative to a voltage at the source of the high-side MOSFET 4005 is supplied to the second gate electrode G2. Because this negative voltage is supplied constantly, the high-side MOSFET 4005 can reduce its witching loss when shifting from its on-state to off-state in both light load case and heavy load case (which are noted as "(Turn Off) capacitance reduction/SW loss reduction").

As indicated in FIG. 17(E), a reduction in the switching loss leads to a reduction in the overall loss in the light load case. This is because that, as described referring to FIG. 38, the ratio of the switching loss is high in the light load case. However, when the high-side MOSFET 4005 is switched on, the first gate-drain capacitance Crss may increases. In addition, in a period during which the high-side MOSFET 4005 remains on, a voltage supplied to the second gate electrode G2 is negative in polarity relative to a voltage at the source S, which can be understood by observing FIG. 17(D), and consequently the on-resistance may increase.

Figure 18:
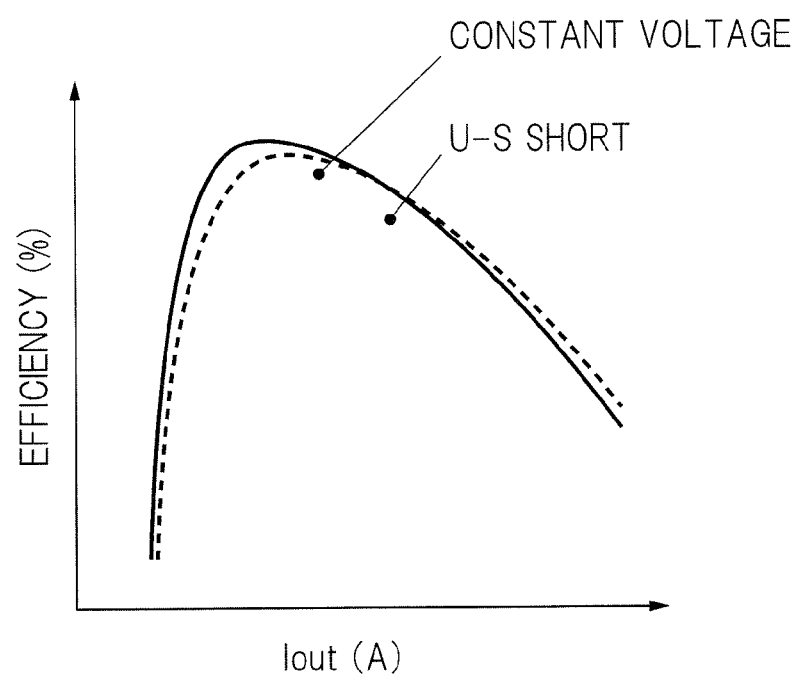

FIG. 18 is a characteristic diagram showing the relation between the efficiency of the semiconductor integrated circuit device 4002 of the fifth embodiment and the output current Iout from the semiconductor integrated circuit device. FIG. 18 is similar to FIG. 10 and is different from FIG. 10 in that the relation between the output current Iout from the semiconductor integrated circuit device 4002 of the fifth embodiment and the efficiency of the semiconductor integrated circuit device 4002 is indicated by a continuous line ("constant voltage"). FIG. 18 demonstrates that the efficiency is improved and therefore the overall loss is reduced in the light load case.

(Sixth Embodiment)

FIG. 19(A) is a circuit diagram showing a configuration of the semiconductor integrated circuit device 4002 according to a sixth embodiment, and FIG. 19(B) is a waveform chart showing the waveforms of signals from the semiconductor integrated circuit device 4002 of FIG. 19(A). Since the configuration shown in FIG. 19(A) is similar to the configuration shown in FIG. 16(A) described in the fifth embodiment, differences between both configurations will mainly be described.

The configuration of the second gate electrode control circuit 1600 shown in FIG. 19(A) is different from the configuration of the second gate electrode control circuit 1600 shown FIG. 16(A). In FIG. 19(A), the second gate electrode control circuit 1600 has resistance elements 1900 and 1901 connected in series between the voltage terminal T8 and the ground voltage CGND node. The voltage (source voltage) VSWH at the source of the high-side MOSFET 4005 is divided through the resistance elements 1900 and 1901. A voltage resulting from the voltage division is extracted from a connection node between the resistance element 1900 and the resistance element 1901 and is supplied as the second gate control signal UH, from the second gate electrode control circuit 1600 to the control terminal T15, which is connected to the second gate electrode G2 of the high-side MOSFET 4005. As a result, a voltage corresponding to the voltage VSWH at the source S of the high-side MOSFET 4005 is supplied as the second gate control signal UH, to the second gate electrode G2 of the high-side MOSFET 4005.

FIG. 19(B) depicts the waveform of the source voltage VSWH at the source S of the high-side MOSFET 4005 (voltage at the voltage terminal T8) of FIG. 19(A) and the waveform of the second gate control signal UH generated by the voltage division. In FIG. 19(B), a period (a) represents a period in which the high-side MOSFET 4005 shifts from its off-state to on-state, and a period (b) represents a period in which the high-side MOSFET 4005 shifts from its on-state to off-state. Because the second gate control signal UH is generated by dividing the voltage at the source of the high-side MOSFET 4005, the voltage of the second gate control signal UH changes by following a change in the voltage VSWH at the source.

When the high-side MOSFET 4005 in its off-state is switched on (period (a)), therefore, a voltage rising in the same manner as the voltage VSWH at the source of the MOSFET 4005 is supplied to the second gate electrode G2 of the high-side MOSFET 4005. Hence, when the high-side MOSFET 4005 shifts from its off-state to on-state, a voltage difference between the voltage at the second gate electrode G2 and the voltage at the source of the high-side MOSFET 4005 is reduced, which suppresses an increase in the first gate-drain capacitance Crss. When the high-side MOSFET 4005 in its on-state is switched off (period (b)), because the voltage of the second gate control signal UH is the divided voltage generated out of the source voltage VSWH of the high-side MOSFET 4005, a voltage supplied to the second gate electrode G2 is lower than the source voltage VSWH and is negative in polarity relative to the source voltage VSWH. Hence, when the high-side MOSFET 4005 shifts from its on-state to off-state, the first gate-drain capacitance Crss is reduced and therefore the switching loss is reduced in the same manner as in the fifth embodiment.

According to the sixth embodiment, an increase in the first gate electrode-drain capacitance Crss can be suppressed when the high-side MOSFET 4005 in its off-state is switched on, and the first gate electrode-drain capacitance Crss can be reduced when the high-side MOSFET 4005 in its on-state is switched off. Hence, in the same manner as in the fifth embodiment, the switching loss of the high-side MOSFET can be reduced.

FIGS. 20(A) to 20(E) are explanatory diagrams of losses in the light load case and heavy load case of the semiconductor integrated circuit device 4002 of the sixth embodiment. FIGS. 20(A) to 20(E) correspond to FIGS. 17(A) to 17(E), respectively. Differences between FIGS. 20(A) to 20(E) and FIGS. 17(A) to 17(E) will mainly be described.

Figure 20:
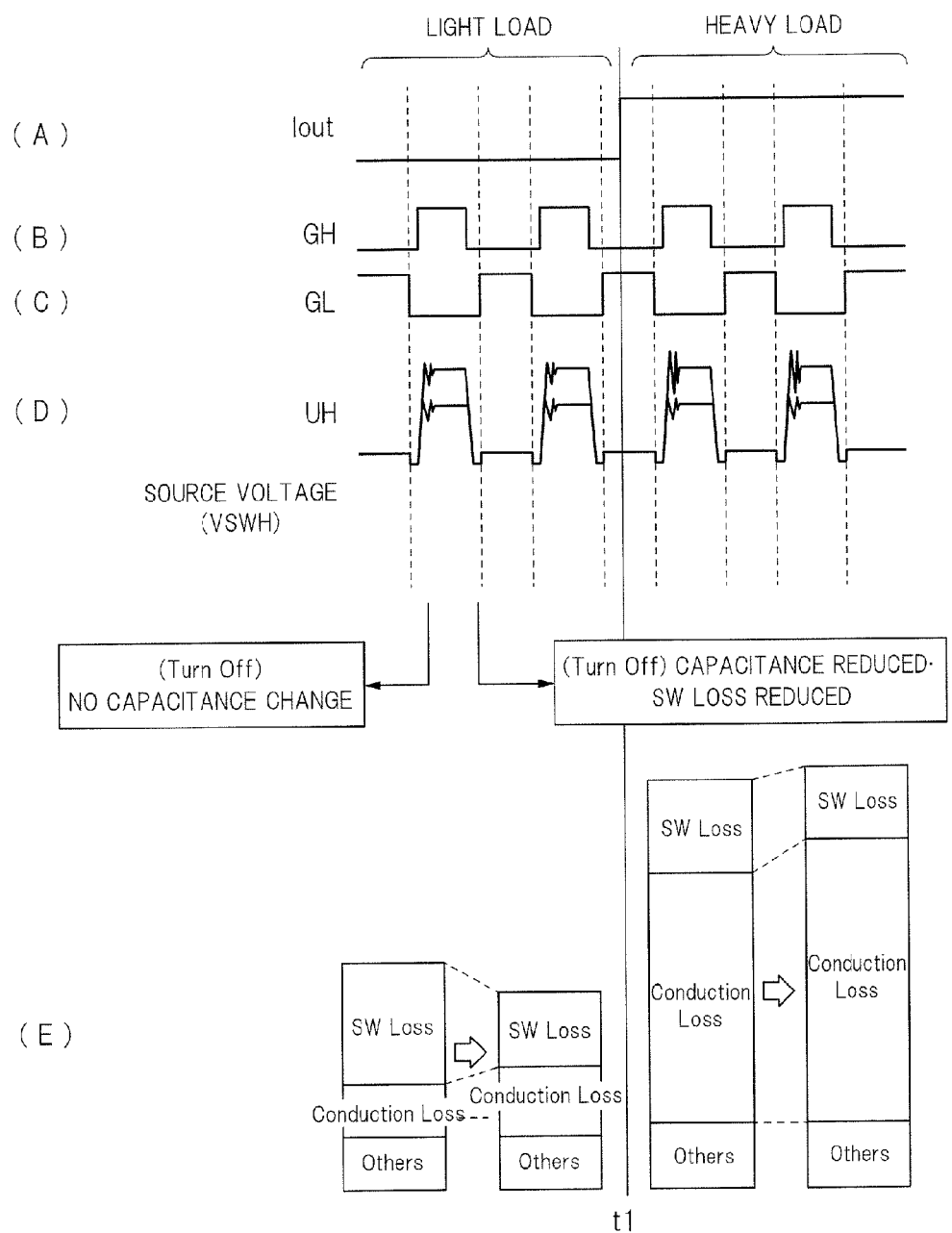

A waveform shown in FIG. 20(D) is different from the waveform shown in FIG. 17(D). According to the sixth embodiment, the voltage of the second gate control signal UH supplied to the second gate electrode G2 of the high-side MOSFET 4005 changes by following a change in the voltage VSWH at the source of the high-side MOSFET 4005. The voltage amplitude of the second gate control signal UH is smaller than the amplitude of the voltage (source voltage VSWH) at the source of the high-side MOSFET 4005.

As a result, when the high-side MOSFET 4005 shifts from its on-state to off-state, a negative voltage negative in polarity relative to the source voltage is supplied to the second gate electrode G2 to reduce the switching loss (which is noted as "(Turn Off) capacitance reduction/SW loss reduction in FIG. 20(D)). Because the voltage supplied to the second gate electrode G2 follows the source voltage VSWH, when the high-side MOSFET 4005 shifts from its on-state to off-state, a voltage difference between the voltage at the second gate electrode G2 and the source voltage VSWH is reduced, which suppresses an increase in the first gate-drain capacitance Crss (which is noted as "(Turn On) no capacitance change"). These actions take place in both light load case and heavy load case. Hence, the switching loss of the high-side MOSFET 4005 is reduced in both light load case and heavy load case (see FIG. 20(E)).

Figure 21:
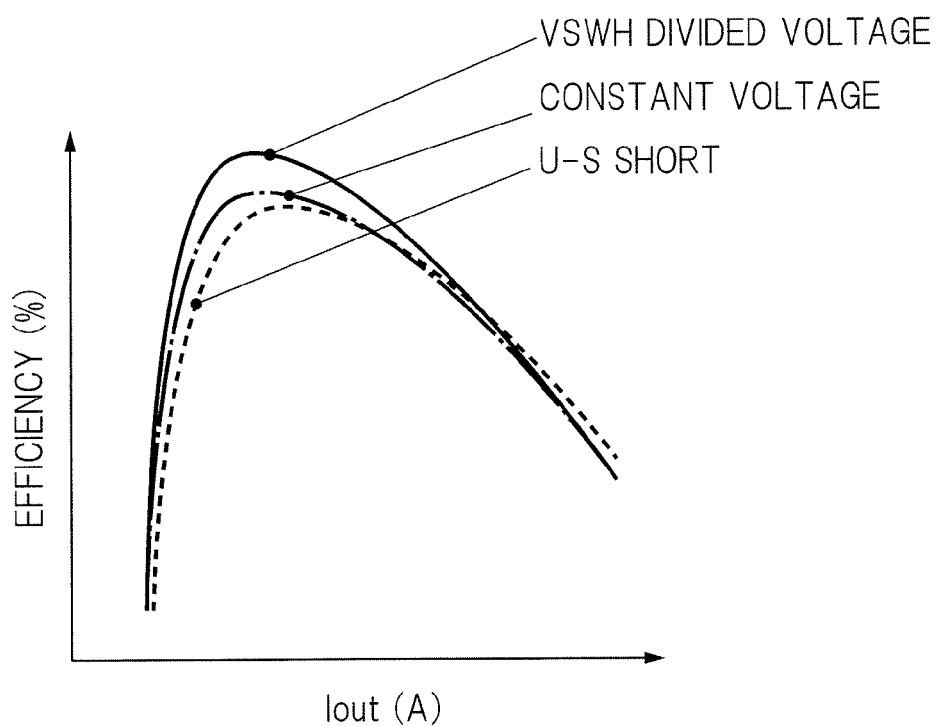

FIG. 21 is a characteristic diagram showing the relation between the efficiency of the semiconductor integrated circuit device 4002 of the sixth embodiment and the output current Iout from the semiconductor integrated circuit device. FIG. 21 is similar to FIG. 18 and is different from FIG. 18 in that the relation between the output current Iout from the semiconductor integrated circuit device 4002 of the fifth embodiment and the efficiency of the semiconductor integrated circuit device 4002 is indicated by a single-dot broken line ("constant voltage") and that the relation between the output current Iout from the semiconductor integrated circuit device 4002 of the sixth embodiment and the efficiency of the semiconductor integrated circuit device 4002 is indicated by a continuous line (VSWH voltage division). It is understood from FIG. 21 that when the output current Iout is small, that is, when the load is light, the efficiency is improved and therefore overall loss is reduced.

(Seventh Embodiment)

FIG. 22(A) is a circuit diagram showing a configuration of the semiconductor integrated circuit device 4002 according to a seventh embodiment, and FIG. 22(B) is a waveform chart showing the waveforms of signals from the semiconductor integrated circuit device 4002 of FIG. 22(A). Since the configuration shown in FIG. 22(A) is similar to the configuration shown in FIG. 19(A) described in the sixth embodiment, differences between both configurations will mainly be described.

The configuration of the second gate electrode control circuit 1600 shown in FIG. 22(A) is different from the configuration of the second gate electrode control circuit 1600 shown in FIG. 19(A). The second gate electrode control circuit 1600 of FIG. 19(A) generates a divided voltage through the resistance elements 1900 and 1901 and supplies the generated divided voltage as the second gate control signal UH. The second gate electrode control circuit 1600 of the seventh embodiment has a resistance element 2200 connected between the voltage terminal T8 and the control terminal T15, a variable resistance element 2201 connected between the control terminal T18 and the ground voltage CGND node, a high-side voltage control circuit 2203 for changing the resistance value of the variable resistance element 2201, and a load current detecting circuit 2202.

The load current detecting circuit 2202 detects the output current Iout flowing through the output terminal T1 of the semiconductor integrated circuit device 4002 to determine whether the value of the output current Iout exceeds a given current value and outputs a detection signal indicating whether the value of the output current Iout exceeds the given current value to the high-side voltage control circuit 2203. According to the supplied detection signal, the high-side voltage control circuit 2203 changes the resistance value of the variable resistance element 2201. The resistance element 2200 and the variable resistance element 2201 are connected in series between the output terminal T8 and the ground voltage CGND node, and a connection node between both resistance elements is connected to the control terminal T15. Hence the voltage (source voltage) VSWH at the source S of the high-side MOSFET 4005 is divided through the resistance element 2200 and the variable resistance element 2201, and the second gate control signal UH having a divided voltage generated by the voltage division is supplied to the second gate electrode G2 of the high-side MOSFET 4005 via the control terminal T15. The resistance value of the variable resistance element 2201 is changed by the high-side voltage control circuit 2203 according to the detection signal from the load current detecting circuit 2202. In other words, the value of the voltage signal supplied to the second gate electrode G2 of the high-side MOSFET 4005 changes according to the value of the load current.

According to the seventh embodiment, when the value of the output current Iout (load current) exceeds the given current value, that is, when the value of an output signal from the load current detecting circuit 2202 exceeds a given value, the high-side voltage control circuit 2203 increases the resistance value of the variable resistance element 2201. To put it another way, the resistance value of the variable resistance element 2201 is determined to be a first resistance value when the value of the output current Iout is equal to or smaller than the given current value, and is determined to be a second resistance value larger than the first resistance value when the value of the output current Iout exceeds the given current value. Hence, when the value of the output current Iout exceeds the given current value, a voltage higher than a voltage for the case of the output current Iout of the given current value or smaller current value is supplied as the second gate control signal UH, to the second gate electrode G2 of the high-side MOSFET 4005. Specifically, when the value of the output current Iout exceeds the given current value, a voltage close to the source voltage VSWH of the high-side MOSFET 4005 is supplied to the second gate electrode G2 of the high-side MOSFET 4005.

The given current value is the load current value with respect to which the light load case and the heavy load case are distinguished from each other. For example, in the case of FIG. 38, the current value i2 is equivalent to the given current value. Under this setting, when the high-side MOSFET 4005 is on in the heavy load case, the second gate control signal UH having a voltage close to the source voltage VSWH is supplied to the second gate electrode G2 of the high-side MOSFET 4005. Hence, an increase in the on-resistance is suppressed when the high-side MOSFET 4005 is on.

FIG. 22(B) depicts the waveform of the source voltage VSWH at the source S of the high-side MOSFET 4005 (voltage at the voltage terminal T8) of FIG. 22(A) and the waveform of the second gate control signal UH generated by the voltage division through the variable resistance element 2201 and resistance element (stationary resistance element) 2200. Since the waveforms shown in FIG. 22(B) are similar to the waveforms shown in FIG. 19(B), differences between the waveforms of FIG. 22(B) and the waveforms of the FIG. 19(B) will mainly be described. In FIG. 22(B), a period (a) represents a period in which the high-side MOSFET 4005 shifts from its off-state to on-state, and a period (b) represents a period in which the high-side MOSFET 4005 shifts from its on-state to off-state. The action made in these periods (a) and (b) is depicted as the same action in FIG. 22(B) and FIG. 19(B), which means that the voltage of the second gate control signal UH changes by following a change in the voltage VSWH at the source.

Hence, when the high-side MOSFET 4005 shifts from its off-state to on-state (period (a)), a voltage difference between the voltage at the second gate electrode G2 and the voltage at the source of the high-side MOSFET 4005 is reduced, which suppresses an increase in the first gate-drain capacitance Crss. When the high-side MOSFET 4005 shifts from its on-state to off-state (period (b)), because the voltage of the second gate control signal UH is the divided voltage generated out of the source voltage VSWH of the high-side MOSFET 4005, a voltage supplied to the second gate electrode G2 is lower than the source voltage VSWH and is negative in polarity relative to the source voltage VSWH. Hence, when the high-side MOSFET 4005 shifts from its on-state to off-state, the first gate-drain capacitance Crss is reduced and therefore the switching loss is reduced.

According to the seventh embodiment, when the value of the load current Iout exceeds the given value, the high-side voltage control circuit 2203 increases the resistance value of the variable resistance element 2201. As a result, when the high-side MOSFET 4005 is on, a voltage supplied to the second gate electrode G2 approaches the source voltage VSWH of the high-side MOSFET 4005. This suppresses an increase in the on-resistance of the high-side MOSFET 4005, thereby suppresses an increase in the conduction loss. Hence, compared to the fifth and sixth embodiments, the conduction loss of the high-side MOSFET is reduced further. In this manner, according to the seventh embodiment, an increase in the conduction loss can be suppressed in the heavy load case where the ratio of the conduction loss is high.

FIGS. 23(A) to 23(E) are explanatory diagrams of losses in the light load case and heavy load case of the semiconductor integrated circuit device 4002 of the seventh embodiment. FIGS. 23(A) to 23(E) correspond to FIGS. 20(A) to 20(E), respectively. Differences between FIGS. 23(A) to 23(E) and FIGS. 20(A) to 20(E) will mainly be described.

Figure 23:
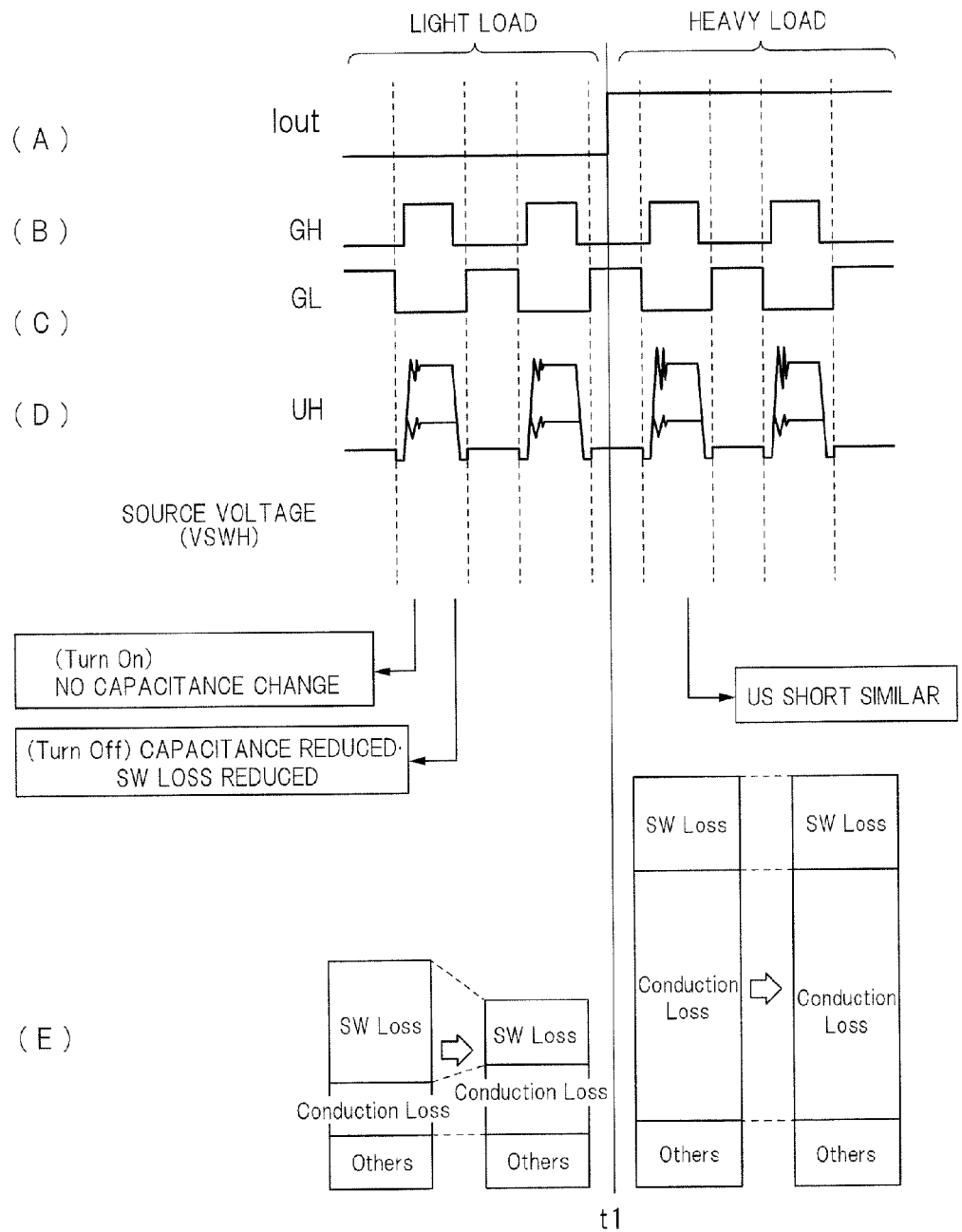

A waveform shown in FIG. 23(D) is different from the waveform shown in FIG. 20(D) in the heavy load case. According to the seventh embodiment, based on an incoming detection signal from the load current detecting circuit 2202, the high-side voltage control circuit 2203 recognizes that the value of the load current Iout has exceeded the given value, thus increasing the resistance value of the variable resistance element 2201. When the value of the load current Iout is equal to or smaller than the given value, i.e., in the light load case, the high-side voltage control circuit 2203 does not increase the resistance value of the variable resistance element 2201. As a result, in the light load case, the switching loss of the high-side MOSFET 4005 is reduced in the same manner as in the sixth embodiment (see bar graphs in the light load case in FIG. 23(E)).

In the heavy load case, the voltage of the second gate control signal UH supplied to the second gate electrode G2 of the high-side MOSFET changes in the same manner as the source voltage VSWH of the high-side MOSFET 4005 changes, thus turning into a voltage close to the source voltage VSWH. In other words, in the heavy load case, the potential state of the second gate electrode G2 of the high-side MOSFET 4005 comes closer to a state of being shorted to the source S of the high-side MOSFET 4005 (which is noted as "close to US short (U-S short)" in FIG. 23(D)). As a result, in the heavy load case, an increase in the on-resistance of the high-side MOSFET 4005 is suppressed and therefore an increase in the conduction loss is suppressed. Hence, according to the seventh embodiment, the switching loss can be reduced in the light load case where its ratio is high and an increase in the conduction loss is suppressed in the heavy load case where its ratio is high.

Figure 24:
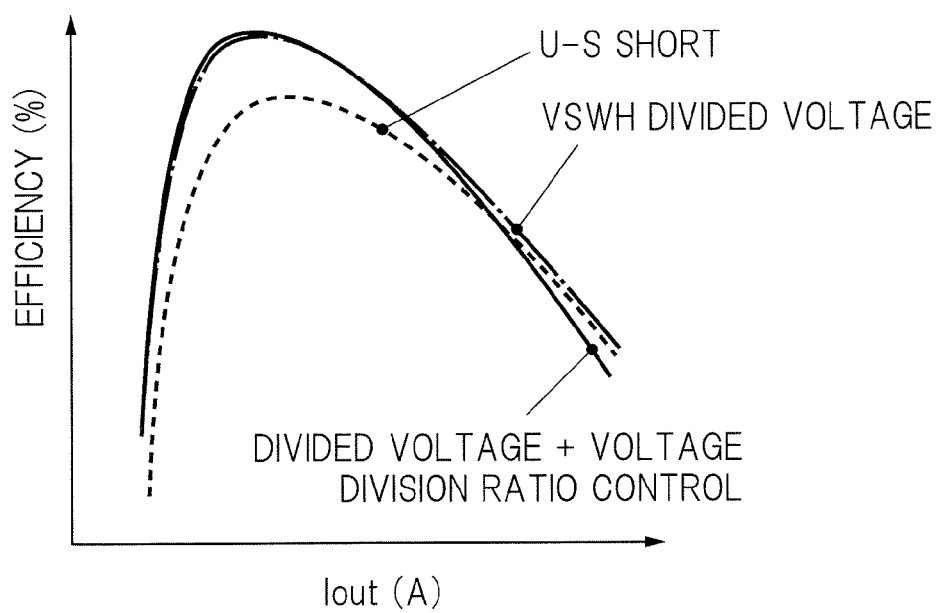
FIG. 24 is a characteristic diagram showing the characteristics of the semiconductor integrated circuit device according to the seventh embodiment.

FIG. 24 is a characteristic diagram showing the relation between the efficiency of the semiconductor integrated circuit device 4002 of the seventh embodiment and the output current Iout from the semiconductor integrated circuit device. FIG. 24 is similar to FIG. 21 and is different from FIG. 21 in that the relation between the output current Iout from the semiconductor integrated circuit device 4002 of the sixth embodiment and the efficiency of the semiconductor integrated circuit device 4002 is indicated by a single-dot broken line ("VSWH voltage division") and that the relation between the output current Iout from the semiconductor integrated circuit device 4002 of the seventh embodiment and the efficiency of the semiconductor integrated circuit device 4002 is indicated by a continuous line ("voltage division+voltage division ratio control"). It is understood from FIG. 24 that when the value of the output current Iout is large, i.e., in the heavy load case, the efficiency is improved and therefore the overall loss is reduced further, compared to the sixth embodiment.

In the case of FIG. 22, the resistance element connected between the control terminal T15 and the ground voltage CGND node functions as the variable resistance element. However, the resistance element connected between the control terminal T15 and the ground voltage CGND node may be provided as a stationary resistance element and the resistance element connected between the output terminal T8 and the control terminal T15 may be provided as a variable resistance element whose resistance value is controlled by the high-side voltage control circuit 2203. In such a case, the resistance value of the variable resistance element is controlled to be small in the heavy load case. In another configuration, both of the resistance elements 2200 and 2201 may be provided as variable resistance elements whose respective resistance values are controlled by the high-side voltage control circuit 2203.

The resistance value of the variable resistance element may not be switched between two resistance values, i.e., first resistance value and second resistance value, but may be switched between three or more resistance values. The resistance value of the variable resistance element may also be changed in such a way that the load current detecting circuit 2202 outputs a detection signal whose value changes continuously according to the load current so that the high-side voltage control circuit 2203 changes the resistance value of the variable resistance element continuously according to this detection signal.

(Eighth Embodiment)

Figure 25:
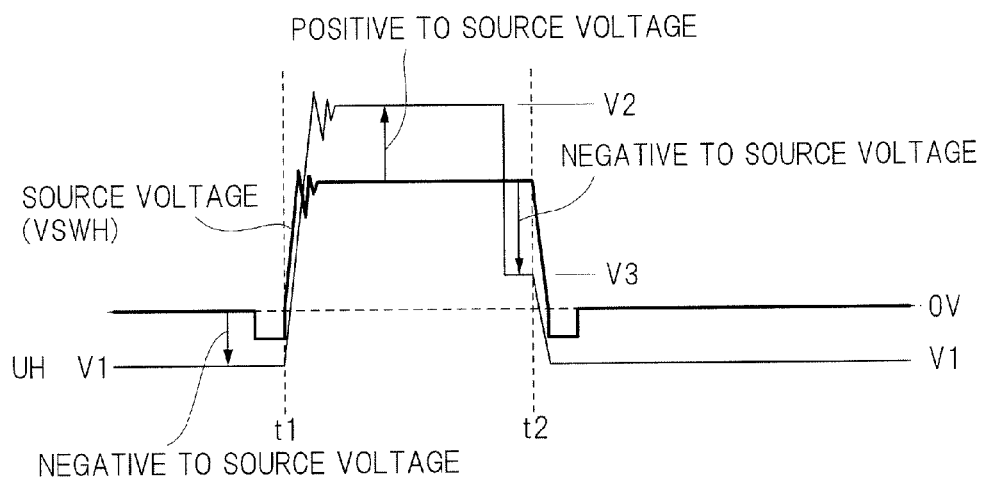
FIG. 25 is a waveform chart showing the waveforms of signals from a principle part of a semiconductor integrated circuit device according to an eighth embodiment.

FIG. 25 is a waveform diagram showing the waveform of the second gate control signal UH generated by the second gate electrode control circuit 1600 included in the semiconductor integrated circuit device 4002 according to an eighth embodiment. The second gate control signal UH generated by the second gate electrode control circuit 1600 of the eighth embodiment is supplied to the second gate electrode G2 of the high-side MOSFET 4005, for example, via the control terminal T15 of FIG. 22.

In FIG. 25, the horizontal axis represents time and the vertical axis represents voltage. When the high-side MOSFET 4005 is kept switched off by the drive signal GH supplied to the first gate electrode G1 of the high-side MOSFET 4005, the second gate electrode control circuit 1600 of the eighth embodiment supplies the second gate control signal UH having a negative voltage V1 negative in polarity relative to the source voltage VSWH at the source S of the high-side MOSFET 4005 (voltage at the output terminal T8), to the second gate electrode G2 of the high-side MOSFET 4005.

At time t1 right before a point of time at which the high-side MOSFET 4005 is shifted from its off-state to on-state by the drive signal GH, the second gate electrode control circuit 1600 changes the voltage of the second gate control signal UH, from the voltage V1 to a voltage V2. This voltage V2 is determined to be higher than the source voltage VSWH of the high-side MOSFET 4005 in its on-state.

Subsequently, at time t2 right before a point of time at which the high-side MOSFET 4005 is shifted from its on-state to off-state by the drive signal GH, the second gate electrode control circuit 1600 changes the voltage of the second gate control signal UH, from the voltage V2 to a voltage V3. This voltage V3 is determined to be negative in polarity relative to the source voltage VSWH of the high-side MOSFET 4005. The second gate electrode control circuit 1600 changes the voltage of the second gate control signal UH to the voltage V3 and then further changes the voltage V3 to the voltage V1 (the voltage shift of the second gate control signal UH is not limited to this).

By changing the voltage of the second gate control signal UH sequentially in this manner, when the high-side MOSFET 4005 shifts from its off-state to on-state (time t1), a negative voltage negative in polarity relative to the source voltage VSWH is supplied to the second gate electrode G2. In the same manner, when the high-side MOSFET 4005 shifts from its on-state to off-state (time t2), a negative voltage negative in polarity relative to the source voltage VSWH of the high-side MOSFET 4005 is supplied to the second gate electrode G2. Hence, when the high-side MOSFET 4005 shifts from its off-state to on-state or from its off-state to on-state, the first gate-drain capacitance Crss of the high-side MOSFET 4005 is reduced and therefore the switching loss is reduced.

In a period during which the high-side MOSFET 4005 remains on (period between time t1 and time t2), a positive voltage positive in polarity relative to the source voltage VSWH is supplied to the second gate electrode G2, which reduces the on-resistance of the high-side MOSFET 4005, thereby reduces the conduction loss. Hence, both switching loss and conduction loss can be reduced.

The second gate electrode control circuit 1600 that generates the second gate control signal UH changing in voltage in the manner as shown in FIG. 25 can be realized using, for example, a negative voltage generating circuit that generates the voltage V1, a positive voltage generating circuit that generates the voltage V2, and a logical circuit that receives the control signal f from the driver 4004 described referring FIG. 40. For example, based on the control signal f, a shift in the voltage of the drive signal GH supplied to the first gate G1 of the high-side MOSFET 4005 to a high-voltage level is grasped before the voltage shift occurs, and the voltage of the second gate control signal UH is changed to the voltage V2 in advance. In the same manner, based on the control signal f, a shift in the voltage of the drive signal GH to a low-voltage level is grasped before the voltage shift occurs, and the voltage of the second gate control signal UH is changed from the voltage V2 to the voltage V3 in advance. The voltage V3 can be generated from the voltage V2. The voltage V3 may be determined by measurement or based on a measured voltage at the output terminal T8.

Figure 26:
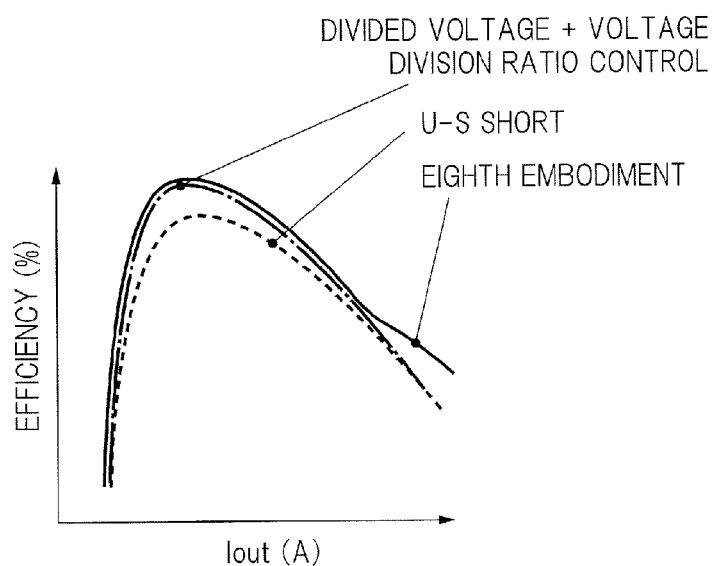
FIG. 26 is a characteristic diagram showing the characteristics of the semiconductor integrated circuit device according to the eighth embodiment.

FIG. 26 is a characteristic diagram showing the relation between the efficiency of the semiconductor integrated circuit device 4002 of the eighth embodiment and the output current Iout from the semiconductor integrated circuit device. FIG. 26 is similar to FIG. 24 described above and is different from FIG. 24 in that the relation between the output current Iout from the semiconductor integrated circuit device 4002 of the seventh embodiment and the efficiency of the semiconductor integrated circuit device 4002 is indicated by a single-dot broken line ("voltage division+voltage division ratio control") and that the relation between the output current Iout from the semiconductor integrated circuit device 4002 of the eighth embodiment and the efficiency of the semiconductor integrated circuit device 4002 is indicated by a continuous line ("eighth embodiment"). According to the eighth embodiment, both switching loss and conduction loss are reduced. It is understood from FIG. 26 that in both cases of the output current Iout being large and small, i.e., in both heavy load case and light load case, the efficiency is improved and therefore the overall loss is reduced.

(Ninth Embodiment)

Figure 27:
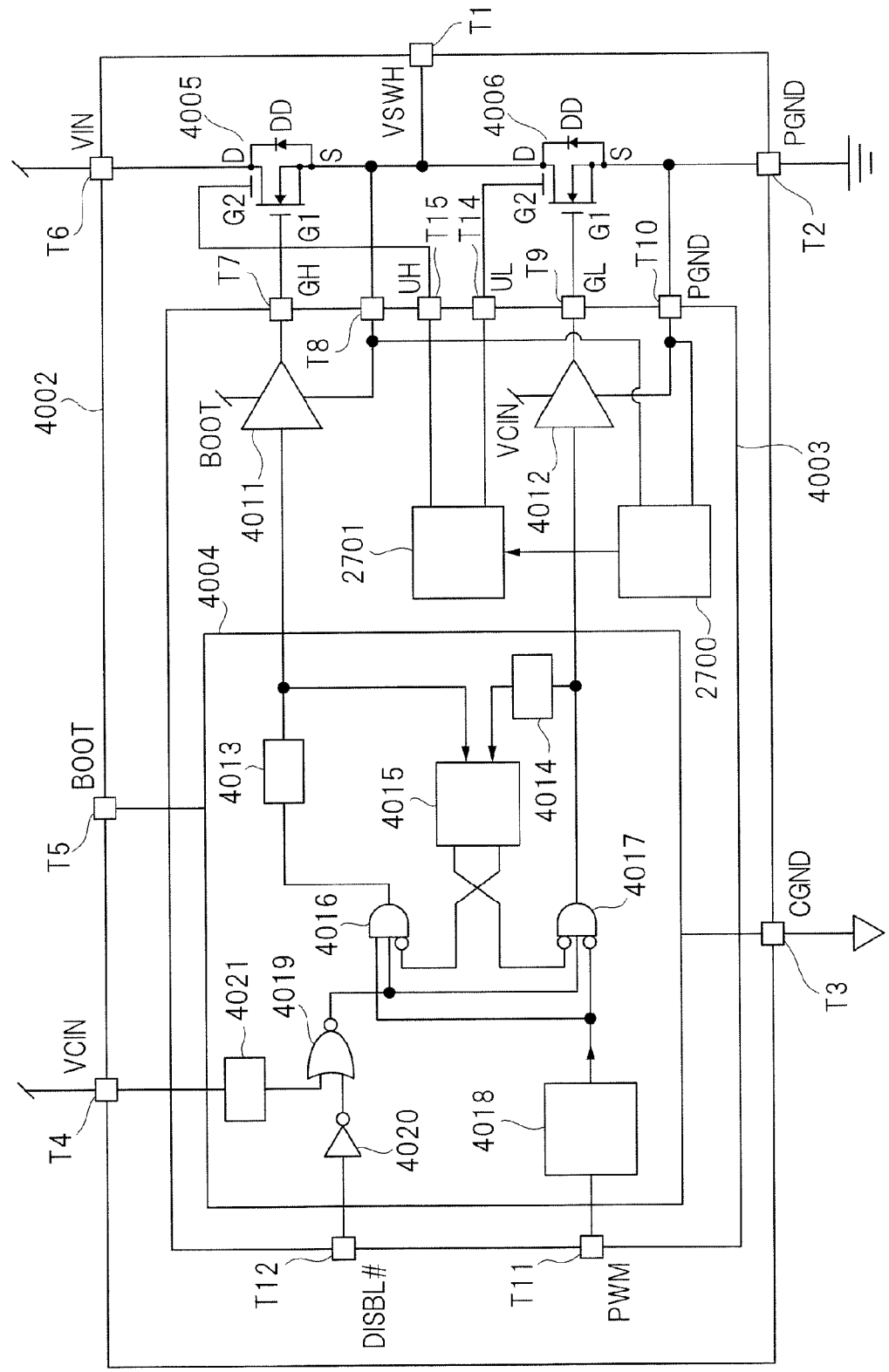
FIG. 27 is a block diagram showing a configuration of a semiconductor integrated circuit device according to a ninth embodiment.

FIG. 27 is a block diagram showing a configuration of the semiconductor integrated circuit device 4002 according to a ninth embodiment. The semiconductor integrated circuit device 4002 of FIG. 27 is similar to the semiconductor integrated circuit device 4002 described referring to FIG. 40. In both FIGS. 27 and 40, the same constituent elements are denoted by the same reference numerals. Only the constituent elements different between FIG. 27 and FIG. 40 will mainly be described.

Being different from the driver 4003 of FIG. 40, the driver 4003 of the ninth embodiment includes a load current detecting circuit 2700, a second gate electrode control circuit 2701, the control terminal T14, and the control terminal T15.

The load current detecting circuit 2700 is connected to the voltage terminal T2 of the semiconductor integrated circuit device 4002 via the voltage terminal T10 of the driver 4003 and is connected to the output terminal T1 of the semiconductor integrated circuit device 4002 via the voltage terminal T8 of the driver 4003. The load current detecting circuit 2700 is equivalent to the load current detecting circuit (including the load current detecting comparator 7000 (FIG. 7)) described in the above multiple embodiments. For example, the load current detecting circuit 2700 is equivalent to the load current detecting circuit 5000 (FIG. 5) or the load current detecting circuit 2202 (FIG. 22) described in the third or seventh embodiment. The load current detecting circuit 2700 detects the output current Iout flowing through the output terminal T1 of the semiconductor integrated circuit device 4002, as a load current, determines whether the value of the output current Iout has exceeded a given current value (e.g., the current i2 of FIG. 38), and supplies a detection signal to the second gate electrode control circuit 2701.

According to the detection signal from the load current detecting circuit 2700, the second gate electrode control circuit 2701 generates the second gate control signal UH and the second gate control signal UL. The generated second gate control signal UH is used to control the second gate electrode G2 of the high-side MOSFET 4005, while the second gate control signal UL is used to control the second gate electrode G2 of the low-side MOSFET 4006. Therefore, the second gate control signal UH is supplied to the second gate electrode G2 of the high-side MOSFET 4005 via the control terminal T15, and the second gate control signal UL is supplied to the second gate electrode G2 of the low-side MOSFET 4006 via the control terminal T14.

When the detection signal from the load current detecting circuit 2700 indicates that the value of the output current Iout flowing through the output terminal T1 exceeds the given current value, the second gate electrode control circuit 2701 generates the second gate control signal UH having a positive voltage positive in polarity relative to the voltage VSWH at the source S of the high-side MOSFET 4005. In this case, the second gate electrode control circuit 2701 generates the second gate control signal UL having a positive voltage positive in polarity relative to the voltage PGND at the source S of the high-side MOSFET 4006.

When the detection signal indicating that the value of the output current Iout is equal to or smaller than the given current value is supplied to the second gate electrode control circuit 2701, the second gate electrode control circuit 2701 generates the second gate control signal UH having a negative voltage negative in polarity relative to the voltage VSWH at the source S of the high-side MOSFET 4005 and the second gate control signal UL having a negative voltage negative in polarity relative to the voltage PGND at the source S of the high-side MOSFET 4006.

When the load, such as a CPU, becomes heavier, the load current (output current) Iout increases. In this embodiment, the value of the current i2 is set as the load current value with respect to which the light load case and the heavy load case are distinguished from each other. Hence, in the heavy load case, a (positive) voltage higher than the voltage at the source S of the high-side MOSFET 4005 is supplied constantly to the second gate electrode G2 of the high-side MOSFET 4005. In the same manner, a (positive) voltage higher than the voltage at the source S of the low-side MOSFET 4006 is supplied constantly to the second gate electrode G2 of the low-side MOSFET 4006. Because the voltage supplied to the second gate electrode G2 is positive in polarity relative to the voltage at the source, the on-resistance of the high-side MOSFET 4005 and low-side MOSFET 4006 in their on-state is reduced. As a result, respective conduction losses of the high-side MOSFET 4005 and low-side MOSFET 4006 in the heavy load case are reduced.

When the value of the load current Iout is equal to or smaller than the given current value (i2) (in the light load case), a negative voltage negative in polarity relative to a voltage at the source S of the high-side MOSFET 4005 is supplied constantly to the second gate electrode G2 of the high-side MOSFET 4005 and a negative voltage negative in polarity relative to a voltage at the source S of the low-side MOSFET 4006 is supplied constantly to the second gate electrode G2 of the low-side MOSFET 4006. As a result, in the light load case, respective first gate electrode-drain capacitances Crss of the high-side MOSFET 4005 and low-side MOSFET 4006 are reduced and therefore the switching loss is reduced.

The second gate electrode control circuit 2701 is composed of a positive voltage regulator, a negative voltage regulator, and four switches (the configuration of the second gate electrode control circuit 2701 is, however, not limited to this). The positive regulator generates, for example, the positive voltage Vpos described referring to FIG. 5 and the positive voltage V2 described referring to FIG. 25. The negative regulator generates the negative voltage Vneg described referring to FIG. 5 and the negative voltage V1 described referring to FIG. 25. The four switches are two pairs of switches. In the same manner as in the case of the switches 5004 and 5005 of FIG. 5, one ends of one pair of switches are supplied with the positive voltage Vpos and the negative voltage Vneg, respectively, and the second gate control signal UL is output from the other ends of one pair of switches. Likewise, one ends of the other pair of switches are supplied with the positive voltage V2 and the negative voltage V1, respectively, and the second gate control signal UH is output from the other ends of the other pair of switches. Hence, the two pairs of switches are controlled based on whether the detection signal from the load current detecting circuit 2700 exceeds the given value in order to select a voltage supplied to respective second gate electrodes G2 of the high-side MOSFET 4005 and low-side MOSFET 4006.

Specifically, the switches supplied with the positive voltages Vpos and V2 are switched on in the heavy load case, and the switches supplied with the negative voltages Vneg and V1 are switched on in the light load case. Needless to say, when the switches supplied with the positive voltages Vpos and V2 (negative voltages Vneg and V1) are switched on, the switches supplied with the negative voltages Vneg and V1 (positive voltages Vpos and V2) are switched off.

According to the ninth embodiment, the conduction loss and switching loss are reduced according to the condition of the load. In the heavy load case, the conduction loss whose ratio is high in the heavy load case can be reduced at both high-side MOSFET 4005 and low-side MOSFET 4006, and in the light load case, the switching loss whose ratio is high in the light load case can be reduced at both high-side MOSFET 4005 and low-side MOSFET 4006. To put it another way, proper loss reduction according to the condition of the load at the time of loss reduction is carried out so that the overall loss can be reduced regardless of a change in the load condition.

<First Modification Example>

According to the description of FIG. 27, in the heavy load case, a voltage higher than a voltage at the source S of the high-side MOSFET 4005 is supplied constantly to the second gate electrode G2 of the high-side MOSFET 4005. However, the configuration of the seventh embodiment may be applied to the high-side MOSFET 4005 of FIG. 27, in which case the configuration of the third embodiment is applied to the low-side MOSFET 4006 of FIG. 27.

In such a case, the load current detecting circuit 2700 of FIG. 27 has, for example, the load current detecting circuit 5000 of FIG. 5 and the load current detecting circuit 2202 of FIG. 22. The second gate electrode control circuit 2701 of FIG. 27 has the second gate electrode drive circuit 5001, positive voltage regulator 5002, negative voltage regulator 5003, and switches 5004 and 5005 of FIG. 5 and the high-side voltage control circuit 2203, resistance element 2200, and variable resistance element 2201 of FIG. 22(A).

According to the first modification example, in the heavy load case, a voltage at the second gate electrode G2 of the high-side MOSFET 4005 changes by following a change in a voltage at the source S of the high-side MOSFET. For this reason, a voltage regulator that generates the positive voltage V2 and negative voltage V1 supplied to the second gate electrode G2 of the high-side MOSFET 4005 can be dispensed with.

<Second Modification Example>

Figure 28:
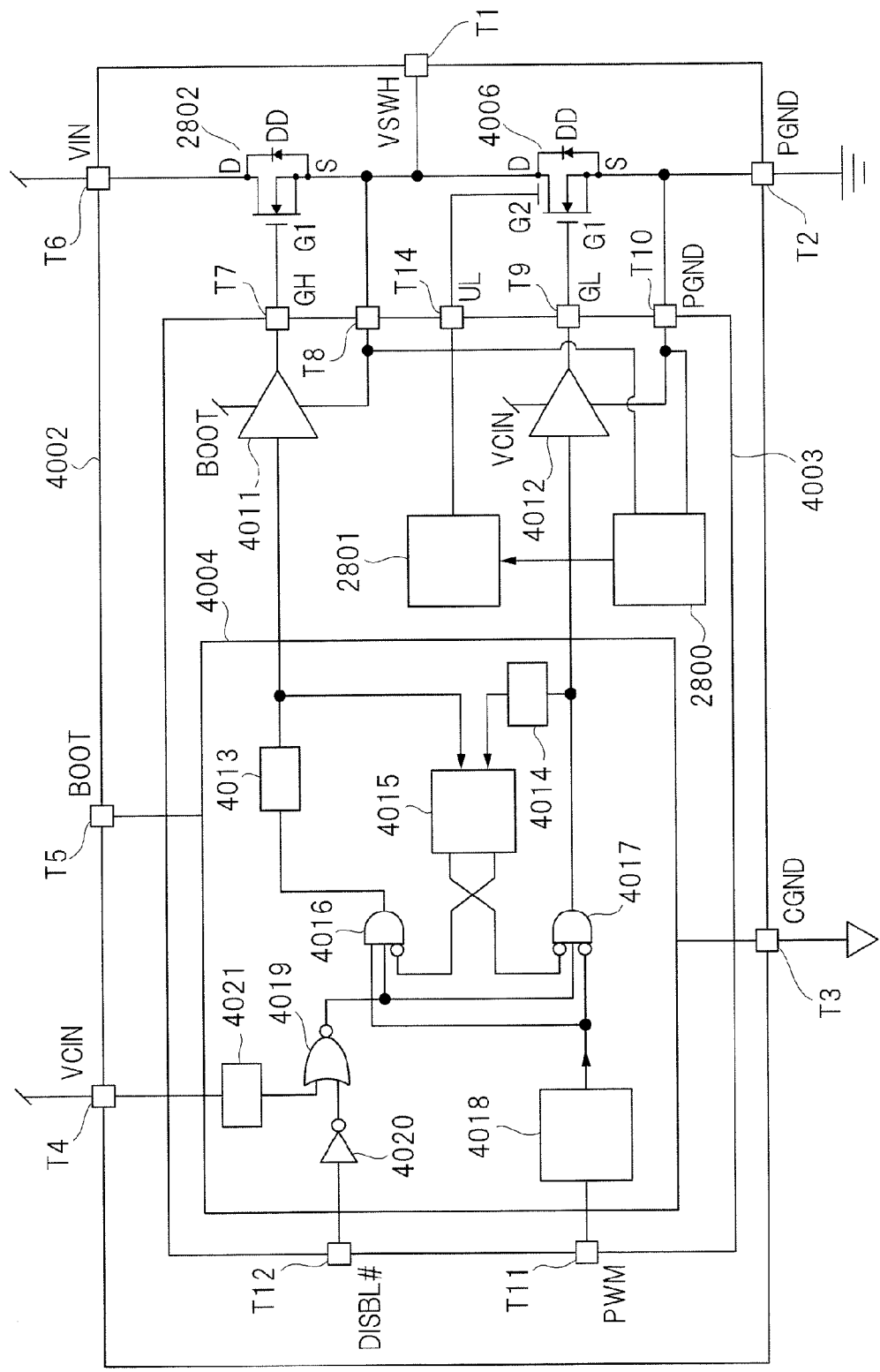
FIG. 28 is a block diagram showing a second modification example of the semiconductor integrated circuit device according to the ninth embodiment.

FIG. 28 is a block diagram showing a configuration of the semiconductor integrated circuit device 4002 according to a modification example of the ninth embodiment. The configuration of FIG. 28 is similar to the configuration of FIG. 27. Differences between both configurations, therefore, will mainly be described.

In FIG. 28, 2802 denotes a MOSFET having no second gate electrode G2. The MOSFET 2802 of such a structure is known as, for example, a trench-type MOSFET, which is, for example, a MOSFET constructed by eliminating the insulating layer and the metal layer 3708 equivalent to the second gate electrode G2 from the n-type semiconductor layer 3704 of FIG. 37(B) (hereinafter "single-gate electrode MOSFET"). In FIG. 28, 2800 denotes a load current detecting circuit and 2801 denotes a second gate electrode control circuit.

The load current detecting circuit 2800 detects the output current (load current) Iout flowing through the output terminal T1 and supplies a detection signal indicating whether the value of the output current Iout exceeds a given current value, to the second gate electrode control circuit 2801. The second gate electrode control circuit 2801 generates the second gate control signal UL according to the detection signal and supplies the second gate control signal UL to the second gate electrode G2 of the low-side MOSFET 4006 via the control terminal T14. In the semiconductor integrated circuit device 4002 of FIG. 28, because the high-side MOSFET is the single-gate electrode MOSFET 2802, the second gate control signal UH for the high-side MOSFET is not generated.

The configuration described in the third or fourth embodiment is applied to the load current detecting circuit 2800 and the second gate electrode control circuit 2801.

When the configuration of the third embodiment is applied, the second gate electrode drive control circuit 5001, positive voltage regulator 5002, negative voltage regulator 5003, and switches 5004 and 5005 of FIG. 5 are collectively regarded as the second gate electrode control circuit 2801 of FIG. 28. The load current detecting circuit 5000 of FIG. 5 is regarded as the load current detecting circuit 2800 of FIG. 28.

When the configuration of the fourth embodiment is applied, the load current detecting comparator 7000 of FIG. 7 is regarded as the load current detecting circuit 2800 of FIG. 28. The four-cycle detecting circuit 7001, analog switch 7003, inverter 7002, positive voltage regulator 2000, and negative voltage regulator 2001 of FIG. 7 are collectively regarded as the second gate electrode control circuit 2801 of FIG. 28.

In the second modification example, the loss of the low-side MOSFET 4006 is reduced according to the condition of the load at the time of loss reduction and therefore power consumption by the semiconductor integrated circuit device 4002 and the power supply system is reduced.

<Third Modification Example>

Figure 29:
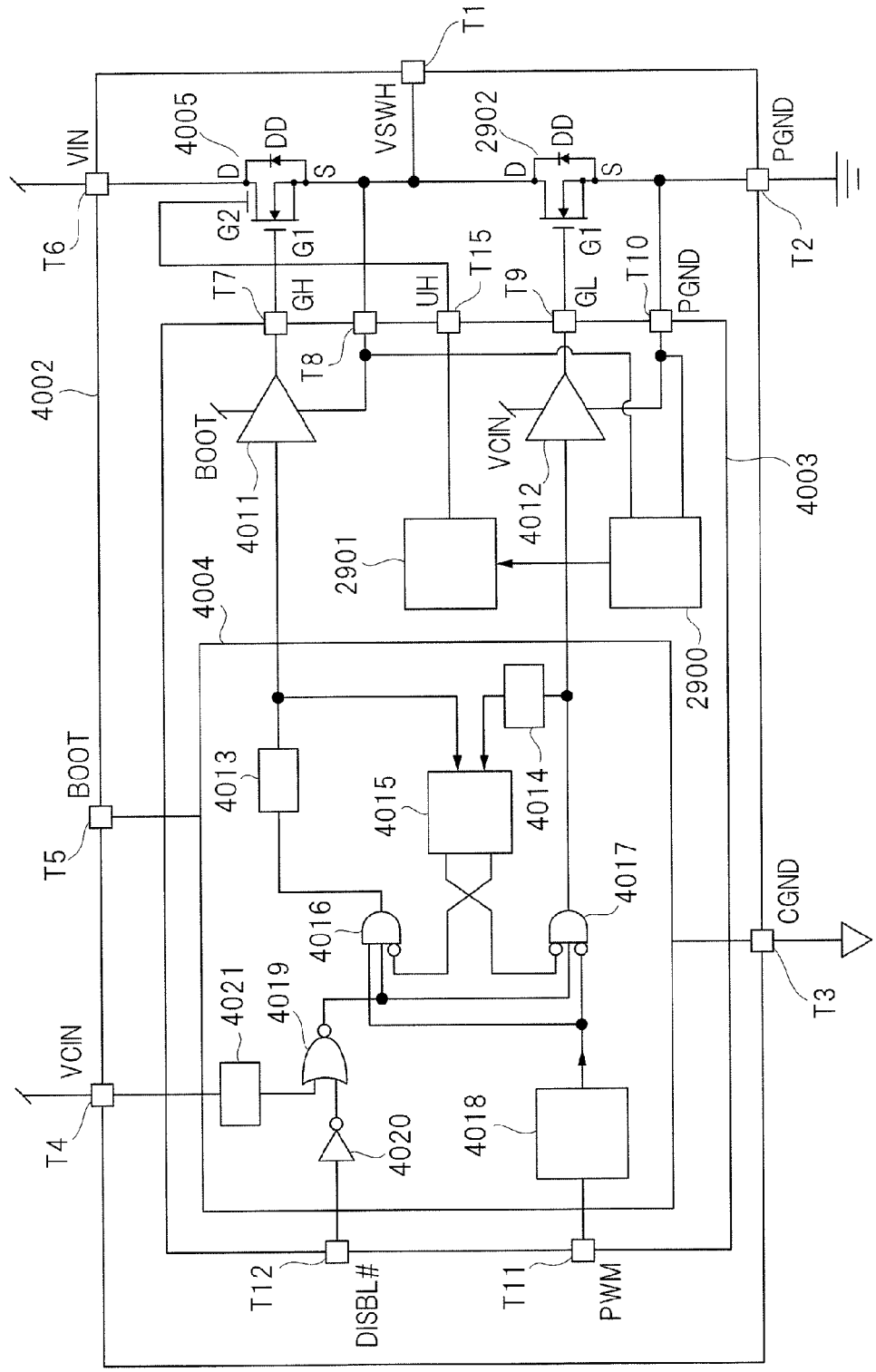
FIG. 29 is a block diagram showing a third modification example of the semiconductor integrated circuit device according to the ninth embodiment.

FIG. 29 is a block diagram showing a configuration of the semiconductor integrated circuit device 4002 according to a modification example of the ninth embodiment. The configuration of FIG. 29 is similar to the configuration of FIG. 27. Differences between both configurations, therefore, will mainly be described.

In FIG. 29, 2902 denotes a single-gate MOSFET having no second gate electrode G2, 2900 denotes a load current detecting circuit, and 2901 denotes a second gate electrode control circuit.

The load current detecting circuit 2900 is identical in configuration with the load current detecting circuit 2800 of the second modification example. The load current detecting circuit 2900 detects the output current (load current) Iout flowing through the output terminal T1 and supplies a detection signal indicating whether the value of the output current Iout exceeds a given current value, to the second gate electrode control circuit 2901. The second gate electrode control circuit 2901 generates the second gate control signal UH according to the detection signal and supplies the second gate control signal UH to the second gate electrode G2 of the high-side MOSFET 4005 via the control terminal T15. In the semiconductor integrated circuit device 4002 of FIG. 29, because the low-side MOSFET is the single-gate electrode MOSFET 2902, the second gate control signal UL for the low-side MOSFET is not generated.

The configuration described in the seventh or ninth embodiment is applied to the load current detecting circuit 2900 and the second gate electrode control circuit 2901.

When the configuration of the seventh embodiment is applied, the load current detecting circuit 2202 of FIG. 22(A) is regarded as the load current detecting circuit 2900 of FIG. 29. The high-side voltage control circuit 2203, stationary resistance element 2200, and variable resistance element 2201 of FIG. 22(A) are collectively regarded as the second gate electrode control circuit 2901.

When the configuration of the ninth embodiment is applied, the voltage V1 is supplied to the second gate electrode G2 of the high-side MOSFET 4005 in the light load case, and the voltage V2 is supplied to the second gate electrode G2 of the high-side MOSFET 4005 in the heavy load case.

In the third modification example, the loss of the high-side MOSFET 4005 is reduced according to the condition of the load at the time of loss reduction and therefore power consumption by the semiconductor integrated circuit device 4002 and the power supply system is reduced.

(Tenth Embodiment)

Figure 30:
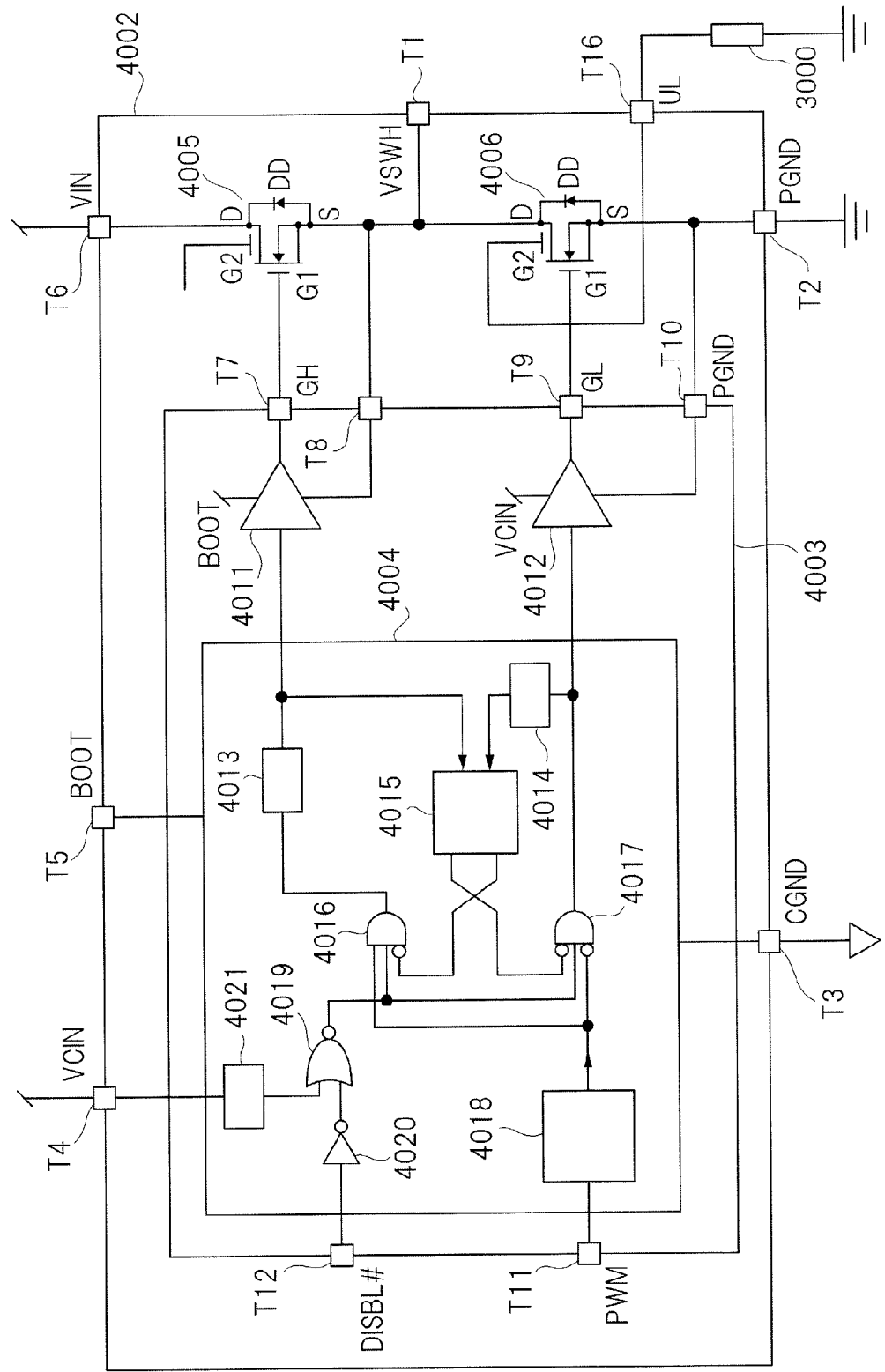
FIG. 30 is a block diagram showing a configuration of a semiconductor integrated circuit device according to a tenth embodiment.

FIG. 30 is a block diagram showing a configuration of the semiconductor integrated circuit device 4002 according to a tenth embodiment. The configuration of FIG. 30 is similar to the configuration of the semiconductor integrated circuit device 4002 of FIG. 40. In FIGS. 30 and 40, the same components are denoted by the same reference numerals, and different components therefore will mainly be described.

The semiconductor integrated circuit device 4002 of the tenth embodiment has a terminal T16, which is connected to the second gate electrode G2 of the low-side MOSFET 4006. As described above, the semiconductor integrated circuit device 4002 is a package in which multiple semiconductor chips are sealed. The terminal T16, therefore, serves as an external terminal attached to the package. A resistance element 3000 is connected between the terminal (external terminal) T16 attached to the package and the ground voltage PGND node, in which case the resistance element 3000 is outside the package.

Figure 31:
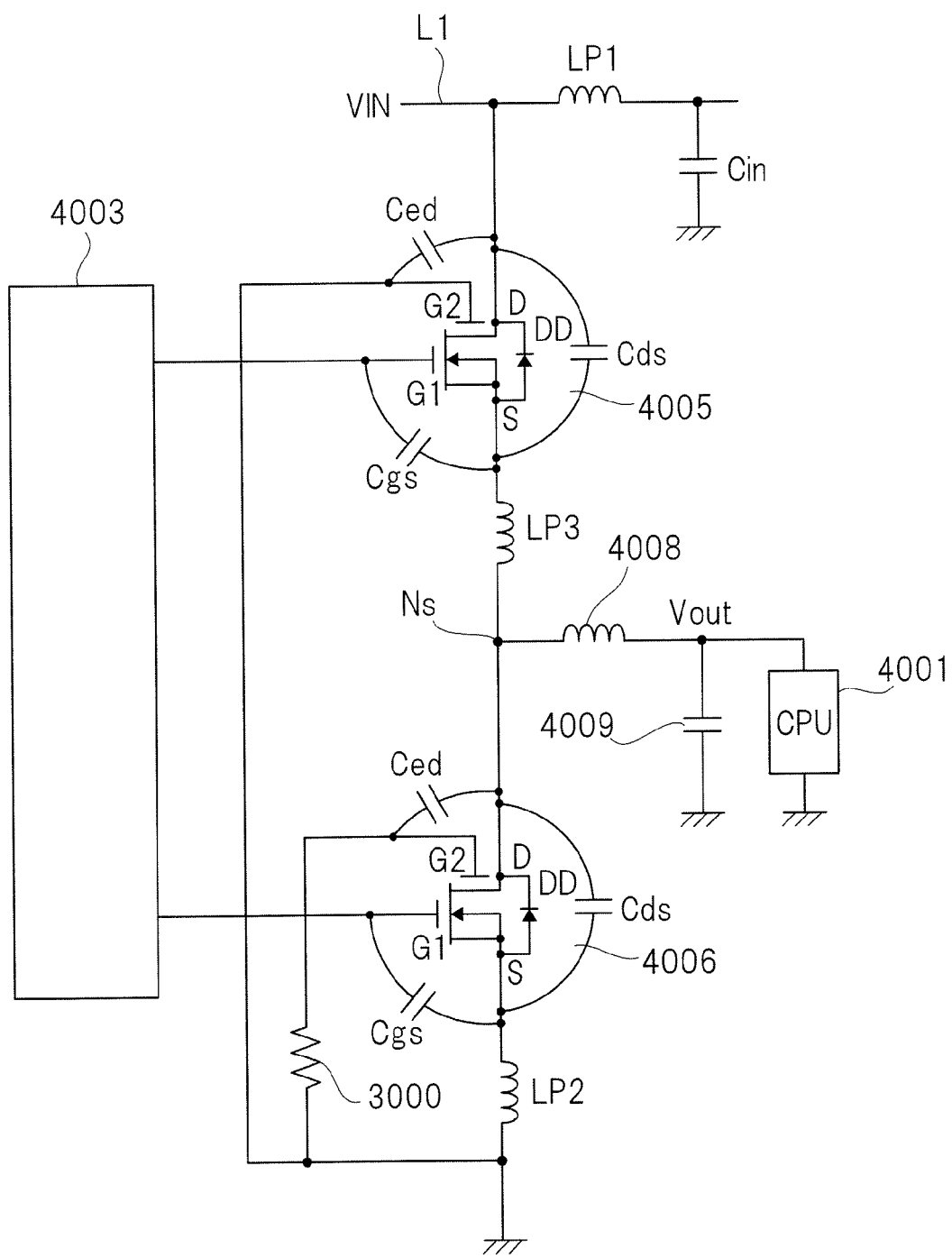
FIG. 31 is a circuit diagram showing a configuration of a principle part of the semiconductor integrated circuit device according to the tenth embodiment.

FIG. 31 is a circuit diagram drawn by paying attention to the high-side MOSFET 4005 and low-side MOSFET 4006 of the semiconductor integrated circuit device 4002 of FIG. 30. Because FIG. 31 is drawn by paying attention to the high-side MOSFET 4005 and low-side MOSFET 4006, the configuration of the driver 4003 is omitted from FIG. 31. FIG. 31 depicts parasitic resistances, parasitic capacitances, and parasitic inductances, as equivalent circuits.

In FIG. 31, the high-side MOSFET 4005 and the low-side MOSFET 4006 are identical in configuration with each other. The low-side MOSFET 4006 (high-side MOSFET 4005) has a parasitic capacitance Cgs formed between the first gate electrode G1 and the source S, a parasitic capacitance Ced formed between the second gate electrode G1 and the drain D, a parasitic capacitance Cds formed between the source S and the drain D, and a parasitic diode DD formed by connecting the back gate to the source S. Respective first gate electrodes G1 of the high-side MOSFET 4005 and the low-side MOSFET 4006 are connected to the driver 4003, and are driven by the drive signals GH and GL from the driver 4003.

The drain D of the high-side MOSFET 4005 is connected to a line L1, through which the input voltage VIN from the terminal (external terminal) T6 is input to the high-side MOSFET 4005. The line L1 is connected to a voltage-stabilizing capacitor element Cin and is accompanied by a parasitic inductance LP1. The drain of the high-side MOSFET 4005 is connected to a switching node Ns via a parasitic inductance LP3, and the switching node Ns is connected to the drain D of the low-side MOSFET 4006. The source S of the low-side MOSFET 4006 is connected to the ground voltage PGND node via a parasitic inductance LP2. The switching node Ns is connected to one end of the coil element 4008 of which the other end is connected to the smoothing capacitor 4009. In FIG. 31, a CPU is depicted as the load 4001.

According to the tenth embodiment, the second gate electrode G2 of the high-side MOSFET 4005 is connected to the ground voltage PGND node (connection of the second gate electrode G2 is not limited to this). The second gate electrode G2 of the low-side MOSFET 4006 is connected to the ground voltage PGND node via the resistance element 3000 located outside the package and connected thereto via the terminal T16 (FIG. 30). According to the tenth embodiment, the parasitic capacitance Ced formed between the second gate electrode G2 of the low-side MOSFET 4006 and the drain D of the low-side MOSFET 4006 and the external resistance element 3000 make up a snubber circuit. This snubber circuit suppresses voltage ringing at the switching node Ns.

FIGS. 32(A) to 32(E) are waveform charts showing an operation of the circuit shown in FIG. 31. The operation of the circuit will hereinafter be described, referring to FIGS. 31 and 32(A) to 32(E).

Figure 32:
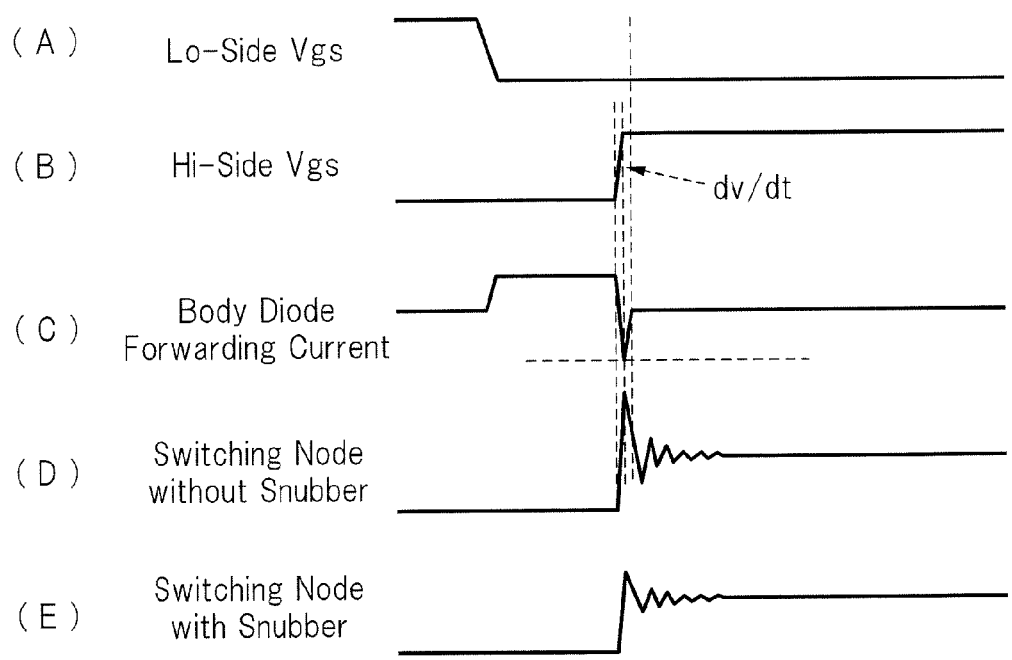

In FIG. 32, the horizontal axis represents time. FIG. 32(A) depicts a change in a voltage between the first gate electrode G1 and the source (Lo-Side Vgs) of the low-side MOSFET 4006, and FIG. 32(B) depicts a change in a voltage between the first gate electrode G1 and the source (Hi-Side Vgs) of the high-side MOSFET 4005. In other words, FIGS. 32(A) and 32(B) depict changes in the voltages of the drive signals GL and GH from the driver 4003. FIG. 32(C) depicts a current flowing through the parasitic diode DD (body diode) of the low-side MOSFET 4006 (Body Diode Forwarding Current). FIG. 32(E) depicts a voltage at the switching node Ns that results when the snubber circuit is created by providing the external resistance element 3000. FIG. 32(D) depicts a voltage at the switching node Ns that results when the snubber circuit is not created.

When the voltage Vgs between the first gate electrode G1 and the source of the low-side MOSFET 4006 drops in a manner as indicated in FIG. 32(A), an action of the coil element 4008 causes a current to flow from the ground voltage PGND node through the diode DD of the low-side MOSFET 4006 (FIG. 32(C)). Then, as indicated by FIG. 32(B), when the voltage Vgs between the first gate electrode G1 and the source of the high-side MOSFET 4005 rises, a sharp voltage build-up rate (dv/dt) leads to a ringing phenomenon of a voltage at the switching node Ns through the parasitic inductance (FIG. 32(D)). However, by connecting the external resistance element 3000 to the terminal T16, the resistance element 3000 is connected to the second gate electrode G2 of the low-side MOSFET 4006, and therefore the parasitic capacitance Ced and the external resistance 3000 are connected in series between the ground voltage PGND node and the switching node Ns, thus working as the snubber circuit that suppresses the ringing phenomenon at the switching node Ns. As a result, as indicated by FIG. 32(E), the ringing phenomenon at the switching node Ns is suppressed to be less intensive than the ringing phenomenon shown in FIG. 32(D). Hence a ringing phenomenon that occurs when the high-side MOSFET 4005 is switched on is suppressed, which enables generation of the output voltage Vout with less noises.

According to the tenth embodiment, by adjusting the resistance value of the external resistance element 3000, an extent of suppression of a ringing phenomenon can be adjusted. It is therefore preferable that the resistance element 3000 be connected to the terminal T16 outside the package, i.e., semiconductor integrated circuit device 4002.

(Eleventh Embodiment)

FIG. 33 is a block diagram showing a configuration of the semiconductor integrated circuit device 4002 according to an eleventh embodiment. The configuration of FIG. 33 is similar to the configuration of the semiconductor integrated circuit device 4002 of FIG. 40. Differences between both configurations, therefore, will mainly be described.

In FIG. 33, inside the semiconductor integrated circuit device 4002, the second gate electrode G2 of the high-side MOSFET 4005 is connected to the ground voltage PGND node. This configuration enables a reduction in noises that are generated when the high-side MOSFET 4005 is switched on, which will be described referring to FIGS. 34 and 35.

FIG. 34 is a circuit diagram drawn by paying attention to the high-side MOSFET 4005 and low-side MOSFET 4006 of the semiconductor integrated circuit device 4002 of FIG. 33. Because FIG. 34 is drawn by paying attention to the high-side MOSFET 4005 and low-side MOSFET 4006, the configuration of the driver 4003 is omitted from FIG. 33. The circuit shown in FIG. 34 is similar to the circuit shown in FIG. 31. FIG. 34 is different from FIG. 31 in that the second gate electrode G2 of the low-side MOSFET 4006 is connected to the ground voltage PGND node with no resistance element 3000 interposed between the second gate electrode G2 and the ground voltage PGND node and that the second gate electrode G2 of the high-side MOSFET 4005 is connected to the ground voltage PGND node inside the package. The features of the circuit of FIG. 34 other than these two features are described in the tenth embodiment and are therefore omitted in further description. According to the eleventh embodiment, the second gate electrode G2 of the low-side MOSFET 4006 is also connected to the ground voltage PGND node inside the package (connection of the second gate electrode G2 of the low-side MOSFET 4006 is not limited to this).

Figure 35:
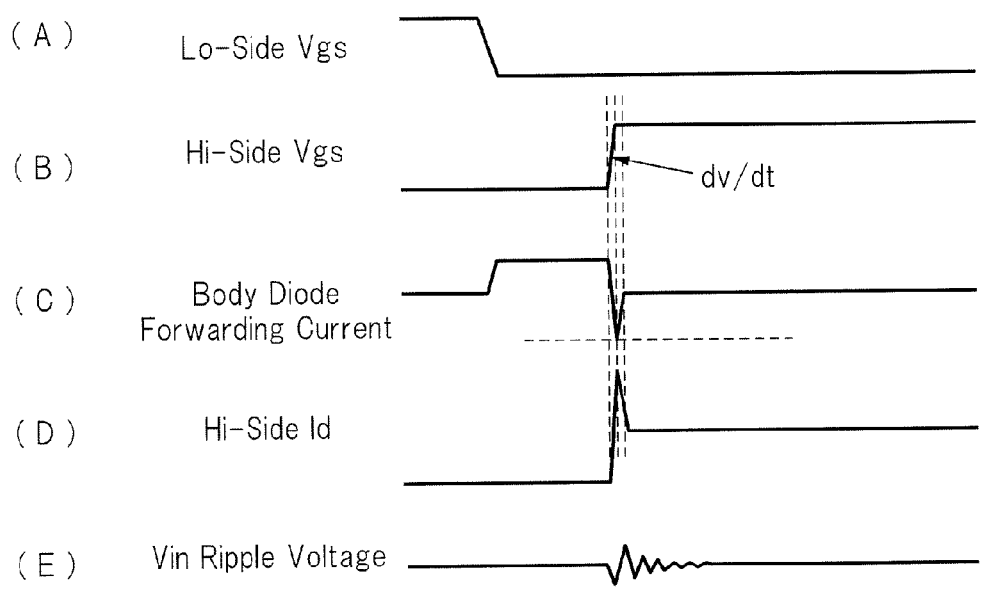

FIGS. 35(A) to 35(E) are waveform charts showing an operation of the circuit of FIG. 34. In FIG. 35, the horizontal axis represents time. FIGS. 35(A) to 35(C) correspond to the FIGS. 32(A) to 32(C), respectively. FIG. 35(D) depicts the waveform of a current (Hi-Side Id) flowing through the source-drain path of the high-side MOSFET 4005. FIG. 35(E) depicts the waveform of a voltage (Vin Ripple Voltage) at the line L1 through which the input voltage VIN is supplied to the drain D of the high-side MOSFET 4005. As described referring to FIG. 31, the parasitic inductance LP1 is connected to the line L1 and the voltage stabilizing capacitor Cin is also connected to the line L1.

According to the eleventh embodiment, inside the semiconductor integrated circuit device 4002, the second gate electrode G2 of the high-side MOSFET 4005 is connected to the ground voltage PGND node. As a result, the parasitic capacitance Ced formed between the second gate electrode G2 and the drain is connected between the line L1 transmitting the input voltage VIN and the ground voltage node. This parasitic capacitance Ced is connected in parallel to the voltage-stabilizing capacitance element Cin via the parasitic inductance LP1.

As shown in FIG. 35(B), as a voltage between the first gate electrode G1 and the source of the high-side MOSFET 4005 rises and the high-side MOSFET 4005 shifts from its off-state to on-state, an inrush current flows because of a potential difference between the input voltage VIN and the ground voltage PGND node. This inrush current appears as a peak of the drain current Id of the high-side MOSFET 4005 (FIG. 35(D)). In response to this sharp change in the drain current Id, the parasitic impedance LP1 works to oscillate a voltage at the line L1 (FIG. 35(E)). Although the voltage stabilizing capacitance Cin functions to stabilize the voltage at the line L1, a voltage ripple still arises near the drain D of the high-side MOSFET 4005 on the line L1. According to the eleventh embodiment, the drain D of the high-side MOSFET 4005 is connected to the ground voltage PGND node in the semiconductor integrated circuit device 4002 through the parasitic capacitance Ced that provide AD connection. This parasitic capacitance Ced absorbs a voltage oscillation (ripple) that arises near the drain of the high-side MOSFET 4005 when the high-side MOSFET 4005 is switched on, thus suppressing noise generation.

The relation between the semiconductor integrated circuit device 4002, the package, and the power supply system 4000 will be described. FIG. 36(A) is a block diagram showing the relation between the semiconductor integrated circuit device 4002, the package, and the power supply system 4000. The power supply system 4000 includes the control semiconductor integrated circuit device 4007, the semiconductor integrated circuit device 4002, the coil element 4008, and the smoothing capacitor element 4009. According to this embodiment, the semiconductor integrated circuit device 4002 has three semiconductor chips, which are sealed in one package. In this specification of the present invention, therefore, the semiconductor integrated circuit device 4002 is equivalent to a package (denoted as 4002P in FIG. 11) having semiconductor chips (three semiconductor chips in this embodiment) incorporated therein.

According to this embodiment, three semiconductor chips are a semiconductor chip 4005C having the high-side MOSFET 4005, a semiconductor chip 4006C having the low-side MOSFET 4006, and a semiconductor chip 4003C having the driver 4003. In FIG. 36(A), to prevent the complication of the drawing, the drive circuits 4011 and 4012 are shown as functional components making up the driver 4003. A specific example of the driver 4003 is shown in FIG. 40. In FIG. 36(A), to clearly indicate the function of the drive circuits 4011 and 4012 of complementally switching on and off the high-side MOSFET 4005 and the low-side MOSFET 4006, the drive circuit 4011 is depicted as a buffer while the drive circuit 4012 is depicted as an inverter. The voltage VCIN supplied to the driver semiconductor chip 4003C and the ground voltage CGND are omitted from FIG. 36(A).

A configuration of the package 4002P having the semiconductor chips incorporated therein will then be described. FIG. 36(B) is a plan view of the configuration of the package 4002P. In FIG. 36(B), P denotes each of multiple external terminals of a lead frame and a region 3600 indicated by an encircling broken line is a region sealed with a resin, etc. Out of the multiple external terminals P, given external terminals P serves as the terminals T1 to T6 of the semiconductor integrated circuit device 4002 described referring to FIG. 40. In FIG. 36(B), the external terminals P corresponding to the terminals T1, T2, and T6 are expressed as VSWH (T1), PGND (T2), and VIN (T6), respectively.

In FIG. 36(B), 3603 denotes a tab carrying the semiconductor chip 4005C having the high-side MOSFET 4005, 3604 denotes a tab carrying the semiconductor chip 4006C having the low-side MOSFET 4006, and 3605 denotes a tab carrying the semiconductor chip 4003C having the driver 4003. Respective terminals (pads) of the semiconductor chips 4003C, 4005C, and 4006C are connected electrically to given external terminals P or semiconductor chips through lead wires or copper sheets. FIG. 36(B), for example, depicts a pad S of the source S of the high-side MOSFET 4005, a pad G of the first gate electrode G1 of the high-side MOSFET 4005, a pad U of the second gate electrode G2 of the high-side MOSFET 4005, a pad S of the source S of the low-side MOSFET 4006, and a pad G of the first gate electrode G1 of the low-side MOSFET 4006.

A relatively high current flows through respective source-drain paths of the high-side MOSFET 4005 and low-side MOSFET 4006 (current flow through the source-drain paths is not limited to this). For this reason, the source S of the high-side MOSFET 4005 and the source S of the low-side MOSFET 4006 are connected to given parts through copper sheets 3601 and 3602, respectively. For example, the source S of the low-side MOSFET 4006 is connected to the multiple external terminals P (T2) supplied with the ground voltage PGND, through the copper sheet 3602. In this embodiment, the low-side MOSFET is constructed to be larger than the high-side MOSFET 4005 so that a high current can flow through the path between the ground voltage PGND node and the output terminal T1.

According to the eleventh embodiment, inside the semiconductor integrated circuit device 4002, the second gate electrode G2 of the high-side MOSFET 4005 is connected to the ground voltage PGN node. In FIG. 36(B), the second gate electrode G2 of the high-side MOSFET 4005 corresponds to the pad U. As shown in FIG. 36(B), therefore, in the package region indicated by the broken line 3600, the pad U of the high-side MOSFET 4005 is connected to an external terminal P supplied with the ground voltage PGND, through a lead wire 3606.

In the tenth embodiment, a pad to which the second gate electrode G2 of the low-side MOSFET 4006 is connected is connected to a given external terminal P, and outside the package region indicated by the broken line 3600, the resistance element 3000 is connected to the external terminal P.

The present invention is not limited to the above embodiments but may include various modification examples. The above first to eleventh embodiments are described in detail for facilitating understanding of the present invention and each embodiment does not necessarily include all the constituent elements described above. Part of the configuration of one embodiment may be replaced with the configuration of another embodiment. The configuration of another embodiment may be added to the configuration of one embodiment. Part of the configuration of each embodiment may be deleted or replaced with the configuration of another embodiment or the configuration of another embodiment may be added to part of the configuration of each embodiment.

For example, the configuration of the eleventh embodiment may be added to the configuration of the tenth embodiment. The first to fourth embodiments and the second modification example of the ninth embodiment relate to the low-side MOSFET. The configuration of the eleventh embodiment, therefore, may be added to the configurations of the first to fourth embodiments and the second modification example of the ninth embodiment. The fifth to eighth embodiments and the first modification example of the ninth embodiment relate to the high-side MOSFET. The configuration of the tenth embodiment, therefore, may be added to the configurations of the fifth to eighth embodiments and the first modification example of the ninth embodiment.

In the first, second, and tenth embodiments, the high-side MOSFET may be provided as a single-gate electrode MOSFET. In the fourth to sixth and eleventh embodiments, the low-side MOSFET may be provided as a single-gate electrode MOSFET.

The above embodiments are described as cases where the high-side MOSFET and low-side MOSFET are provided as n-channel type MOSFETs. It is obvious, however, that both MOSFET may be provided as p-channel type MOSFETs.

The specification of the present invention discloses multiple inventions, some of which are described as claims. The specification, however, also discloses other inventions, out of which typical inventions are described below.

(A) A semiconductor integrated circuit device that has a first voltage terminal, a second voltage terminal supplied with a voltage lower than a voltage supplied to the first voltage terminal, and an output terminal and that cyclically changes the direction of a current supplied to a coil element connected to the output terminal, the semiconductor integrated circuit device including:

a first MOSFET having a first input electrode, a drain, and a source, the first MOSFET being connected between the first voltage terminal and the output terminal and electrically connecting the first voltage terminal to the output terminal according to a first input signal supplied to the first input electrode;

a second MOSFET having a first input electrode, a drain, a source, and a second input electrode located closer to the drain than the first input electrode, the second MOSFET being connected between the second voltage terminal and the output terminal and electrically connecting the second voltage terminal to the output terminal according to a second input signal supplied to the first input electrode;

a drive circuit connected to respective first input electrodes of the first MOSFET and the second MOSFET, the drive circuit generating the first input signal and the second input signal so that the first MOSFET and the second MOSFET are switched on and off complementally; and an external terminal to which a second input electrode of the second MOSFET is connected, in which the first MOSFET, the second MOSFET, and the drive circuit are sealed in one package, the external terminal is attached to the package, and a resistance element is connected between the external terminal and a given voltage node.

(B) The semiconductor circuit device according to the item (A), in which the second MOSFET has a first conductive first semiconductor region, a second conductive second semiconductor region overlaid on the first semiconductor region, and a first conductive third semiconductor region overlaid on the second semiconductor region; and a drain of the second MOSFET is composed of the first semiconductor region, a source of the second MOSFET is composed of the third semiconductor region, a first input electrode of the second MOSFET is composed of a first metal layer embedded in the second semiconductor region across an insulating layer, and a second input electrode of the second MOSFET is composed of a second metal layer embedded in the first semiconductor region across an insulating layer.

(C) A semiconductor integrated circuit device that has a first voltage terminal, a second voltage terminal supplied with a voltage lower than a voltage supplied to the first voltage terminal, and an output terminal and that cyclically changes the direction of a current supplied to a coil element connected to the output terminal, the semiconductor integrated circuit device including:

a first MOSFET having a first input electrode, a drain, a source, and a second input electrode located closer to the drain than the first input electrode, the first MOSFET being connected between the first voltage terminal and the output terminal and electrically connecting the first voltage terminal to the output terminal according to a first input signal supplied to the first input electrode;

a second MOSFET having a first input electrode, a drain, and a source, the second MOSFET being connected between the second voltage terminal and the output terminal and electrically connecting the second voltage terminal to the output terminal according to a second input signal supplied to the second input electrode; and a drive circuit connected to respective first input electrodes of the first MOSFET and the second MOSFET, the drive circuit generating the first input signal and the second input signal so that the first MOSFET and the second MOSFET are switched on and off complementally, in which the first MOSFET, the second MOSFET, and the drive circuit are sealed in one package, and the second input electrode of the first MOSFET is connected to the second voltage terminal in the package.

(D) The semiconductor integrated circuit device according to the item (C), in which the first MOSFET has a first conductive first semiconductor region, a second conductive second semiconductor region overlaid on the first semiconductor region, and a first conductive third semiconductor region overlaid on the second semiconductor region, and wherein a drain of the first MOSFET is composed of the first semiconductor region, a source of the first MOSFET is composed of the third semiconductor region, a first input electrode of the first MOSFET is composed of a first metal layer embedded in the second semiconductor region across an insulating layer, and a second input electrode of the second MOSFET is composed of a second metal layer embedded in the first semiconductor region across an insulating layer.

(E) A semiconductor integrated circuit device including:

a first voltage terminal supplied with a first voltage;

a second voltage terminal supplied with a second voltage different in voltage value from the first voltage;

an output terminal;

a first MOSFET having a first input electrode, a drain, and a source, the first MOSFET being connected between the first voltage terminal and the output terminal and electrically connecting the first voltage terminal to the output terminal according to a first input signal supplied to the first input electrode;

a second MOSFET having a first input electrode, a drain, a source, and a second input electrode located closer to the drain than the first input electrode, the second MOSFET being connected between the second voltage terminal and the output terminal and electrically connecting the second voltage terminal to the output terminal according to a second input signal supplied to the first input electrode;

a drive circuit connected to respective first input electrodes of the first MOSFET and the second MOSFET, the drive circuit generating the first input signal and the second input signal so that the first MOSFET and the second MOSFET are switched on and off complementally;

a first voltage generating circuit connected to the second input electrode of the second MOSFET, the first voltage generating circuit supplying a negative voltage negative in polarity relative to a voltage at the source of the second MOSFET, to the second input electrode;

a detecting circuit that detects a current flowing through the output terminal; and a control circuit that supplies a control signal following a detection signal from the detecting circuit, to the second input electrode of the second MOSFET.

(F) A semiconductor integrated circuit device including:

a first voltage terminal supplied with a first voltage;

a second voltage terminal supplied with a second voltage different in voltage value from the first voltage;

an output terminal;

a first MOSFET having a first input electrode, a drain, and a source, the first MOSFET being connected between the first voltage terminal and the output terminal and electrically connecting the first voltage terminal to the output terminal according to a first input signal supplied to the first input electrode;

a second MOSFET having a first input electrode, a drain, a source, and a second input electrode located closer to the drain than the first input electrode, the second MOSFET being connected between the second voltage terminal and the output terminal and electrically connecting the second voltage terminal to the output terminal according to a second input signal supplied to the first input electrode;

a drive circuit connected to respective first input electrodes of the first MOSFET and the second MOSFET, the drive circuit generating the first input signal and the second input signal so that the first MOSFET and the second MOSFET are switched on and off complementally; and a control circuit that changes a voltage supplied to the second gate electrode of the second MOSFET, in synchronization with switching on/off of the second MOSFET.

EXPLANATION OF REFERENCE NUMERALS 1000, 1600, 2701, 2801, 2901 Second gate electrode control circuit 4000 Power supply system
4002 Semiconductor integrated circuit device
4003 Driver
4004 Control circuit
4005 High-side MOSFET
4006 Low-side MOSFET
4007 Control semiconductor integrated circuit device
G1 First gate electrode
G2 Second gate electrode
GL, GH Drive signal
UH, UL Second gate control signal

What is claimed is:

1. A semiconductor integrated circuit device comprising:
a first voltage terminal supplied with a first voltage;
a second voltage terminal supplied with a second voltage different in voltage value from the first voltage;
an output terminal;
a first MOSFET having a first input electrode, a drain, and a source, the first MOSFET being connected between the first voltage terminal and the output terminal and electrically connecting the first voltage terminal to the output terminal according to a first input signal supplied to the first input electrode;
a second MOSFET having a first input electrode, a drain, a source, and a second input electrode located closer to the drain than the first input electrode, the second MOSFET being connected between the second voltage terminal and the output terminal and electrically connecting the second voltage terminal to the output terminal according to a second input signal supplied to the first input electrode;
a drive circuit connected to respective first input electrodes of the first MOSFET and the second MOSFET, the drive circuit generating the first input signal and the second input signal so that the first MOSFET and the second MOSFET are switched on and off complementally; and
a first voltage generating circuit connected to the second input electrode of the second MOSFET, the first voltage generating circuit supplying a negative voltage negative in polarity relative to a voltage at the source of the second MOSFET, to the second input electrode.

2. The semiconductor integrated circuit device according to claim 1,
wherein the second MOSFET has a first conductive first semiconductor region, a second conductive second semiconductor region overlaid on the first semiconductor region, and a first conductive third semiconductor region overlaid on the second semiconductor region, and
wherein a drain of the second MOSFET is composed of the first semiconductor region, a source of the second MOSFET is composed of the third semiconductor region, a first input electrode of the second MOSFET is composed of a first metal layer embedded in the second semiconductor region across an insulating layer, and a second input electrode of the second MOSFET is composed of a second metal layer embedded in the first semiconductor region across an insulating layer.

3. The semiconductor integrated circuit device according to claim 2,
wherein the first voltage is higher than the second voltage, and
wherein a voltage at a source of the second MOSFET matches the second voltage.

4. The semiconductor integrated circuit device according to claim 2,
wherein the second voltage is higher than the first voltage, and
wherein a voltage at a source of the second MOSFET matches a voltage at the output terminal.

5. The semiconductor integrated circuit device according to claim 2, comprising:
a second voltage generating circuit that generates a positive voltage positive in polarity relative to a voltage at a source of the second MOSFET; and
a selecting circuit that selects a negative voltage generated by the first voltage generating circuit or a positive voltage generated by the second voltage generating circuit and that supplies a selected positive or negative voltage to a second input electrode of the second MOSFET.

6. The semiconductor integrated circuit device according to claim 5,
wherein the selecting circuit selects a voltage supplied to a second input electrode of the second MOSFET, in synchronization with switching on/off of the second MOSFET by the drive circuit.

7. The semiconductor integrated circuit device according to claim 5, comprising a detecting circuit that detects a current flowing through the output terminal to determine whether a value of the current exceeds a given current value,
wherein the selecting circuit selects a voltage supplied to a second input electrode of the second MOSFET, in response to a detection signal from the detecting circuit.

8. The semiconductor integrated circuit device according to claim 7,
wherein, when a value of a current flowing through the output terminal is lower than the given current value, the selecting circuit supplies the negative voltage to a second input electrode of the second MOSFET.

9. A semiconductor integrated circuit device comprising:
a first voltage terminal supplied with a first voltage;
a second voltage terminal supplied with a second voltage different in voltage value from the first voltage;
an output terminal;
a first MOSFET having a first input electrode, a drain, a source, and a second input electrode located closer to the drain than the first input electrode, the first MOSFET being connected between the first voltage terminal and the output terminal and electrically connecting the first voltage terminal to the output terminal according to a first input signal supplied to the first input electrode;
a second MOSFET having a first input electrode, a drain, a source, and a second input electrode located closer to the drain than the first input electrode, the second MOSFET being connected between the second voltage terminal and the output terminal and electrically connecting the second voltage terminal to the output terminal according to a second input signal supplied to the first input electrode;
a drive circuit connected to respective first input electrodes of the first MOSFET and the second MOSFET, the drive circuit generating the first input signal and the second input signal so that the first MOSFET and the second MOSFET are switched on and off complementally;
a detecting circuit that detects a current flowing through the output terminal to determine whether a value of the current exceeds a given current value; and
a control circuit connected to the detecting circuit, to the second input electrode of the first MOSFET, and to the second input electrode of the second MOSFET, the control circuit supplying a voltage to respective second input electrodes of the first MOSFET and the second MOSFET, the voltage taking different values according to whether a current flowing through the output terminal exceeds the given current value or not.

10. The semiconductor integrated circuit device according to claim 9,
wherein the control circuit supplies a positive voltage positive in voltage value relative to voltages at respective sources of the first MOSFET and the second MOSFET, to respective second input electrodes of the first MOSFET and the second MOSFET when a value of a current flowing through the output terminal exceeds the given current value, while supplies a negative voltage negative in voltage value relative to voltages at respective sources of the first MOSFET and the second MOSFET, to respective second input electrodes of the first MOSFET and the second MOSFET when the value of the current flowing through the output terminal does not exceed the given current value.

11. The semiconductor integrated circuit device according to claim 10,
wherein each of the first MOSFET and the second MOSFET has a first conductive first semiconductor region, a second conductive second semiconductor region overlaid on the first semiconductor region, and a first conductive third semiconductor region overlaid on the second semiconductor region,
wherein a drain of the first MOSFET is composed of the first semiconductor region, a source of the first MOSFET is composed of the third semiconductor region, a first input electrode of the first MOSFET is composed of a first metal layer embedded in the second semiconductor region across an insulating layer, and a second input electrode of the second MOSFET is composed of a second metal layer embedded in the first semiconductor region across an insulating layer, and
wherein a drain of the second MOSFET is composed of the first semiconductor region, a source of the second MOSFET is composed of the third semiconductor region, a first input electrode of the second MOSFET is composed of a third metal layer embedded in the second semiconductor region across an insulating layer, and a second input electrode of the second MOSFET is composed of a fourth metal layer embedded in the first semiconductor region across an insulating layer.

12. The semiconductor integrated circuit device according to claim 11,
wherein the drive circuit, the voltage generating circuit, and the control circuit are formed in one first semiconductor chip, the first MOSFET is formed in a second semiconductor chip different from the first semiconductor chip, and the second MOSFET is formed in a third semiconductor chip different from the first and second semiconductor chips, and
wherein the first, second, and third semiconductor chips are sealed in one package.

13. A power supply system comprising:
a semiconductor integrated circuit device having a first voltage terminal, a second voltage terminal, and an output terminal; and
a coil element whose one end is connected to the output terminal, the coil element being supplied with a current whose direction of flow changes cyclically,
wherein the semiconductor integrated circuit device includes:
a first MOSFET having a first input electrode, a drain, and a source, the first MOSFET being connected between the first voltage terminal and the output terminal and switched on and off according to an input signal supplied to the first input electrode;
a second MOSFET having a first input electrode, a drain, a source, and a second input electrode located closer to the drain than the first input electrode, the second MOSFET being connected between the second voltage terminal and the output terminal and switched on and off complementally when the first MOSFET is witched off and on; and
a first voltage generating circuit connected to the second input electrode of the second MOSFET, the first voltage generating circuit supplying a negative voltage negative in polarity relative to a voltage at the source of the second MOSFET, to the second input electrode.

14. The power supply system according to claim 13,
wherein the second MOSFET has a first conductive first semiconductor region, a second conductive second semiconductor region overlaid on the first semiconductor region, and a first conductive third semiconductor region overlaid on the second semiconductor region, and
wherein a drain of the second MOSFET is composed of the first semiconductor region, a source of the second MOSFET is composed of the third semiconductor region, a first input electrode of the second MOSFET is composed of a first metal layer embedded in the second semiconductor region across an insulating layer, and a second input electrode of the second MOSFET is composed of a second metal layer embedded in the first semiconductor region across an insulating layer.

15. The power supply system according to claim 14,
wherein the semiconductor integrated circuit device includes:
a second voltage generating circuit that generates a positive voltage positive in polarity relative to a voltage at a source of the second MOSFET;
a selecting circuit that selects a negative voltage generated by the first voltage generating circuit or a positive voltage generated by the second voltage generating circuit and that supplies a selected positive or negative voltage to a second input electrode of the second MOSFET; and
a detecting circuit that detects a current flowing through the output terminal to determine whether a value of the current exceeds a given current value, and
wherein the selecting circuit selects a voltage supplied to the second input electrode of the second MOSFET, in response to a detection signal from the detecting circuit.

16. The power supply system according to claim 15,
wherein the selecting circuit supplies the positive voltage to a second gate electrode of the second MOSFET when a value of the current flowing through the output terminal exceeds a given current value, while supplies the negative voltage to the second gate electrode of the second MOSFET when the value of the current flowing through the output terminal does not exceed the given current value.

17. A power supply system comprising:
a semiconductor integrated circuit device having a first voltage terminal, a second voltage terminal, and an output terminal; and
a coil element whose one end is connected to the output terminal, the coil element being supplied with a current whose direction of flow changes cyclically,
wherein the semiconductor integrated circuit device includes:
a first MOSFET having a first input electrode, a drain, a source, and a second input electrode located closer to the drain than the first input electrode, the first MOSFET being connected between the first voltage terminal and the output terminal and switched on and off according to an input signal supplied to the first input electrode;

a second MOSFET having a first input electrode, a drain, a source, and a second input electrode located closer to the drain than the first input electrode, the second MOSFET being connected between the second voltage terminal and the output terminal and switched on and off according to an input signal supplied to the first input electrode;

a detecting circuit that detects a current flowing through the output terminal to determine whether a value of the current exceeds a given current value; and a control circuit connected to the detecting circuit, to the second input electrode of the first MOSFET, and to the second input electrode of the second MOSFET, the control circuit supplying a voltage to respective second input electrodes of the first MOSFET and the second MOSFET, the voltage taking different values according to whether a current flowing through the output terminal exceeds the given current value or not.

18. The power supply system according to claim 17, wherein the control circuit supplies a positive voltage positive in voltage value relative to voltages at respective sources of the first MOSFET and the second MOSFET, to respective second input electrodes of the first MOSFET and the second MOSFET when a value of a current flowing through the output terminal exceeds the given current value, while supplies a negative voltage negative in voltage value relative to voltages at respective sources of the first MOSFET and the second MOSFET, to respective second input electrodes of the first MOSFET and the second MOSFET when the value of the current flowing through the output terminal does not exceed the given current value.

19. The power supply system according to claim 18, wherein each of the first MOSFET and the second MOSFET has a first conductive first semiconductor region, a second conductive second semiconductor region overlaid on the first semiconductor region, and a first conductive third semiconductor region overlaid on the second semiconductor region, wherein a drain of the first MOSFET is composed of the first semiconductor region, a source of the first MOSFET is composed of the third semiconductor region, a first input electrode of the first MOSFET is composed of a first metal layer embedded in the second semiconductor region across an insulating layer, and a second input electrode of the second MOSFET is composed of a second metal layer embedded in the first semiconductor region across an insulating layer, and wherein a drain of the second MOSFET is composed of the first semiconductor region, a source of the second MOSFET is composed of the third semiconductor region, a first input electrode of the second MOSFET is composed of a third metal layer embedded in the second semiconductor region across an insulating layer, and a second input electrode of the second MOSFET is composed of a fourth metal layer embedded in the first semiconductor region across an insulating layer.

20. The power supply system according to claim 19, wherein the drive circuit, the voltage generating circuit, and the control circuit are formed in one first semiconductor chip, the first MOSFET is formed in a second semiconductor chip different from the first semiconductor chip, and the second MOSFET is formed in a third semiconductor chip different from the first and second semiconductor chips, and wherein the first, second, and third semiconductor chips are sealed in one package.

\* \* \* \* \*